United States Patent
Kamata et al.

(10) Patent No.: US 12,046,300 B2
(45) Date of Patent: Jul. 23, 2024

(54) MEMORY SYSTEM

(71) Applicant: KIOXIA CORPORATION, Tokyo (JP)

(72) Inventors: Tomoya Kamata, Kawasaki (JP); Yoshihisa Kojima, Kawasaki (JP); Suguru Nishikawa, Tokyo (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 18/459,501

(22) Filed: Sep. 1, 2023

(65) Prior Publication Data

US 2023/0420060 A1    Dec. 28, 2023

Related U.S. Application Data

(63) Continuation of application No. 17/471,569, filed on Sep. 10, 2021, now Pat. No. 11,790,997.

(30) Foreign Application Priority Data

Dec. 11, 2020    (JP) ................................. 2020-205991

(51) Int. Cl.
*G11C 16/08* (2006.01)
*G11C 7/22* (2006.01)
*G11C 16/32* (2006.01)

(52) U.S. Cl.
CPC ............... *G11C 16/32* (2013.01); *G11C 7/22* (2013.01)

(58) Field of Classification Search
USPC ...................................................... 365/185.17
See application file for complete search history.

(56) References Cited

U.S. PATENT DOCUMENTS

| | | |
|---|---|---|
| 10,490,290 B2 | 11/2019 | Kondo |
| 2017/0315736 A1 | 11/2017 | Nanduri et al. |
| 2017/0351636 A1 | 12/2017 | Chen et al. |
| 2017/0365335 A1* | 12/2017 | Wang ..................... G11C 16/08 |
| 2019/0243577 A1 | 8/2019 | Pelster et al. |
| 2019/0354498 A1 | 11/2019 | Ebsen et al. |
| 2020/0176617 A1 | 6/2020 | Frans et al. |
| 2020/0303012 A1 | 9/2020 | Nishikawa et al. |

FOREIGN PATENT DOCUMENTS

| | | |
|---|---|---|
| JP | 2019-53795 A | 4/2019 |
| JP | 2020-155182 A | 9/2020 |

* cited by examiner

*Primary Examiner* — Jason Lappas
(74) *Attorney, Agent, or Firm* — Oblon, McClelland, Maier & Neustadt, L.L.P.

(57) ABSTRACT

According to one embodiment, a memory system includes a nonvolatile memory and a memory controller configured to cause the nonvolatile memory to execute a first process of reading data based on a first request from a host device. The memory controller is configured to, when the first request is received from the host device while causing the nonvolatile memory to execute a second process, hold interruption of the second process until a first number becomes a first threshold value or more. The first number is a number of the first requests to be performed in the memory controller. The first threshold value is an integer of 2 or more.

20 Claims, 38 Drawing Sheets

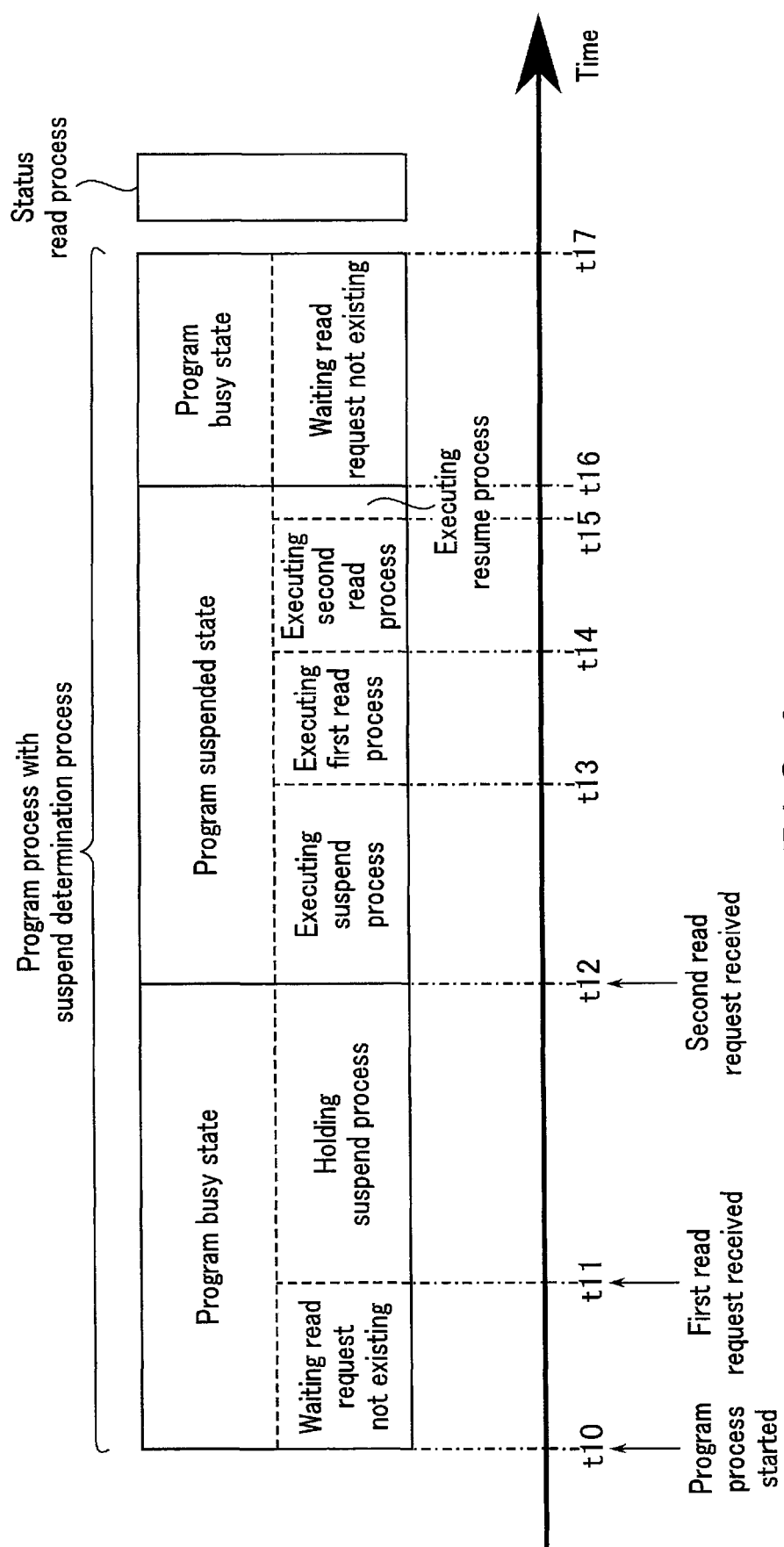
F I G. 6

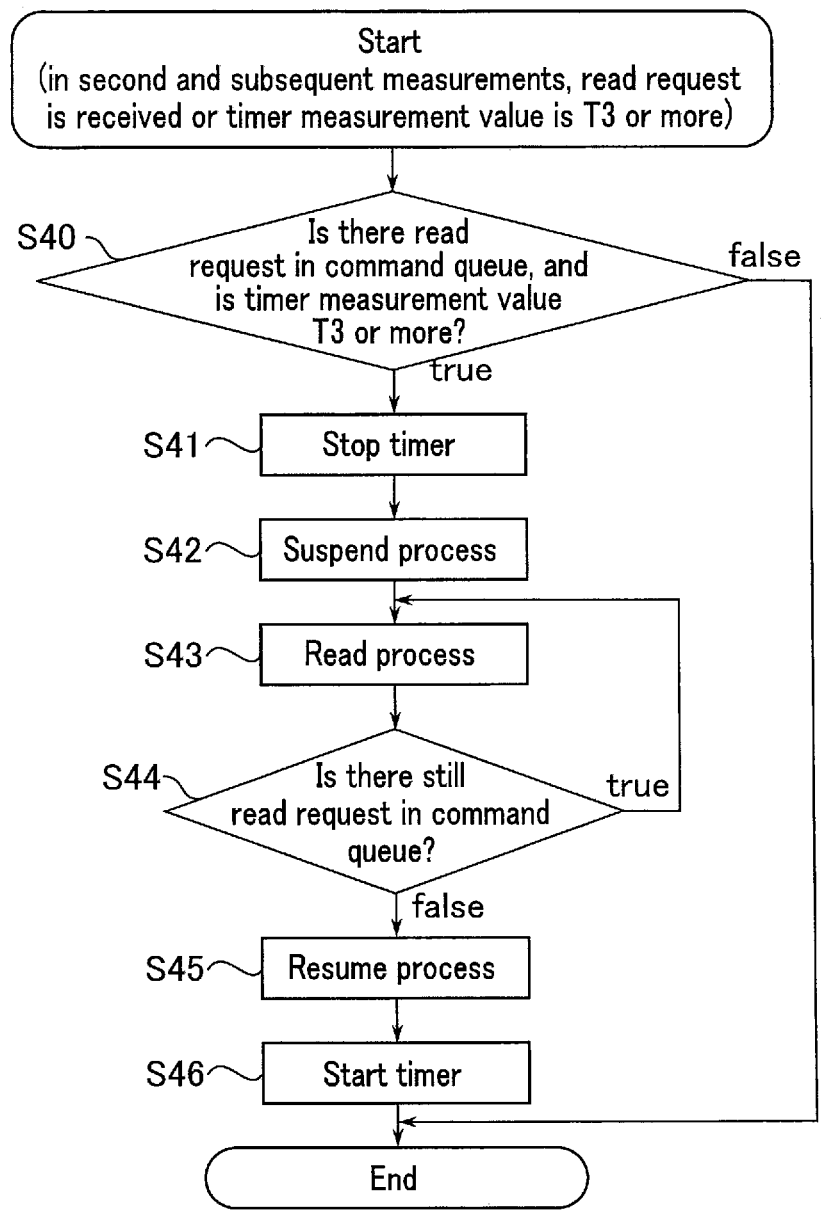
F I G. 14

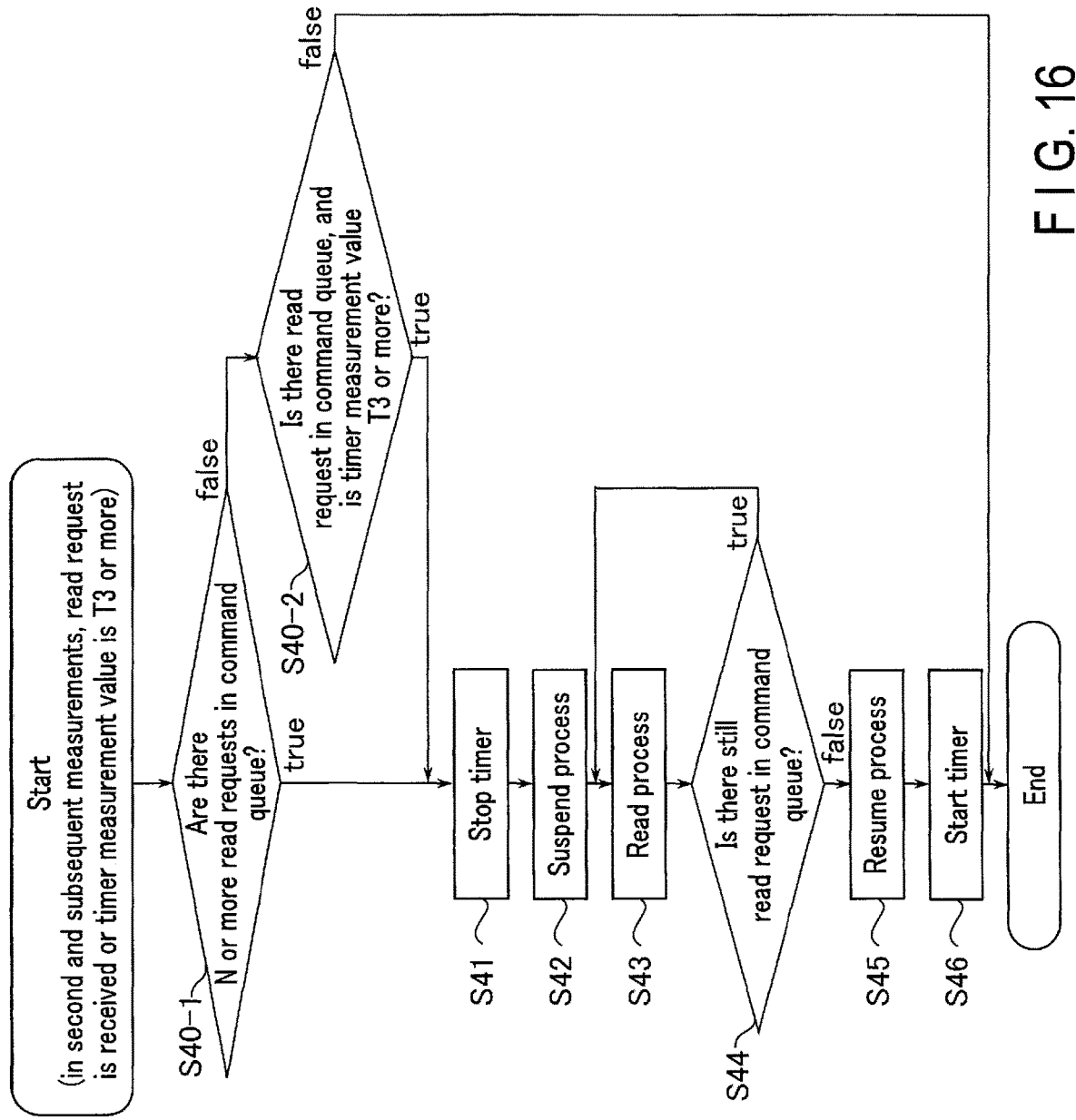
F I G. 16

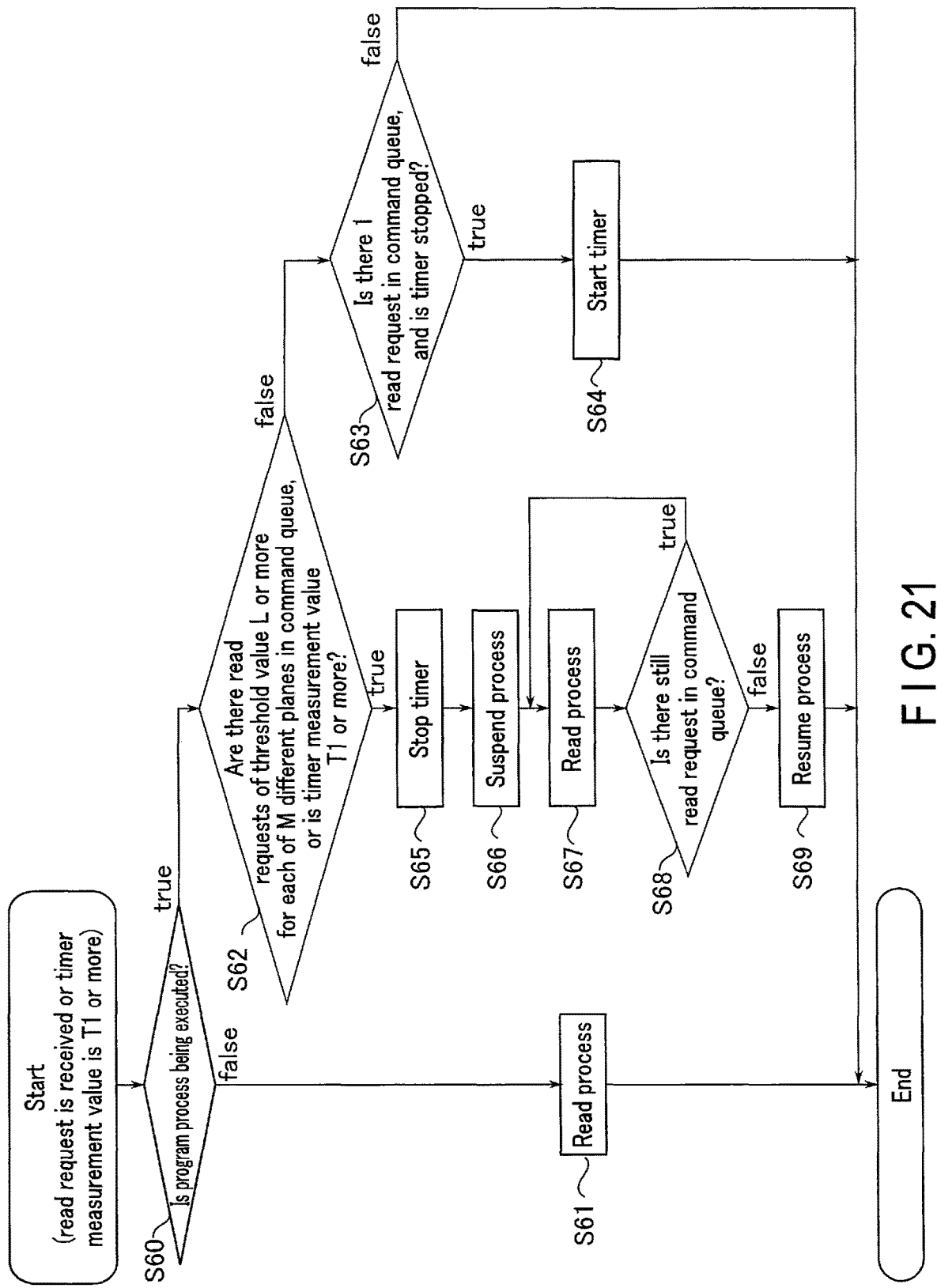
F I G. 21

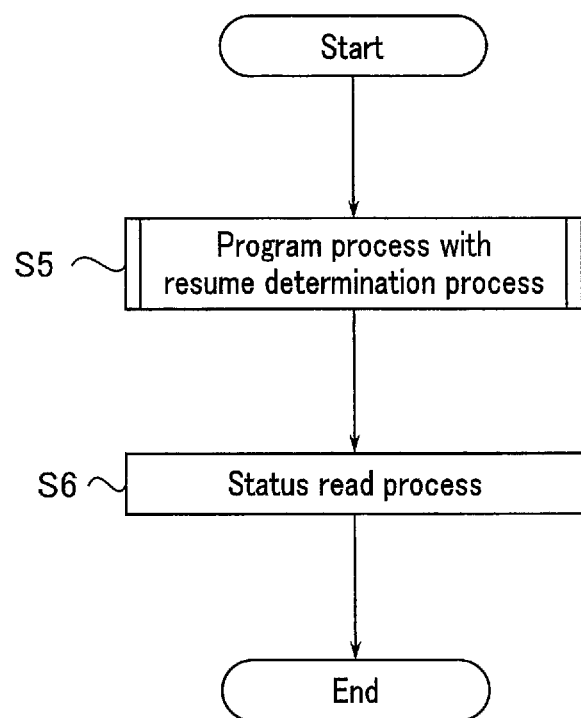
F I G. 25

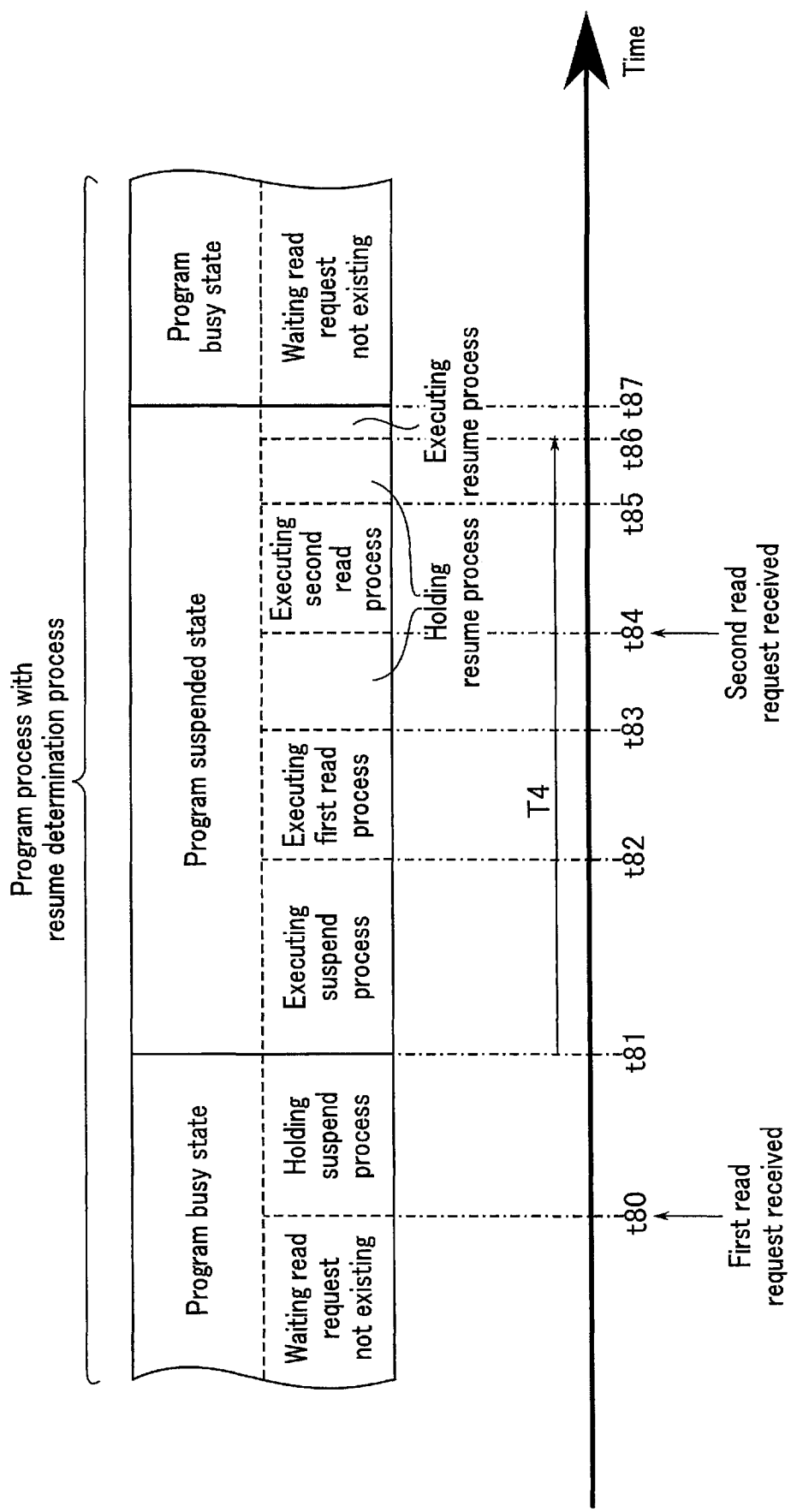
F I G. 28

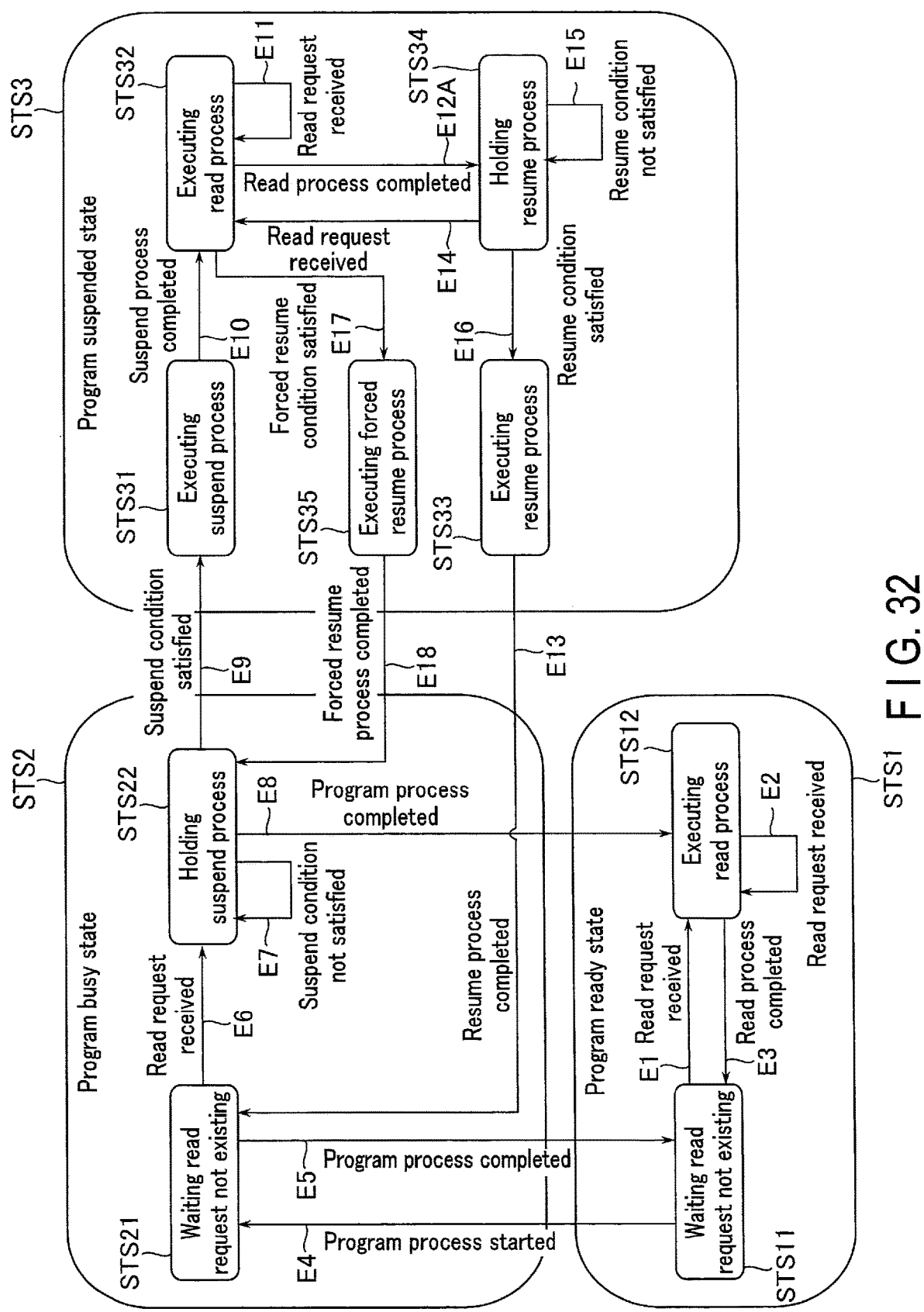
F I G. 32

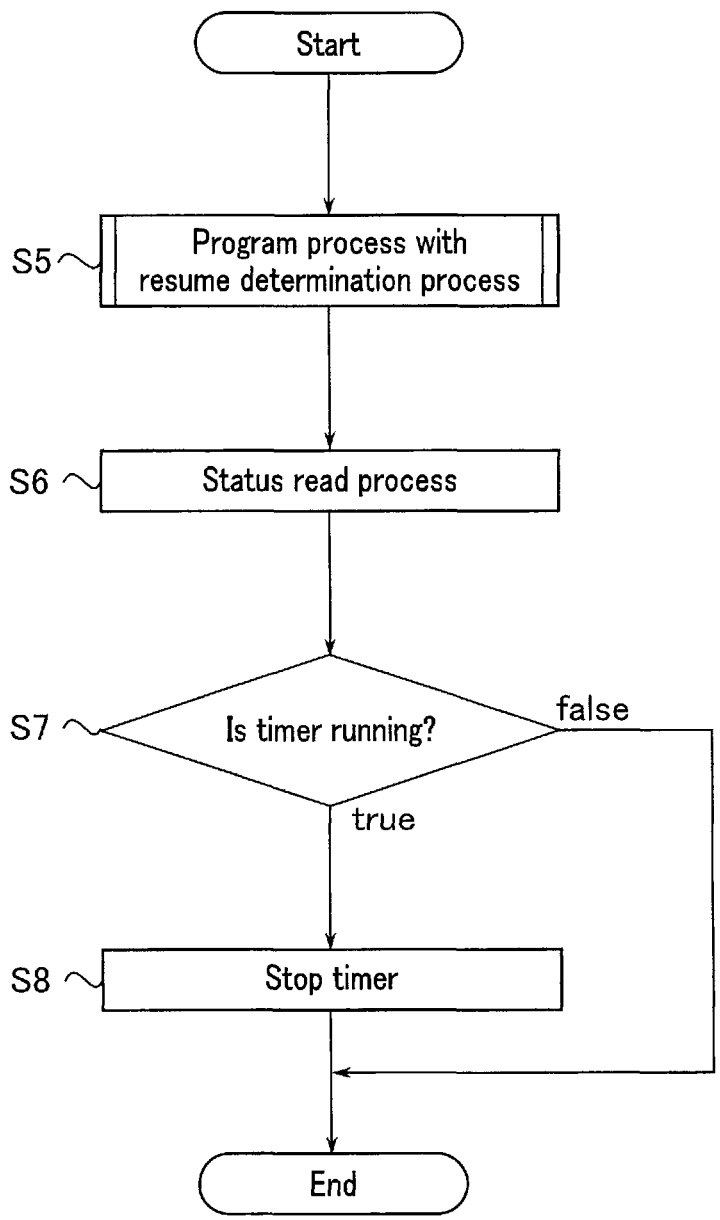
F I G. 34

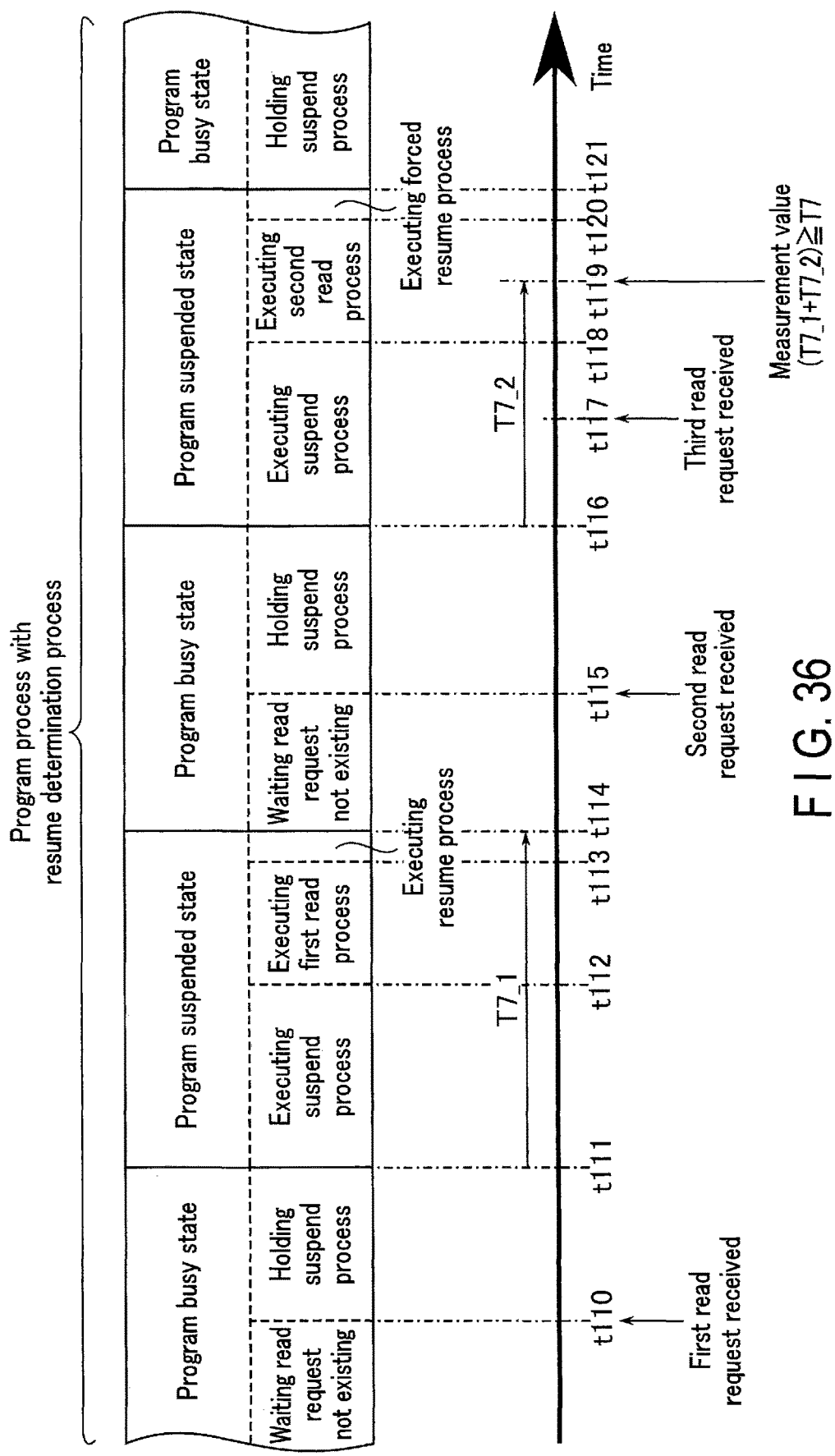
F I G. 36

MEMORY SYSTEM

CROSS-REFERENCE TO RELATED APPLICATIONS

This application is a continuation of and claims benefit under 35 U.S.C. § 120 to U.S. application Ser. No. 17/471,569 filed Sep. 10, 2021, and is based upon and claims the benefit of priority under 35 U.S.C. § 119 from Japanese Patent Application No. 2020-205991, filed Dec. 11, 2020, the entire contents of each of which are incorporated herein by reference.

FIELD

Embodiments described herein relate generally to a memory system.

BACKGROUND

A memory system including a NAND flash memory as a nonvolatile memory, and a memory controller that controls the nonvolatile memory, is known. In the memory system, requirements related to a write throughput and a read latency are specified. A write throughput is an amount of data that can be written in a nonvolatile memory per unit time. A read latency is a time required for outputting data read from the nonvolatile memory to outside the memory system. The write throughput and the read latency can be in a trade-off relationship.

BRIEF DESCRIPTION OF THE DRAWINGS

FIG. 6 is a time chart showing an example of state transition in a program process including a suspend determination process of the memory system according to the first embodiment.

FIG. 14 is a flowchart showing a series of processing including a second suspend determination process in the memory system according to the second embodiment.

FIG. 16 is a flowchart showing a series of processing including a second suspend process in a memory system according to a modification of the second embodiment.

FIG. 21 is a flowchart showing a series of processing including a suspend determination process in a memory system according to a first modification of the third embodiment.

FIG. 25 is a flowchart showing an example of a series of processing including a program process in a memory system according to a fourth embodiment.

FIG. 28 is a time chart showing an example of state transition in a program process including a resume determination process of the memory system according to the fourth embodiment.

FIG. 32 is a state transition diagram showing relationships among a plurality of states related to a program process of the memory system according to the fifth embodiment.

FIG. 34 is a flowchart showing an example of a series of processing including a program process in a memory system according to a modification of the fifth embodiment.

FIG. 36 is a time chart showing an example of state transition in a program process including a resume determination process of the memory system according to the modification of the fifth embodiment.

DETAILED DESCRIPTION

In general, according to one embodiment, a memory system includes a nonvolatile memory and a memory controller configured to cause the nonvolatile memory to execute a first process of reading data on the basis of a first request from a host device. The memory controller is configured to, when the first request is received from the host device while causing the nonvolatile memory to execute a second process, hold interruption of the second process until a first number becomes a first threshold value or more. The first number is a number of the first requests to be performed in the memory controller. The first threshold value is an integer of 2 or more.

Hereinafter, embodiments will be described with reference to the drawings. In the description below, constitution elements having the same functions and configurations will be denoted by a common reference symbol. The embodiments are described to exemplify the technical ideas. The embodiments can be variously modified.

1. FIRST EMBODIMENT 1.1 Configuration
1.1.1 Information Processing System

A configuration of an information processing system according to a first embodiment will be described.

Figure 1:
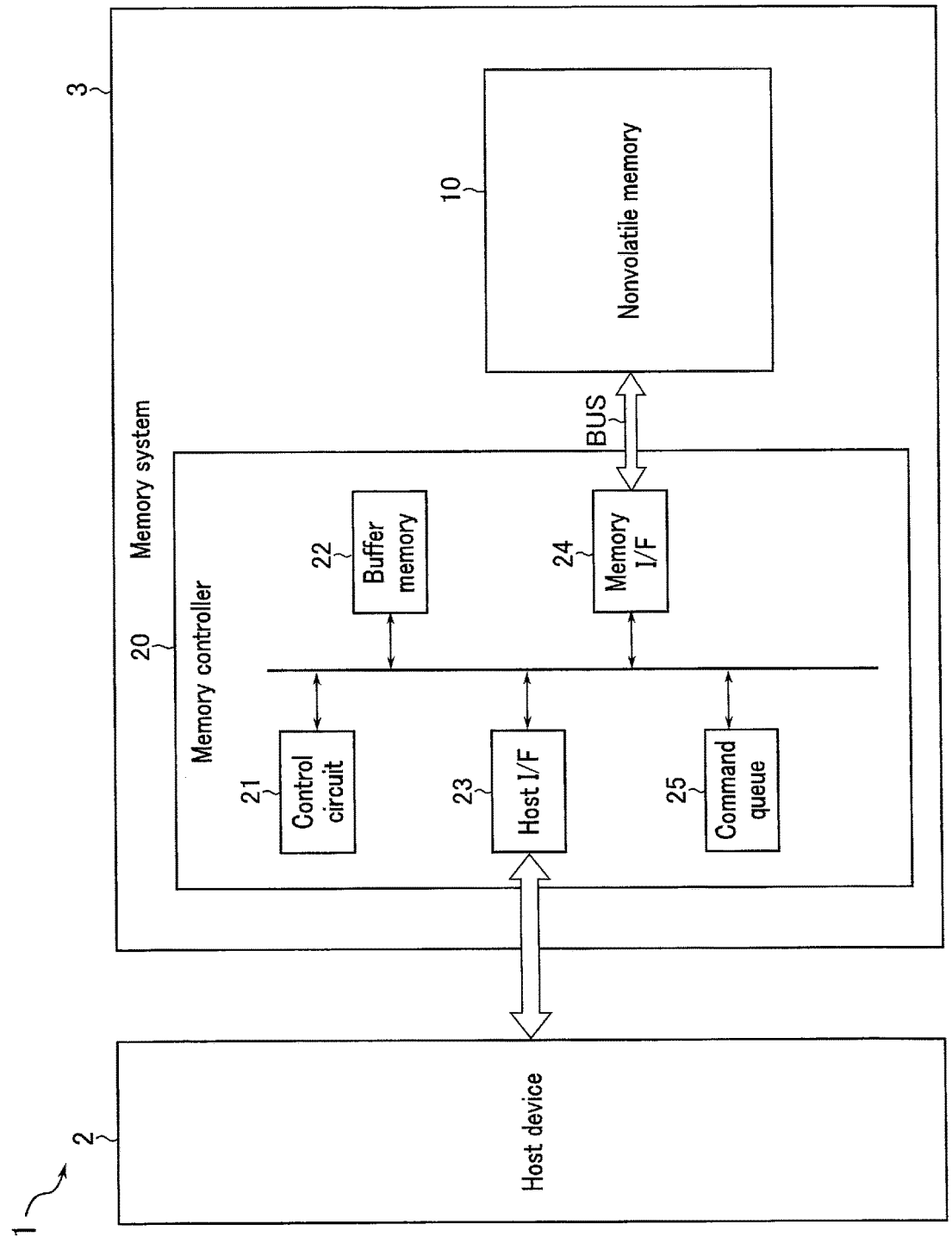
FIG. 1 is a block diagram showing a configuration of an information processing system according to a first embodiment.

FIG. 1 is a block diagram showing the configuration of the information processing system according to the first embodiment. As shown in FIG. 1, an information processing system 1 includes a host device 2 and a memory system 3.

The host device 2 is a data processing device that processes data by using the memory system 3. The host device 2 is, for example, a personal computer or a server in a data center.

The memory system 3 is a storage device formed to be coupled to the host device 2. The memory system 3 is, for example, a memory card such as an SD™ card, a universal flash storage (UFS) device, and a solid state drive (SSD). The memory system 3 executes a program process, a read process, and an erase process of data according to a request (command) from the host device 2. The memory system 3 may execute a program process, a read process, and an erase process as internal processing.

1.1.2 Memory System

An internal configuration of the memory system according to the first embodiment will be described.

The memory system 3 includes a nonvolatile memory 10 and a memory controller 20.

The nonvolatile memory 10 includes a plurality of memory cell transistors, each of which stores data in a nonvolatile manner. The nonvolatile memory 10 is, for example, a NAND flash memory.

The memory controller 20 is formed of, for example, an integrated circuit such as a system-on-a-chip (SoC). The memory controller 20 controls the nonvolatile memory 10 on the basis of a request from the host device 2. Specifically, for example, the memory controller 20 writes write data in the nonvolatile memory 10 on the basis of a write request from the host device 2. In addition, the memory controller 20 reads read data from the nonvolatile memory 10 on the basis of a read request from the host device 2. Then, the memory controller 20 transmits the read data to the host device 2.

Next, an internal configuration of the memory controller 20 will be described. The memory controller 20 includes a control circuit 21, a buffer memory 22, a host interface circuit 23, a memory interface circuit 24, and a command queue 25. Functions of each unit 21 to 25 of the memory controller 20, which will be described below, can be implemented by either a hardware configuration or a combined configuration of a hardware resource and firmware.

The control circuit 21 is a circuit that controls the entire memory controller 20. The control circuit 21 includes, for example, a processor such as a central processing unit (CPU), and a read only memory (ROM).

The buffer memory 22 is a memory for buffering data between the host device 2 and the nonvolatile memory 10. The buffer memory 22 is, for example, a static random access memory (SRAM). The buffer memory 22 temporarily stores write data and read data.

The host interface circuit (host I/F) 23 conducts communications between the memory controller 20 and the host device 2. The host interface circuit 23 is coupled to the host device 2 via a host bus. The host bus is, for example, a bus compliant with an SD™ interface, a serial attached SCSI (small computer system interface) (SAS), a serial ATA (advanced technology attachment) (SATA), or PCI Express™ (peripheral component interconnect).

The memory interface circuit (memory I/F) 24 conducts communications between the nonvolatile memory 10 and the memory controller 20. The memory interface circuit 24 is coupled to the nonvolatile memory 10 via a memory bus. The memory bus is, for example, a bus compliant with a single data rate (SDR) interface, a toggle double data rate (DDR) interface, or an open NAND flash interface (ONFI).

The command queue 25 is a memory for queuing a request from the host device 2. The command queue 25 is, for example, an SRAM. The command queue 25 is a first-in first-out (FIFO) queue. The request in the command queue 25 is retired from the command queue 25 according to execution of a corresponding process.

Figure 2:
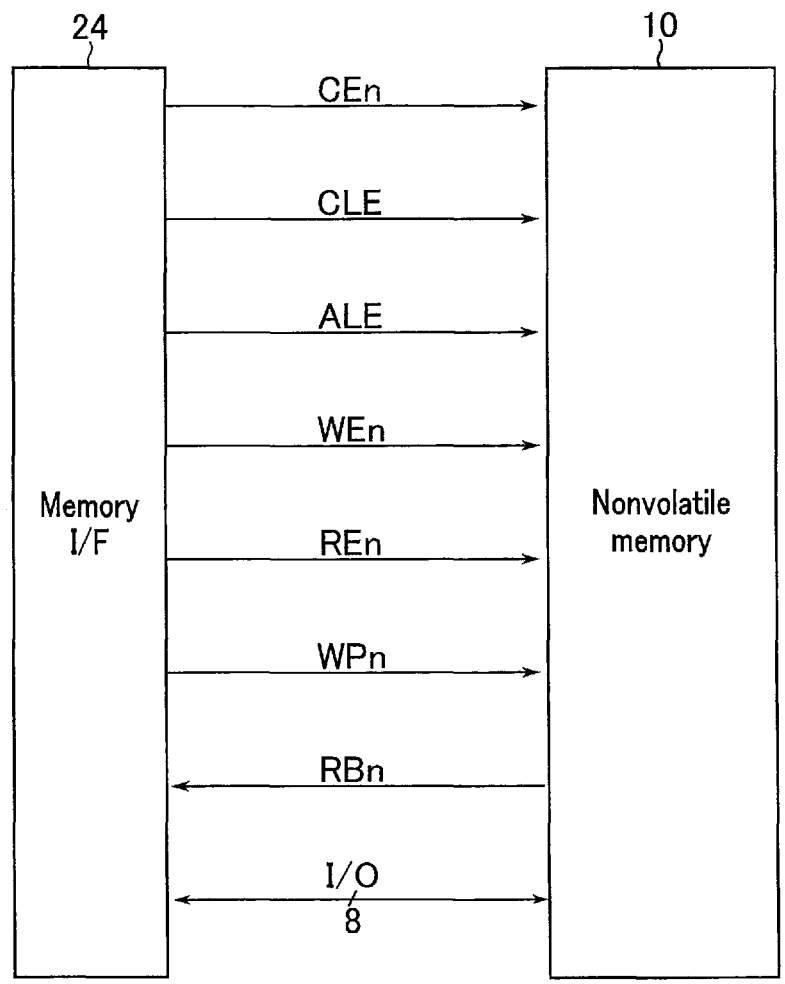
FIG. 2 is a block diagram showing an example of signals used in a memory bus according to the first embodiment.

Next, an example of signals exchanged between the nonvolatile memory 10 and the memory controller 20 will be described. FIG. 2 is a block diagram showing an example of signals used in the memory bus according to the first embodiment.

The signals used in the memory bus include, for example, a chip enable signal CEn, a command latch enable signal CLE, an address latch enable signal ALE, a write enable signal WEn, a read enable signal REn, a write protect signal WPn, a ready/busy signal RBn, and an input/output signal I/O. In the present specification, the letter "n" at the end of the name of each signal indicates that the signal is asserted when it is at a "L (Low)" level.

The signal CEn is a signal for enabling the nonvolatile memory 10.

The signals CLE and ALE are signals for notifying the nonvolatile memory 10 that input signals I/O to the nonvolatile memory 10 are a command and an address, respectively.

The signal WEn is a signal for causing the nonvolatile memory 10 to incorporate an input signal I/O therein.

The signal REn is a signal for reading an output signal I/O from the nonvolatile memory 10.

The signal WPn is a signal for instructing prohibition of data write and erase to the nonvolatile memory 10.

The signal RBn is a signal indicative of whether the nonvolatile memory 10 is in a ready state or a busy state. The ready state is a state in which the nonvolatile memory 10 is able to receive an instruction from the memory controller 20. The busy state is a state in which the nonvolatile memory 10 is unable to receive an instruction from the memory controller 20, except for some commands such as a suspend command for instructing execution of a suspend process to be described later. The signal RBn at the "L" level indicates the busy state.

The input/output signal I/O is, for example, a signal of 8-bits width. The input/output signal I/O is an entity of data transmitted and received between the nonvolatile memory 10 and the memory controller 20. The input/output signal I/O includes a command, an address, and data such as write data and read data.

1.2 Operation

Next, an operation in the memory system according to the first embodiment will be described.

1.2.1 Program Process

Figure 3:
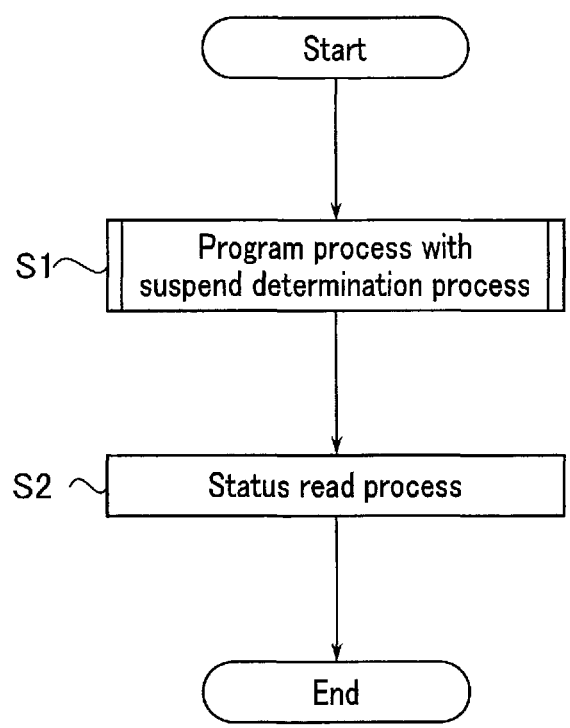
FIG. 3 is a flowchart showing an example of a series of processing including a program process in the memory system according to the first embodiment.

FIG. 3 is a flowchart showing an example of a series of processing including a program process in the memory system according to the first embodiment.

When a program condition is satisfied (Start), the memory controller 20 executes a program process including a suspend determination process (S1).

A program condition being satisfied includes a certain amount of write data being stored in the buffer memory 22 according to a write request from the host device 2. In addition, a program condition being satisfied includes a start condition for a program process to be executed by the memory controller 20 in the internal processing being satisfied. The internal processing includes a garbage collection (compaction) process, a refresh process, a wear leveling process, and a process of rendering management information of the nonvolatile memory 10 nonvolatile.

In the program process, the memory controller 20 transmits write data in the buffer memory 22 to the nonvolatile memory 10. The nonvolatile memory 10 stores the received write data in a page buffer (not shown) in the nonvolatile memory 10 (data-in). The nonvolatile memory 10 executes a program process to a memory cell array (not shown) in the nonvolatile memory 10 on the basis of the write data stored in the page buffer.

A suspend determination process is a process of determining whether or not to execute a suspend process on the basis of whether or not a suspend condition is satisfied. The suspend process is a process of interrupting a program process, etc. being executed by the nonvolatile memory 10. By adjusting a timing of executing the suspend process, the memory controller 20 can adjust a trade-off between a read latency and a write throughput.

When the program process including the suspend determination process finishes, the memory controller 20 causes the nonvolatile memory 10 to execute a status read process (S2). The status read process is a process of reading a status of the nonvolatile memory 10 so the memory controller 20 can determine a state of the nonvolatile memory 10. This enables the memory controller 20 to confirm that the nonvolatile memory 10 has ended the program process.

When the memory controller 20 receives a status that the program process has ended from the nonvolatile memory 10 in the process of S2, the series of processing including the program process finishes (End).

1.2.2 Suspend Determination Process

Figure 4:
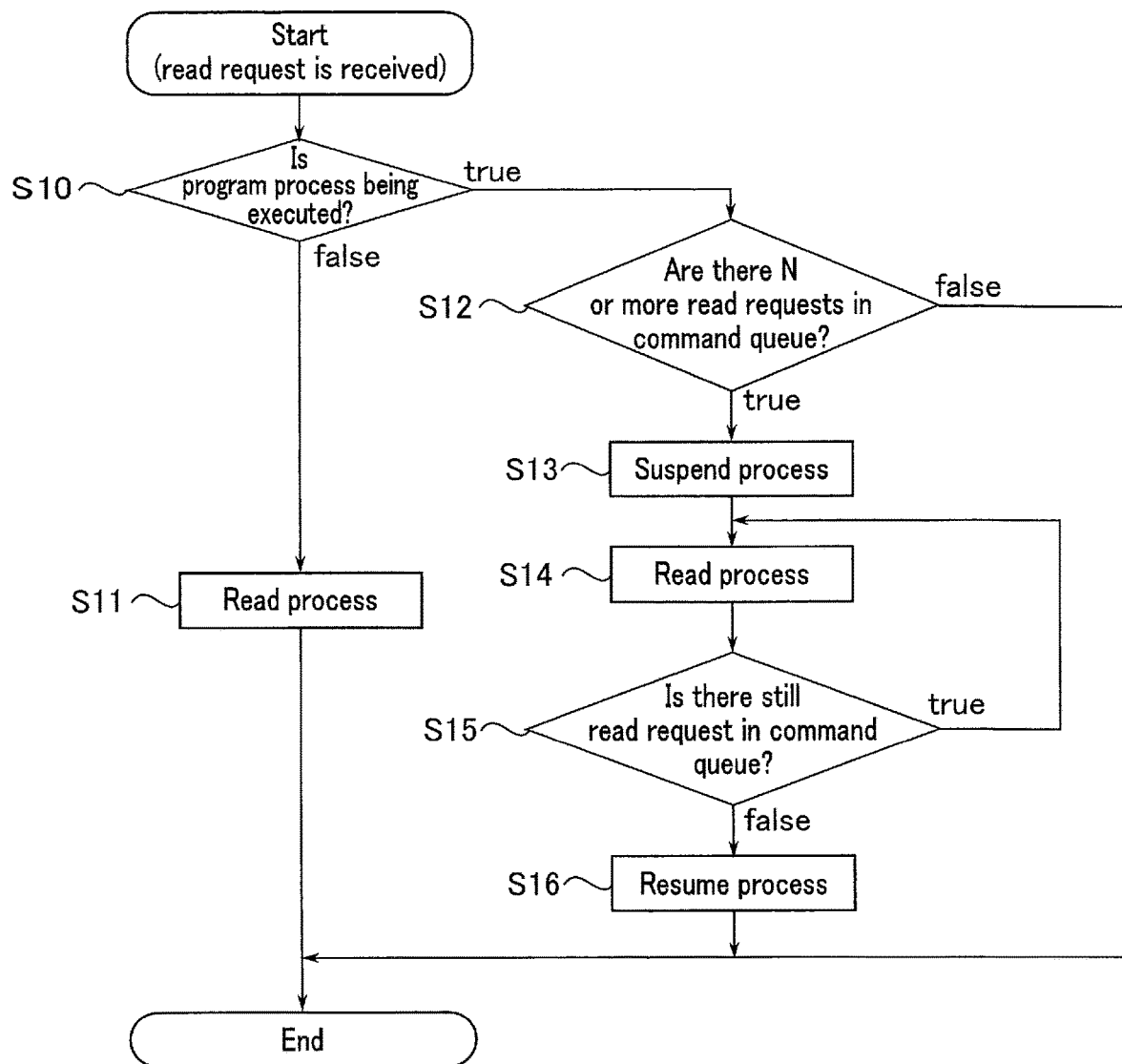
FIG. 4 is a flowchart showing an example of a series of processing including a suspend determination process in the memory system according to the first embodiment.

FIG. 4 is a flowchart showing an example of a series of processing including a suspend determination process in the memory system according to the first embodiment. The series of processing including the suspend determination process is executed according to a start condition for the suspend determination process. In the example of FIG. 4, a start condition for the suspend determination process is that the memory controller 20 receives a read request from the host device 2.

That is, when receiving a read request from the host device 2 (Start), the memory controller 20 determines whether or not the nonvolatile memory 10 is in a program process (S10).

If a program process is not being executed (S10; false), the memory controller 20 causes the nonvolatile memory 10 to execute a read process based on the received read request (S11). When the process of S11 finishes, the series of processing including the suspend determination process finishes (End).

If a program process is being executed (S10; true), the memory controller 20 determines whether or not a suspend condition is satisfied (S12). The suspend condition in the example of FIG. 4 is that there are read requests of a threshold value N or more in the command queue 25. The threshold value N is an integer of 2 or more (N≥2).

If the number of read requests in the command queue 25 is smaller than the threshold value N (S12; false), interruption of the program process is postponed. That is, the memory controller 20 does not interrupt the program process. Thereby, the series of processing including the suspend determination process finishes (End).

If there are read requests of the threshold value N or more in the command queue 25 (S12; true), the memory controller 20 causes the nonvolatile memory 10 to execute the suspend process (S13).

After the program process is interrupted by the suspend process, the memory controller 20 causes the nonvolatile memory 10 to execute a read process based on the read request (S14).

Each time the process of S14 finishes, the memory controller 20 determines whether or not there is still a read request in the command queue 25 (S15).

If there is still a read request in the command queue 25 (S15; true), the memory controller 20 causes the nonvolatile memory 10 to execute a read process based on the read request (S14). As a result, the processes of S14 and S15 are executed repeatedly until read processes corresponding to all the read requests in the command queue 25 are executed.

If there is no read request in the command queue 25 (S15; false), the memory controller 20 causes the nonvolatile memory 10 to execute a resume process (S16).

When the process of S16 finishes, the series of processing including the suspend determination process finishes (End).

1.2.3 State Transition of Memory System

Figure 5:
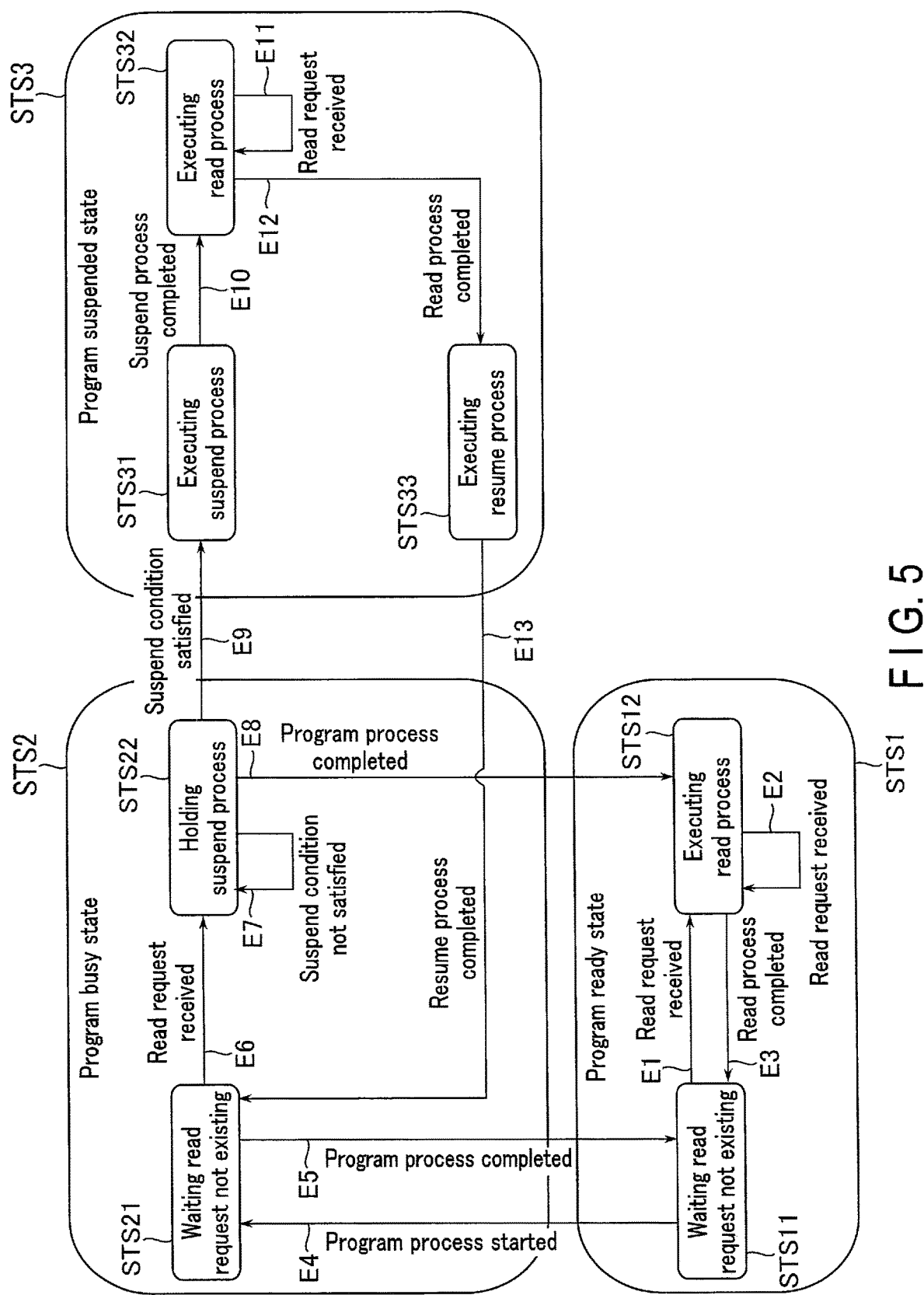
FIG. 5 is a state transition diagram showing relationships among a plurality of states related to a program process of the memory system according to the first embodiment.

FIG. 5 is a state transition diagram showing relationships among a plurality of states related to a program process of the memory system according to the first embodiment. In FIG. 5, relationships among a plurality of states of the memory system 3 for the processes shown in FIGS. 3 and 4 are shown.

First, a plurality of states of the memory system 3 will be described.

As shown in FIG. 5, states of the memory system 3 for the program process include a program ready state STS1, a program busy state STS2, and a program suspended state STS3. The program ready state STS1 is a state in which execution of the program process in the memory system 3 is permitted. The program busy state STS2 is a state in which the memory system 3 is executing the program process. The program suspended state STS3 is a state in which the memory controller 20 has interrupted the execution of the program process. In the program busy state STS2, the memory system 3 prohibits execution of the read process. In the program ready state STS1 and the program suspended state STS3, the memory system 3 permits the execution of the read process.

The program ready state STS1 includes a waiting read request not existing state STS11 and an executing read process state STS12. The waiting read request not existing state STS11 is a state in which no read request to be performed is stored in the command queue 25 in the program ready state STS1. The executing read process state STS12 is a state in which the memory system 3 is executing the read process in the program ready state STS1.

The program busy state STS2 includes a waiting read request not existing state STS21 and a holding suspend process state STS22. The waiting read request not existing state STS21 is a state in which no read request to be performed is stored in the command queue 25 in the program busy state STS2. The holding suspend process state STS22 is a state in which the memory system 3 is holding the start of the suspend process.

The program suspended state STS3 includes an executing suspend process state STS31, an executing read process state STS32, and an executing resume process state STS33. The executing suspend process state STS31 is a state in which the memory system 3 is executing the suspend process. The executing read process state STS32 is a state in which the memory system 3 is executing the read process in the program suspended state STS3. The executing resume process state STS33 is a state in which the memory system 3 is executing the resume process. The resume process is a process of resuming the interrupted program process.

Next, an event to cause each state to transition will be described.

When a read request is received from the host device 2 in the waiting read request not existing state STS11 (E1), the memory system 3 transitions to the executing read process state STS12 by starting the execution of the read process.

When a further read request is received from the host device 2 in the executing read process state STS12 (E2), the memory system 3 stays in the executing read process state STS12 until read processes corresponding to all the read requests in the command queue 25 are completed. When the read processes corresponding to all the read requests in the command queue 25 are completed (E3), the memory system 3 transitions to the waiting read request not existing state STS11.

When the program process is started in the waiting read request not existing state STS11 (E4), the memory system 3 transitions to the waiting read request not existing state STS21. When the program process is completed in the waiting read request not existing state STS21 (E5), the memory system 3 transitions to the waiting read request not existing state STS11. When a read request is received in the waiting read request not existing state STS21 (E6), the memory system 3 transitions to the holding suspend process state STS22.

When a suspend condition is not satisfied (E7), the memory system 3 stays in the holding suspend process state STS22. When the program process is completed in the holding suspend process state STS22 (E8), the memory system 3 transitions to the executing read process state STS12. When the suspend condition is satisfied in the holding suspend process state STS22 (E9), the memory system 3 transitions to the executing suspend process state STS31.

When the suspend process is completed in the executing suspend process state STS31 (E10), the memory system 3 transitions to the executing read process state STS32. When a further read request is received from the host device 2 in the executing read process state STS32 (E11), the memory system 3 stays in the executing read process state STS32 until read processes corresponding to all the read requests in the command queue 25 are completed. When the read processes corresponding to all the read requests in the command queue 25 are completed (E12), the memory system 3 transitions to the executing resume process state STS33. When the resume process is completed (E13), the memory system 3 transitions to the waiting read request not existing state STS21.

That is, when the program process is started in the program ready state STS1 (E4), the memory system 3 transitions to the program busy state STS2. When the program process is completed in the program busy state STS2 (E5 or E8), the memory system 3 transitions to the program ready state STS1. When the suspend condition is satisfied in the program busy state STS2 (E9), the memory system 3 transitions to the program suspended state STS3. When the resume process is completed in the program suspended state STS3 (E13), the memory system 3 transitions to the program busy state STS2.

1.2.4 State Transition in Program Process Including Suspend Determination Process FIG. 6 is a time chart showing an example of state transition in a program process including a suspend determination process of the memory system according to the first embodiment. In the example of FIG. 6, a case where the threshold value N is 2 is shown. In the example of FIG. 6, it is assumed that the state of the memory system 3 is the waiting read request not existing state STS11 before time t10.

As shown in FIG. 6, at time t10, the memory controller 20 causes the nonvolatile memory 10 to execute a program process. Along with this, the memory system 3 enters the waiting read request not existing state STS21.

At time t11, the memory controller 20 receives a first read request. As a result, the number of read requests in the command queue 25 is 1, which is less than the threshold value N (=2). Thus, the memory system 3 enters the holding suspend process state STS22.

At time t12, the memory controller 20 receives a second read request. As a result, the number of read requests in the command queue 25 is 2, which is equal to the threshold value N (=2). Thus, the memory controller 20 causes the nonvolatile memory 10 to execute a suspend process. Along with this, the memory system 3 enters the executing suspend process state STS31.

At time t13, the suspend process finishes. Then, the memory controller 20 causes the nonvolatile memory 10 to execute a read process (first read process) based on the first read request. Along with this, the memory system 3 enters the executing read process state STS32.

At time t14, the first read process finishes. Then, the memory controller 20 causes the nonvolatile memory 10 to execute a read process (second read process) based on the second read request. The memory system 3 stays in the executing read process state STS32.

At time t15, the second read process finishes. The memory controller 20 causes the nonvolatile memory 10 to execute a resume process after confirming that the number of read requests in the command queue 25 is 0. Along with this, the memory system 3 enters the executing resume process state STS33.

At time t16, the resume process finishes. Then, the memory controller 20 causes the nonvolatile memory 10 to resume the program process. Along with this, the memory system 3 enters the waiting read request not existing state STS21.

At time t17, the program process finishes. After that, the memory controller 20 confirms, by a status read process, that data has been written in the nonvolatile memory 10 without any problems. As a result, the state of the memory system 3 returns to the waiting read request not existing state STS11.

1.3 Advantageous Effect of First Embodiment

According to the first embodiment, the memory controller 20 holds a suspend process until the number of read requests in the command queue 25 becomes the threshold value N or more. As a result, the memory controller 20 can execute read processes of at least the threshold value N collectively during one interruption of a program process. Thus, it is possible to reduce the number of times suspend processes and resume processes are performed as compared to a case where a program process is interrupted each time a read request is received. Accordingly, it is possible to reduce a total time (cumulative overhead) required for the suspend process and resume process and to suppress a decrease in write throughput as compared to a case where a program process is interrupted each time a read request is received.

In addition, according to the first embodiment, when the number of read requests in the command queue 25 is the threshold value N or more, the memory controller 20 executes a suspend process. As a result, the memory controller 20 can execute a read process without waiting for completion of a program process when a suspend condition is satisfied. Thus, it is possible to shorten a time required from read request reception to read process completion as compared to a case of executing a read process after a program process is completed. Accordingly, it is possible to suppress an increase in read latency as compared to a case of executing a read process after a program process is completed.

As such, according to the first embodiment, it is possible to realize both an improved write throughput as compared to a case of interrupting a program process each time a read request is received, and an improved read latency as compared to a case of executing a read process after a program process is completed. Accordingly, it is possible to provide a means for adjusting a trade-off between the write throughput and the read latency.

1.4 Modification of First Embodiment

In the above-described first embodiment, a case has been described where the memory controller 20 holds a suspend process until the number of read requests becomes the threshold value N or more, but the embodiment is not limited thereto. For example, the memory controller 20 may control a period to hold a suspend process on the basis of an elapsed time from reception of the first read request. In the following, descriptions of configurations and operations equivalent to those in the first embodiment will be omitted, and configurations and operations different from those in the first embodiment will be mainly described.

1.4.1 Configuration of Memory Controller

Figure 7:
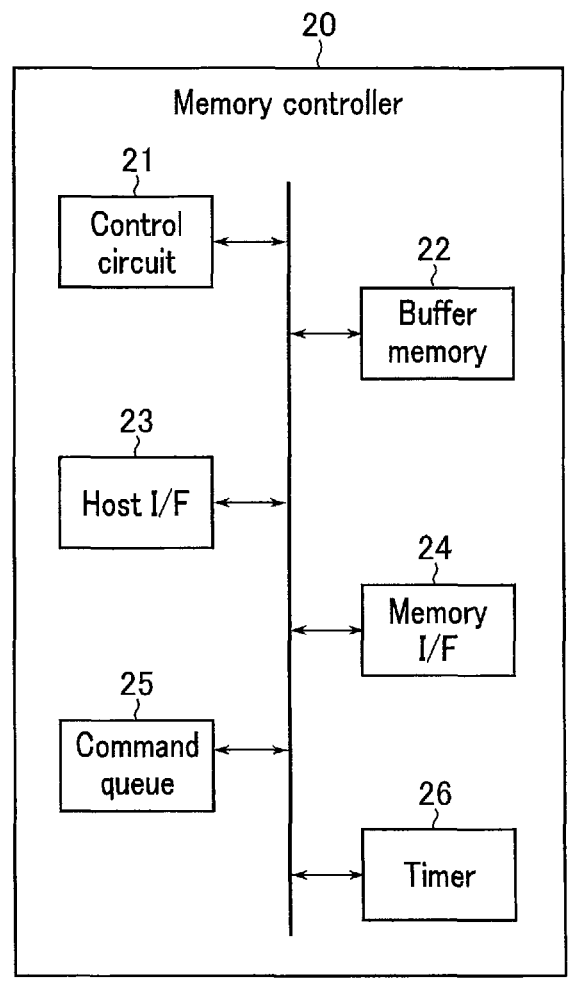
FIG. 7 is a block diagram showing a configuration of a memory controller according to a modification of the first embodiment.

FIG. 7 is a block diagram showing a configuration of a memory controller according to a modification of the first embodiment. As shown in FIG. 7, the memory controller 20 further includes a timer 26.

The timer 26 measures a time. For example, the timer 26 starts measurement on the basis of a start instruction from the control circuit 21 (Start). The timer 26 suspends the measurement on the basis of a suspend instruction from the control circuit 21 (Suspend). The timer 26 resumes the suspended measurement on the basis of a resume instruction from the control circuit 21 (Resume). The timer 26 stops the measurement on the basis of a stop instruction from the control circuit 21 (Stop).

Before starting and after stopping the timer 26, the timer 26 is in a stopped state. From the start to the end of measurement, the timer 26 is in a running state. In the modification of the first embodiment, the timer 26 measures an elapsed time after the memory system 3 enters the holding suspend process state STS22 by receiving a read request.

The memory controller 20 acquires a measurement value from a start time of measurement of the timer 26, for example. This allows the memory controller 20 to determine an elapsed time from a desired point in time.

1.4.2 Program Process

Figure 8:
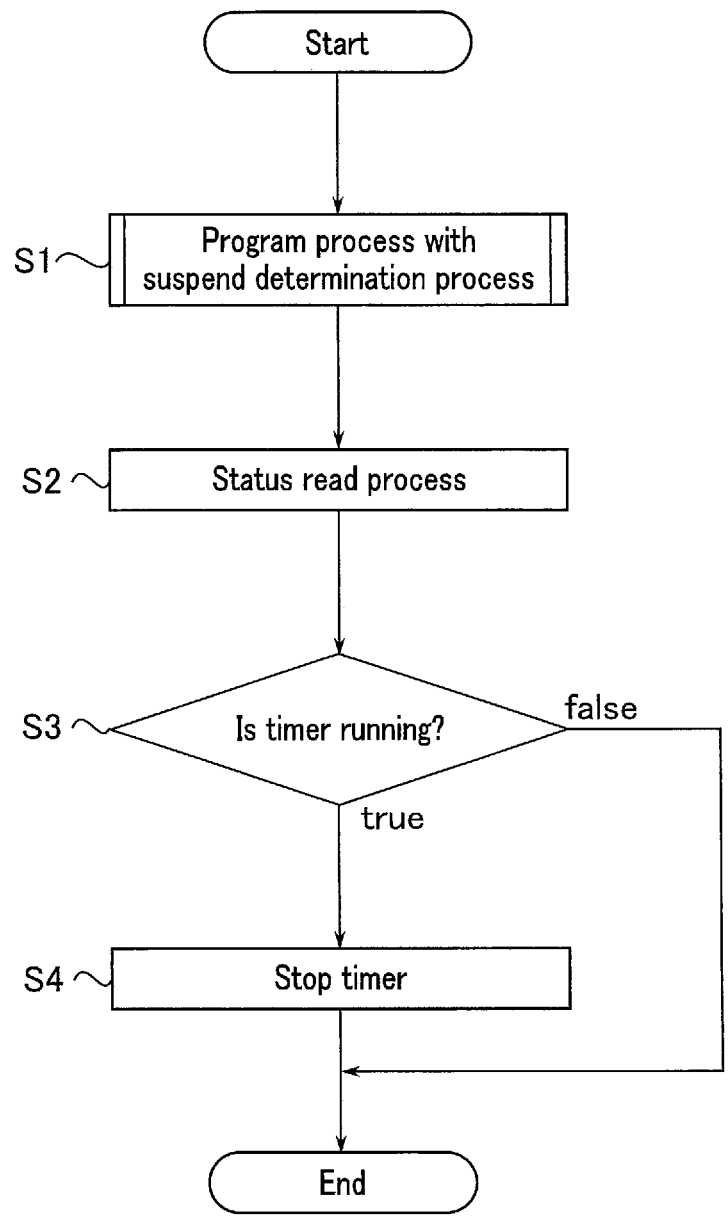
FIG. 8 is a flowchart showing an example of a series of processing including a program process in a memory system according to the modification of the first embodiment.

FIG. 8 is a flowchart showing an example of a series of processing including a program process in the memory system according to the modification of the first embodiment.

When a program condition is satisfied (Start), the memory controller 20 causes the nonvolatile memory 10 to execute a program process including a suspend determination process (S1).

When the program process including the suspend determination process is completed, the memory controller 20 causes the nonvolatile memory 10 to execute a status read process (S2).

When a status that the program process is completed is received from the nonvolatile memory 10 in the process of S2, the memory controller 20 determines whether or not the timer 26 is running (S3).

If the timer 26 is running (S3; true), the memory controller 20 stops the timer 26 (S4). When the process of S4 finishes, the series of processing including the program process finishes (End).

In addition, if the timer 26 is not running (S3; false), the series of processing including the program process finishes without executing the process of S4 (End).

1.4.3 Suspend Determination Process

Figure 9:
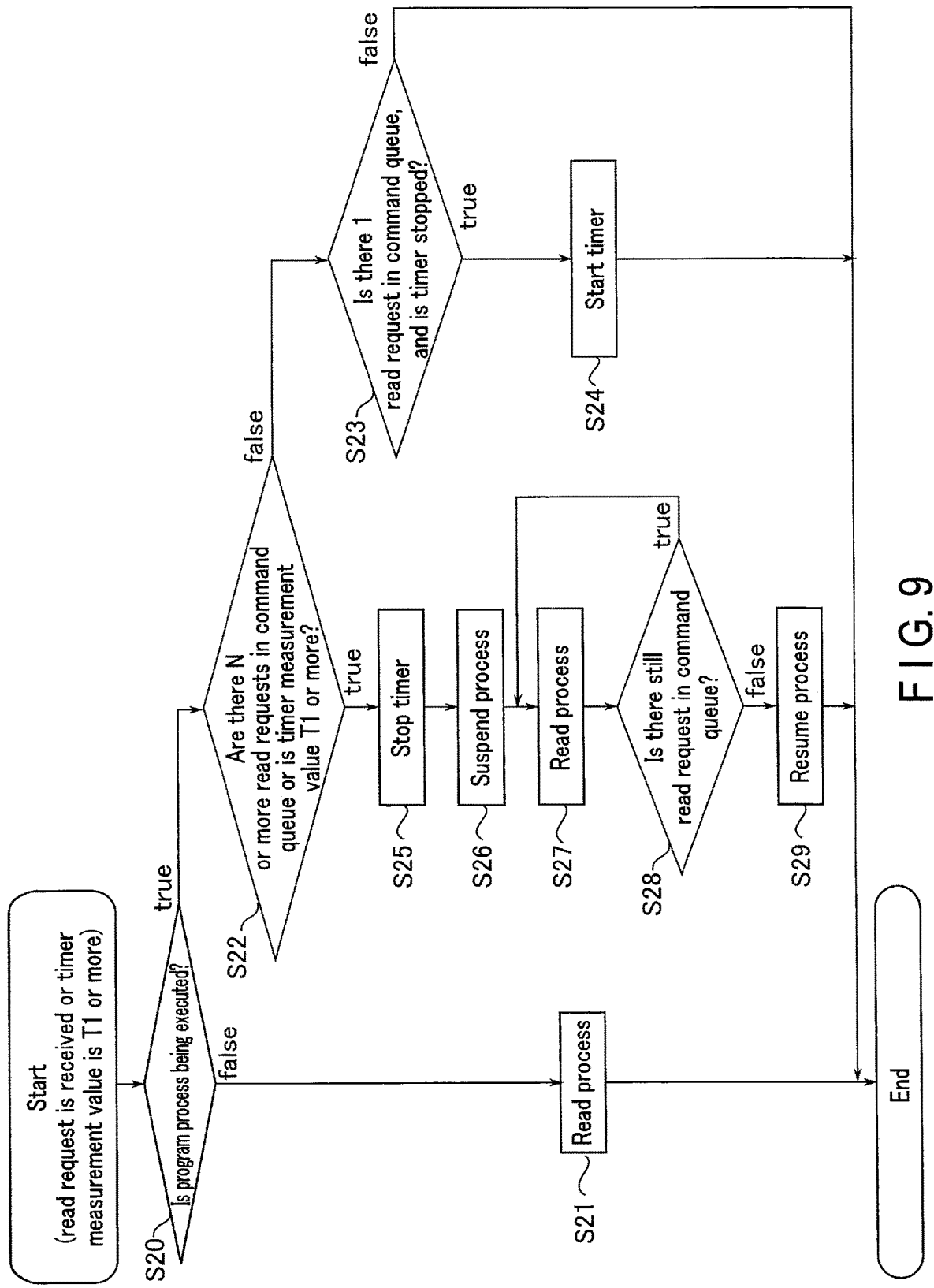
FIG. 9 is a flowchart showing an example of a series of processing including a suspend determination process in the memory system according to the modification of the first embodiment.

FIG. 9 is a flowchart showing an example of a series of processing including a suspend determination process in the memory system according to the modification of the first embodiment. In the example of FIG. 9, a start condition for the suspend determination process is that the memory controller 20 receives a read request from the host device 2, or a measurement value of the timer 26 is a threshold value T1 or more. The threshold value T1 is a positive real number.

That is, if a read request is received from the host device 2 or the measurement value of the timer 26 becomes the threshold value T1 or more (Start), the memory controller 20 determines whether or not the nonvolatile memory 10 is in a program process (S20).

If the program process is not being executed (S20; false), the memory controller 20 causes the nonvolatile memory 10 to execute a read process based on the received read request (S21). When the process of S21 finishes, the series of processing including the suspend determination process finishes (End).

If the program process is being executed (S20; true), the memory controller 20 determines whether or not a suspend condition is satisfied (S22). The suspend condition in the example of FIG. 9 is that there are read requests of the threshold value N or more in the command queue 25, or the measurement value of the timer 26 is the threshold value T1 or more.

If the number of read requests in the command queue 25 is smaller than the threshold value N, and the measurement value of the timer 26 is less than the threshold value T1 (S22; false), the memory controller 20 holds interruption of the program process. That is, the memory controller 20 does not interrupt the program process. Then, the memory controller 20 determines whether or not there is one read request in the command queue 25 and the timer 26 is stopped (S23).

If the number of read requests in the command queue 25 is not one or the timer 26 is not stopped (S23; false), the series of processing including the suspend determination process finishes (End).

If there is one read request in the command queue 25 and the timer 26 is stopped (S23; true), the memory controller 20 starts the timer 26 (S24).

When the process of S24 finishes, the series of processing including the suspend determination process finishes while the timer 26 stays in the running state (End).

If there are read requests of the threshold value N or more in the command queue 25 or the measurement value of the timer 26 is the threshold value T1 or more (S22; true), the memory controller 20 stops the timer 26 (S25).

After the timer 26 is stopped, the memory controller 20 causes the nonvolatile memory 10 to execute a suspend process (S26).

After the program process is interrupted by the suspend process, the memory controller 20 causes the nonvolatile memory 10 to execute a read process based on a read request (S27).

Each time the process of S27 finishes, the memory controller 20 determines whether or not there is still a read request in the command queue 25 (S28).

If there is still a read request in the command queue 25 (S28; true), the memory controller 20 causes the nonvolatile memory 10 to execute a read process based on the read request (S27). As a result, the processes of S27 and S28 are executed repeatedly until read processes corresponding to all the read requests in the command queue 25 are executed.

If there is no read request in the command queue 25 (S28; false), the memory controller 20 causes the nonvolatile memory 10 to execute a resume process (S29).

When the process of S29 finishes, the series of processing including the suspend determination process finishes while the timer 26 stays in the stopped state (End).

Figure 10:
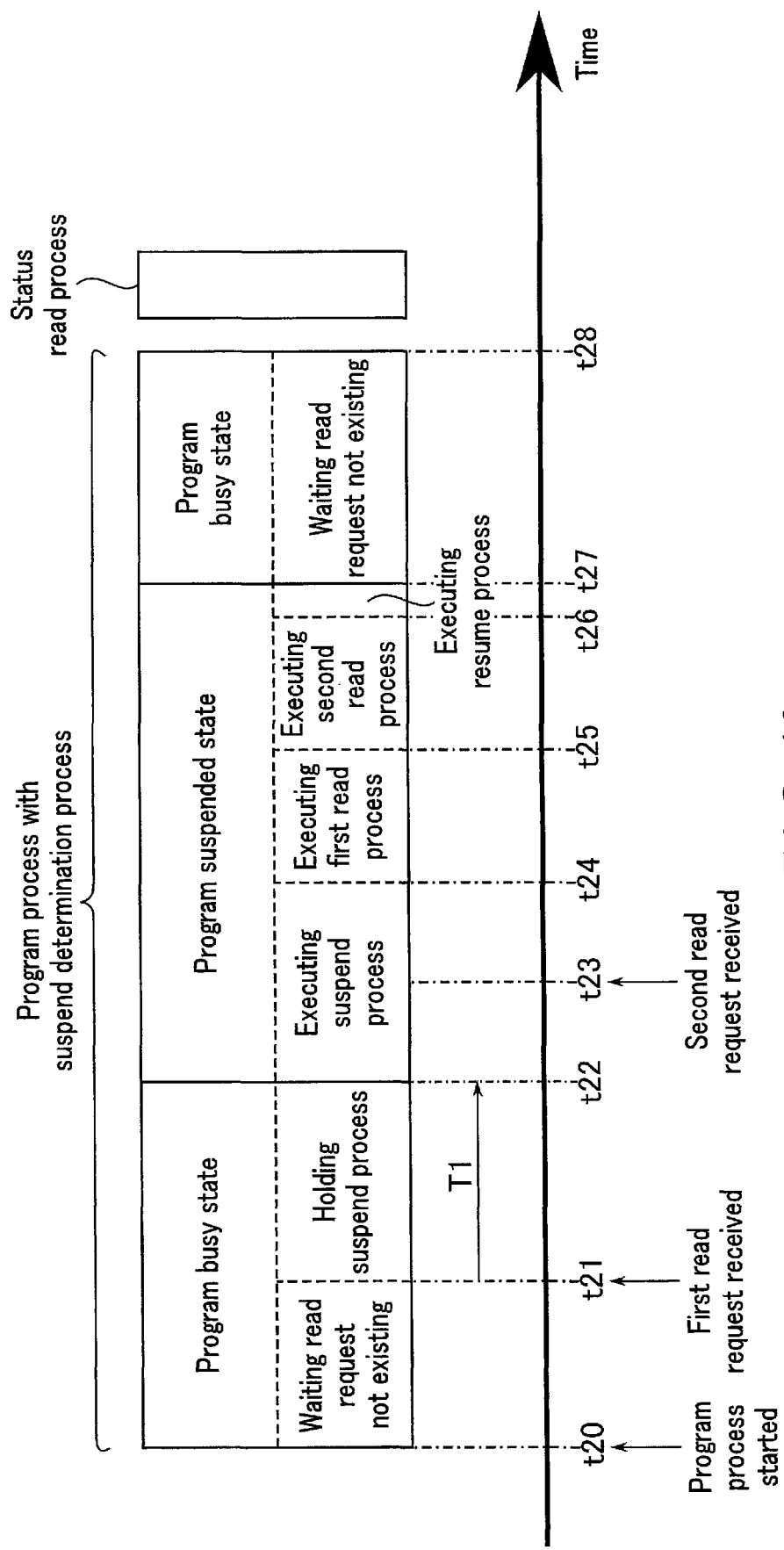
FIG. 10 is a time chart showing an example of state transition in a program process including a suspend determination process of the memory system according to the modification of the first embodiment.

1.4.4 State Transition in Program Process Including Suspend Determination Process FIG. 10 is a time chart showing an example of state transition in a program process including a suspend determination process of the memory system according to the modification of the first embodiment. In the example of FIG. 10, a case is shown where the measurement value of the timer 26 reaches the threshold value T1 prior to the number of read requests in the command queue 25 reaching the threshold value N so that a suspend process is executed. In the example of FIG. 10, it is assumed that the state of the memory system 3 is the waiting read request not existing state STS11 before time t20. In addition, it is assumed that the timer 26 is in a stopped state before time t20.

As shown in FIG. 10, at time t20, the memory controller 20 causes the nonvolatile memory 10 to execute a program process. Along with this, the memory system 3 enters the waiting read request not existing state STS21.

At time t21, the memory controller 20 receives a first read request. As a result, the number of read requests in the command queue 25 becomes 1, which is less than the threshold value N. Thus, the memory system 3 enters the holding suspend process state STS22. In addition, the memory controller 20 starts the timer 26 in response to the reception of the first read request.

At time t22, the measurement value of the timer 26 reaches the threshold value T1. The memory controller 20 stops the timer 26. After that, the memory controller 20 causes the nonvolatile memory 10 to execute a suspend process. Along with this, the memory system 3 enters the executing suspend process state STS31.

At time t23, the memory controller 20 receives a second read request. As a result, the number of read requests in the command queue 25 becomes 2. The memory system 3 stays in the executing suspend process state STS31.

At time t24, the suspend process finishes. Then, the memory controller 20 causes the nonvolatile memory 10 to execute a first read process. Along with this, the memory system 3 enters the executing read process state STS32.

At time t25, the first read process finishes. Then, the memory controller 20 causes the nonvolatile memory 10 to execute a second read process. The memory system 3 stays in the executing read process state STS32.

At time t26, the second read process finishes. The memory controller 20 causes the nonvolatile memory 10 to execute a resume process after confirming that the number of read requests in the command queue 25 is 0. Along with this, the memory system 3 enters the executing resume process state STS33.

At time t27, the resume process finishes. Then, the memory controller 20 causes the nonvolatile memory 10 to resume the program process. Along with this, the memory system 3 enters the waiting read request not existing state STS21.

At time t28, the program process finishes. After that, the memory controller 20 confirms that data has been written in the nonvolatile memory 10 without any problems by a status read process. As a result, the state of the memory system 3 returns to the waiting read request not existing state STS11.

1.4.5 Advantageous Effects of Modification of First Embodiment

According to the modification of the first embodiment, the memory controller 20 starts the timer 26 in response to the first read request being stored in the command queue 25. When the measurement value of the timer 26 reaches the threshold value T1, the memory controller 20 executes a suspend process regardless of whether or not the number of read requests in the command queue 25 is the threshold value N or more. As a result, the memory controller 20 that has received a read request can start a suspend process within a period of the threshold value T1. Thus, it is possible to exhibit the advantageous effect described in the first embodiment as well as suppress an increase in read latency in a case of not receiving the second and subsequent read requests.

2. SECOND EMBODIMENT

Next, a memory system according to a second embodiment will be described. The second embodiment is different from the first embodiment in that a suspend process is prohibited until the measurement value of the timer 26 reaches a threshold value. That is, in the second embodiment, the timer 26 measures an elapsed time from a start of a program process and an elapsed time from an end of a resume process. In the following, descriptions of configurations and operations equivalent to those in the modification of the first embodiment will be omitted, and configurations and operations different from those in the modification of the first embodiment will be mainly described.

2.1 Program Process

Figure 11:
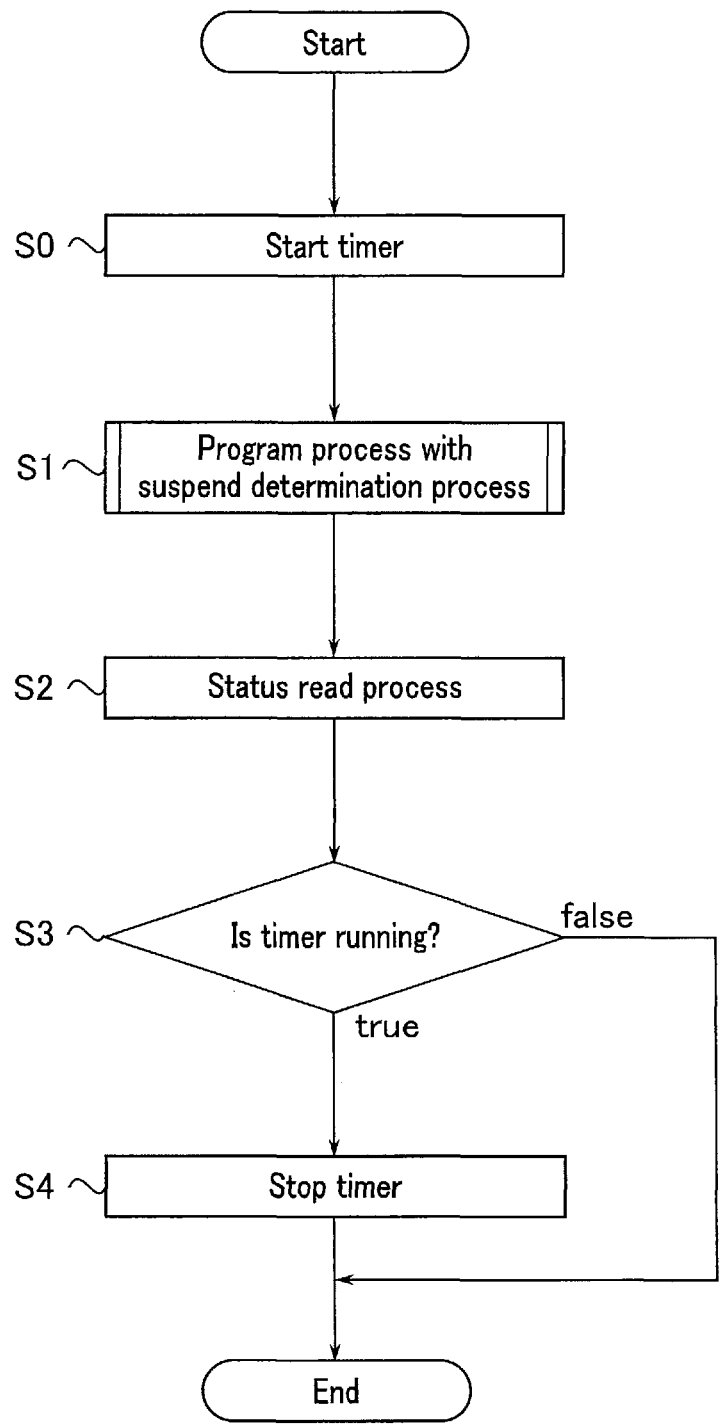
FIG. 11 is a flowchart showing an example of a series of processing including a program process in a memory system according to a second embodiment.

FIG. 11 is a flowchart showing an example of a series of processing including a program process in the memory system according to the second embodiment.

When a program condition is satisfied (Start), the memory controller 20 starts the timer 26 (S0).

After starting the measurement of the timer 26, the memory controller 20 causes the nonvolatile memory 10 to execute a program process including a suspend determination process (S1).

A timing to start the timer 26 and a timing to start the program process including the suspend determination process may be simultaneous. That is, the timer 26 may start measurement from a start time of the program process including the suspend determination process. The timer 26 may start measurement from a start time of a data-in process to the page buffer in the nonvolatile memory 10. The timer 26 may start measurement from a completion time of a data-in process to the page buffer in the nonvolatile memory 10.

Since the processes of S2 and the subsequent steps are equivalent to those of the modification of the first embodiment described with reference to FIG. 8, descriptions thereof are omitted.

2.2 First Suspend Determination Process

First, a first suspend determination process will be described. The first suspend determination process is a suspend determination process executed by the time of a first suspend process in a program process.

Figure 12:
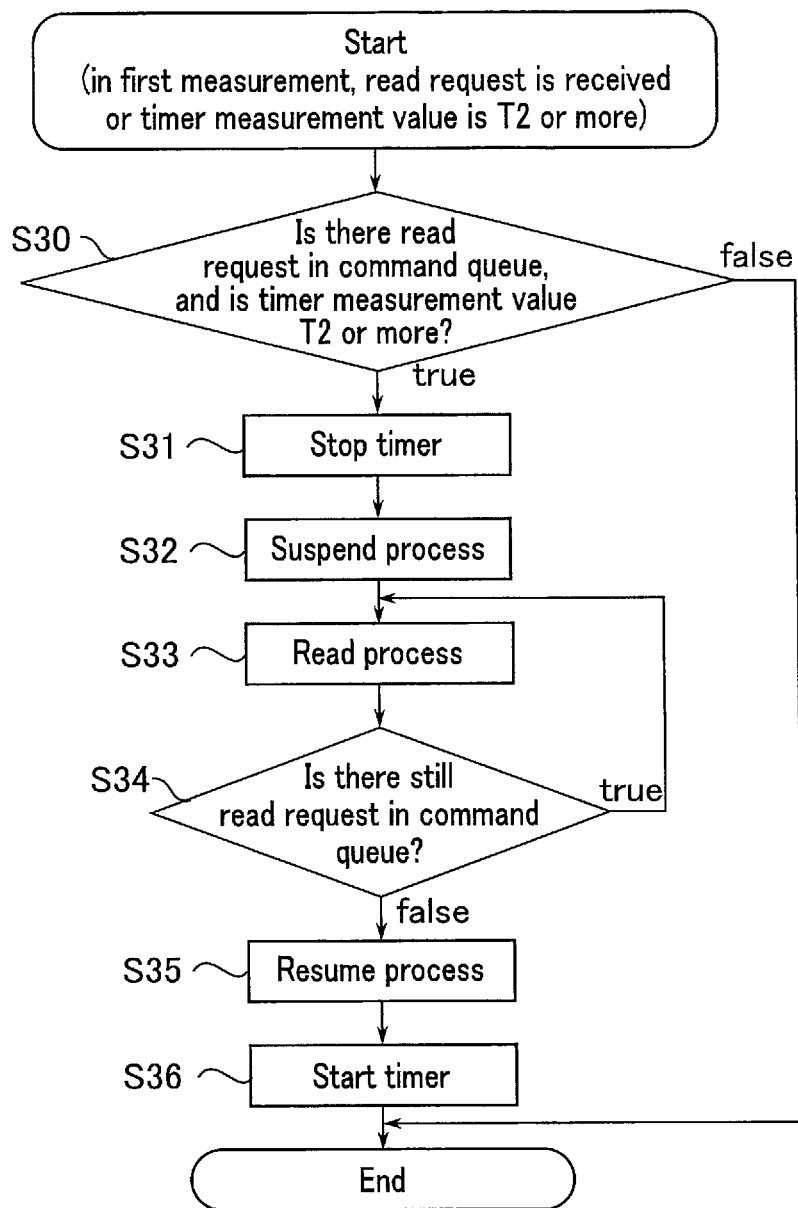
FIG. 12 is a flowchart showing a series of processing including a first suspend determination process in the memory system according to the second embodiment.

FIG. 12 is a flowchart showing an example of a series of processing including the first suspend determination process in the memory system according to the second embodiment. In the example of FIG. 12, a start condition for the first suspend determination process is that, during a first measurement in a program process, the memory controller 20 receives a read request from the host device 2, or the measurement value of the timer 26 becomes a threshold value T2 or more. The threshold value T2 is a positive real number.

That is, during the first measurement in the program process, when a read request is received from the host device 2 or the measurement value of the timer 26 becomes the threshold value T2 or more (Start), the memory controller 20 determines whether or not a first suspend condition is satisfied (S30). The first suspend condition in the example of FIG. 12 is that there is a read request in the command queue 25 and the measurement value of the timer 26 is the threshold value T2 or more.

If there is a read request in the command queue 25 and the measurement value of the timer 26 is the threshold value T2 or more (S30; true), the memory controller 20 stops the timer 26 (S31).

After stopping the timer 26, the memory controller 20 causes the nonvolatile memory 10 to execute a first suspend process in the program process (S32).

After the program process is interrupted by the suspend process, the memory controller 20 causes the nonvolatile memory 10 to execute a read process based on a read request (S33).

Each time the process of S33 finishes, the memory controller 20 determines whether or not there is still a read request in the command queue 25 (S34).

If there is still a read request in the command queue 25 (S34; true), the memory controller 20 causes the nonvolatile memory 10 to execute a read process based on the read request (S33). As a result, the processes of S33 and S34 are executed repeatedly until read processes corresponding to all the read requests in the command queue 25 are executed.

If there is no read request in the command queue 25 (S34; false), the memory controller 20 causes the nonvolatile memory 10 to execute a resume process (S35).

When the resume process finishes, the memory controller 20 starts the timer 26 (S36).

When the process of S36 finishes, the series of processing including the first suspend determination process finishes while the timer 26 stays in the running state (End).

If there is no read request in the command queue 25 or the measurement value of the timer 26 is less than T2 (S30; false), the memory controller 20 holds interruption of the program process. That is, the memory controller 20 does not interrupt the program process. Thus, the series of processing including the first suspend determination process finishes while the timer 26 stays in the running state (End).

Figure 13:
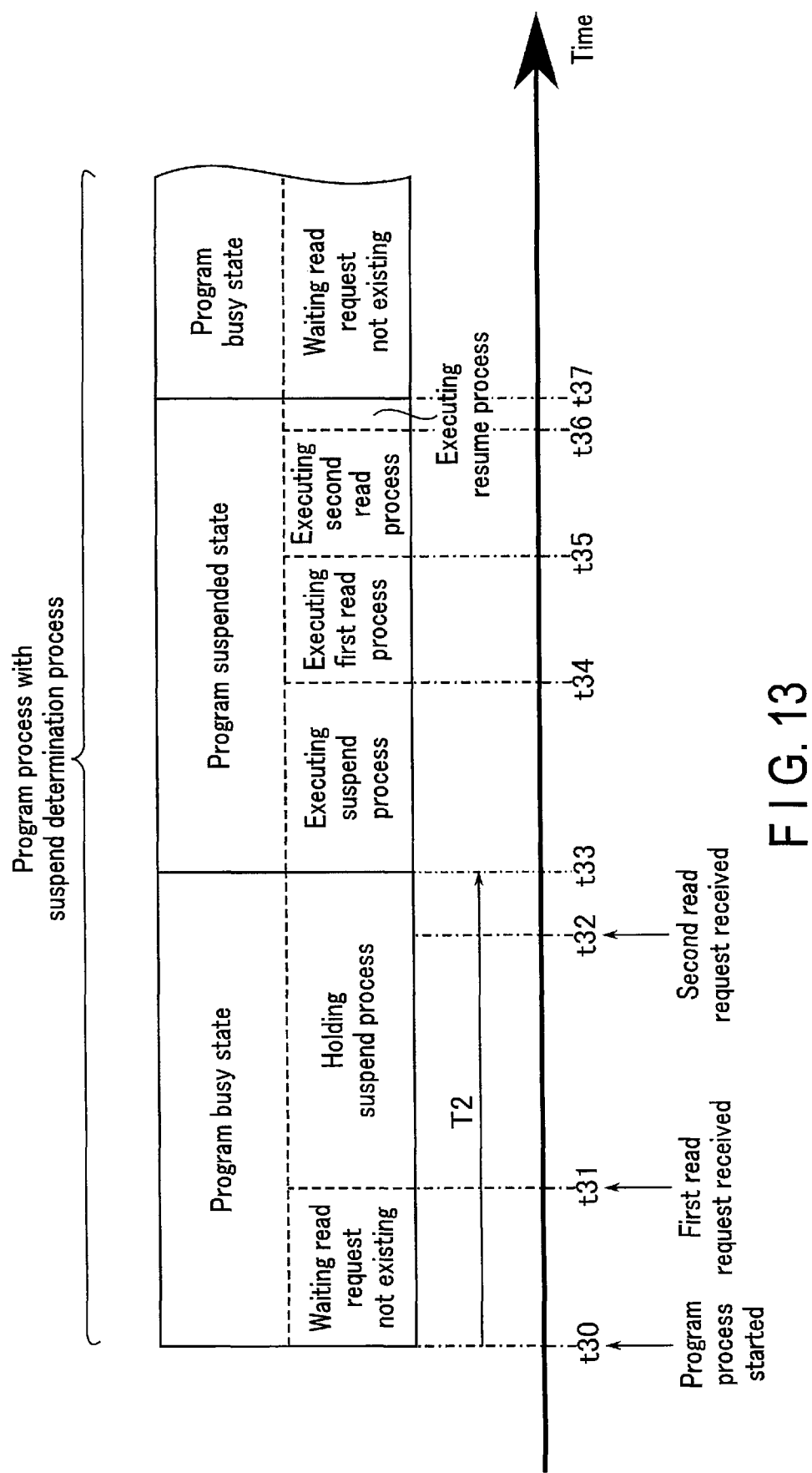
FIG. 13 is a time chart showing an example of state transition in a program process including a first suspend determination process of the memory system according to the second embodiment.

2.3 State Transition in Program Process Including First Suspend Determination Process FIG. 13 is a time chart showing an example of state transition in a program process including a first suspend determination process of the memory system according to the second embodiment. In the example of FIG. 13, a case is shown where, in a first measurement, the measurement value of the timer 26 reaches the threshold value T2 after a read request is stored in the command queue 25 so that a suspend process is executed. In the example of FIG. 13, it is assumed that the state of the memory system 3 is the waiting read request not existing state STS11 before time t30.

As shown in FIG. 13, at time t30, the memory controller 20 causes the nonvolatile memory 10 to execute the program process. Along with this, the memory system 3 enters the waiting read request not existing state STS21. In addition, the memory controller 20 starts the timer 26 from the start of the program process.

At time t31, the memory controller 20 receives a first read request. As a result, the number of read requests in the command queue 25 becomes 1. However, since the measurement value of the timer 26 is less than the threshold value T2, interruption of the program process is postponed. Thus, the memory system 3 enters the holding suspend process state STS22.

At time t32, the memory controller 20 receives a second read request. As a result, the number of read requests in the command queue 25 becomes 2. However, since the measurement value of the timer 26 is less than the threshold value T2, the memory system 3 stays in the holding suspend process state STS22.

At time t33, the measurement value of the timer 26 reaches the threshold value T2. The memory controller 20 stops the timer 26. After that, the memory controller 20 causes the nonvolatile memory 10 to execute a suspend process. Along with this, the memory system 3 enters the executing suspend process state STS31.

At time t34, the suspend process finishes. Then, the memory controller 20 causes the nonvolatile memory 10 to execute a read process (first read process) based on the first read request. Along with this, the memory system 3 enters the executing read process state STS32.

At time t35, the first read process finishes. Then, the memory controller 20 causes the nonvolatile memory 10 to execute a read process (second read process) based on the second read request. The memory system 3 stays in the executing read process state STS32.

At time t36, the second read process finishes. The memory controller 20 causes the nonvolatile memory 10 to execute a resume process after confirming that the number of read requests in the command queue 25 is 0. Along with this, the memory system 3 enters the executing resume process state STS33.

At time t37, the resume process finishes. Then, the memory controller 20 causes the nonvolatile memory 10 to resume the program process. In addition, the memory controller 20 starts the timer 26. Along with this, the memory system 3 enters the waiting read request not existing state STS21.

2.4 Second Suspend Determination Process

Next, a second suspend determination process will be described. The second suspend determination process is a suspend determination process executed in the second and subsequent suspend processes in a program process.

FIG. 14 is a flowchart showing an example of a series of processing including the second suspend determination process in the memory system according to the second embodiment. In the example of FIG. 14, a start condition for the second suspend determination process is that, in the second and subsequent measurements in a program process, the memory controller 20 receives a read request from the host device 2, or the measurement value of the timer 26 becomes a threshold value T3 or more. The threshold value T3 is a positive real number. The threshold value T3 may be equal to the threshold value T2. The threshold value T3 may be different from the threshold value T2.

That is, when, in the second and subsequent measurements in the program process, a read request is received from the host device 2, or the measurement value of the timer 26 becomes the threshold value T3 or more (Start), the memory controller 20 determines whether or not a second suspend condition is satisfied (S40). The second suspend condition in the example of FIG. 14 is that there is a read request in the command queue 25 and the measurement value of the timer 26 is the threshold value T3 or more.

If there is a read request in the command queue 25, and the measurement value of the timer 26 is the threshold value T3 or more (S40; true), the memory controller 20 stops the timer 26 (S41).

After stopping the timer 26, the memory controller 20 causes the nonvolatile memory 10 to execute the second or subsequent suspend process in the program process (S42).

After the program process is interrupted by the suspend process, the memory controller 20 causes the nonvolatile memory 10 to execute a read process based on the read request (S43).

Each time the process of S43 finishes, the memory controller 20 determines whether or not there is still a read request in the command queue 25 (S44).

If there is still a read request in the command queue 25 (S44; true), the memory controller 20 causes the nonvolatile memory 10 to execute a read process based on the read request (S43). As a result, the processes of S43 and S44 are executed repeatedly until read processes corresponding to all the read requests in the command queue 25 are executed.

If there is no read request in the command queue 25 (S44; false), the memory controller 20 causes the nonvolatile memory 10 to execute a resume process (S45).

When the resume process finishes, the memory controller 20 starts the timer 26 (S46).

When the process of S46 finishes, the series of processing including the second suspend determination process finishes while the timer 26 stays in the running state (End).

If there is no read request in the command queue 25, or the measurement value of the timer 26 is less than T3 (S40; false), the memory controller 20 holds interruption of the program process. That is, the memory controller 20 does not interrupt the program process. Thus, the series of processing including the second suspend determination process finishes while the timer 26 stays in the running state (End).

Figure 15:
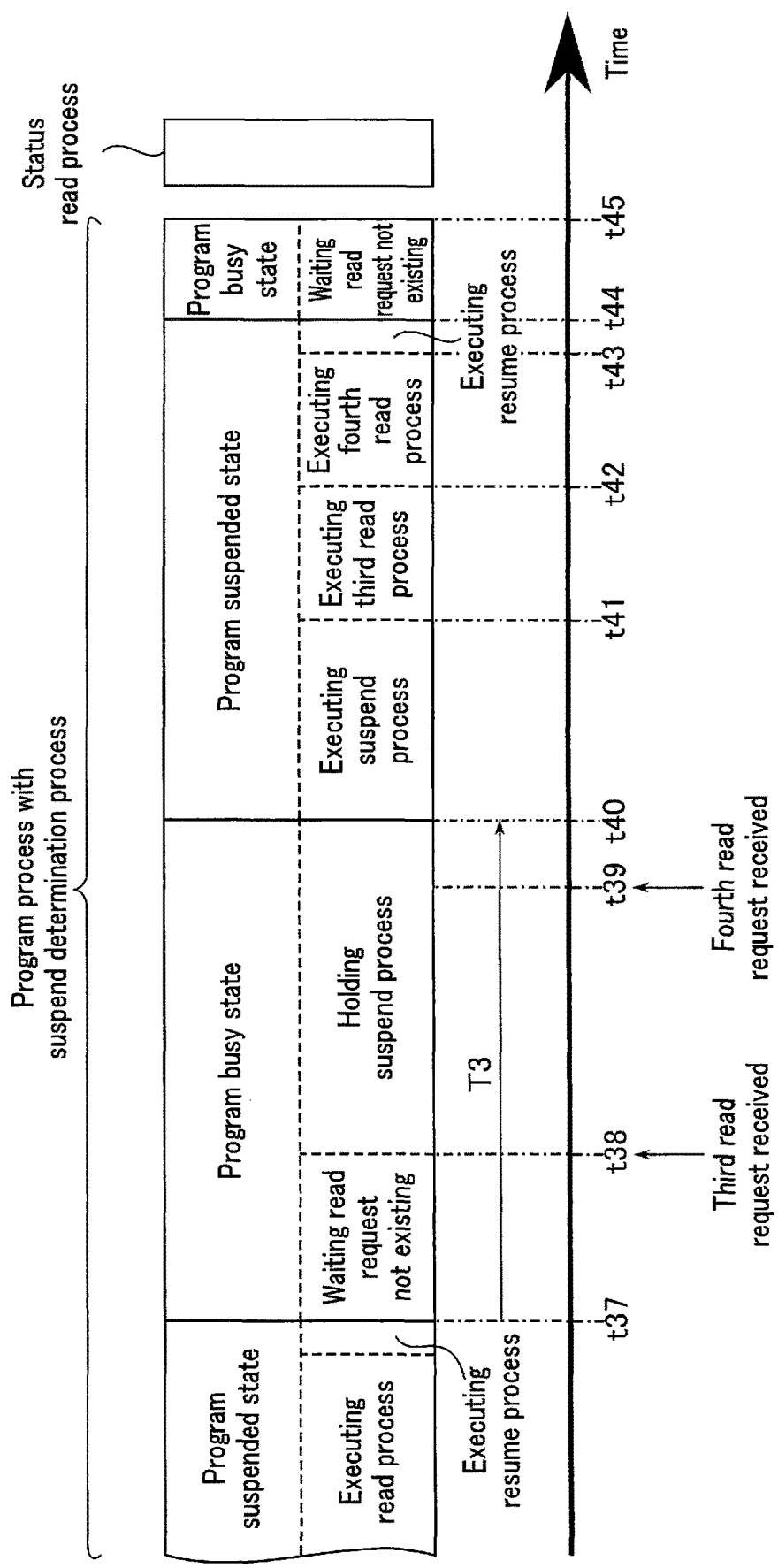
FIG. 15 is a time chart showing an example of state transition in a program process including a second suspend determination process in the memory system according to the second embodiment.

2.5 State Transition in Program Process Including Second Suspend Determination Process FIG. 15 is a time chart showing an example of state transition in a program process including a second suspend determination process of the memory system according to the second embodiment. In the example of FIG. 15, an example of processes at time t37 and the subsequent times is shown as a sequel to the example of FIG. 13. In the example of FIG. 15, a case is shown where, in a second measurement, the measurement value of the timer 26 reaches the threshold value T3 after a read request is stored in the command queue 25 so that a suspend process is executed.

As shown in FIG. 15, at time t38, the memory controller 20 receives a third read request (third read request) in the program process. As a result, the number of read requests in the command queue 25 becomes 1. However, since the measurement value of the timer 26 is less than the threshold value T3, interruption of the program process is postponed. Thus, the memory system 3 enters the holding suspend process state STS22.

At time t39, the memory controller 20 receives a fourth read request (fourth read request) in the program process. As a result, the number of read requests in the command queue 25 becomes 2. However, since the measurement value of the timer 26 is less than the threshold value T3, the memory system 3 stays in the holding suspend process state STS22.

At time t40, the measurement value of the timer 26 reaches the threshold value T3. The memory controller 20 stops the timer 26. After that, the memory controller 20 causes the nonvolatile memory 10 to execute a suspend process. Along with this, the memory system 3 enters the executing suspend process state STS31.

At time t41, the suspend process finishes. Then, the memory controller 20 causes the nonvolatile memory 10 to execute a read process (third read process) based on the third read request. Along with this, the memory system 3 enters the executing read process state STS32.

At time t42, the third read process finishes. Then, the memory controller 20 causes the nonvolatile memory 10 to execute a read process (fourth read process) based on the fourth read request. The memory system 3 stays in the executing read process state STS32.

At time t43, the fourth read process finishes. The memory controller 20 causes the nonvolatile memory 10 to execute a resume process after confirming that the number of read requests in the command queue 25 is 0. Along with this, the memory system 3 enters the executing resume process state STS33.

At time t44, the resume process finishes. Then, the memory controller 20 causes the nonvolatile memory 10 to resume the program process. In addition, the memory controller 20 starts the timer 26. Along with this, the memory system 3 enters the waiting read request not existing state STS21.

At time t45, the program process finishes. After that, the memory controller 20 confirms by a status read process that data has been written in the nonvolatile memory 10 without any problems. As a result, the state of the memory system 3 returns to the waiting read request not existing state STS11.

2.6 Advantageous Effect of Second Embodiment

According to the second embodiment, the memory controller 20 holds a suspend process until an elapsed time from a start of a program process becomes the threshold time T2 or more. As a result, a suspend prohibition period starting immediately after the beginning of the program process can be established. In addition, the memory controller 20 holds the suspend process until an elapsed time from an end of the previous resume process becomes the threshold value T3 or more. This makes it possible to set a suspend prohibition period of at least the threshold value T3 between two suspend processes. Thus, it is possible to suppress the suspend process from being repeated frequently as compared to a case where a suspend process is executed each time a read request is received. Accordingly, it is possible to suppress a decrease in write throughput as compared to a case where a suspend process is executed each time a read request is received.

In addition, according to the second embodiment, when there is a read request in the command queue 25 and the measurement value of the timer is the threshold value T2 or more, the memory controller 20 executes a suspend process. As a result, the memory controller 20 can execute a read process without waiting for completion of a program process when a suspend condition is satisfied. Thus, it is possible to shorten a time required from read request reception to read process completion as compared to a case of executing a read process after a program process is completed. Accordingly, it is possible to suppress an increase in read latency as compared to a case of executing a read process after a program process is completed.

As such, according to the second embodiment, it is possible to realize both an improved write throughput as compared to a case of interrupting a program process each time a read request is received, and an improved read latency as compared to a case of executing a read process after a program process is completed. Therefore, similarly to the first embodiment, it is possible to provide means for adjusting a trade-off between the write throughput and the read latency.

In the second embodiment, the case has been described where both the first suspend determination process and the second suspend determination process are executed, but the embodiment is not limited thereto. For example, the memory controller 20 may execute the first suspend determination process and may not execute the second suspend determination process. The memory controller 20 may execute the second suspend determination process and may not execute the first suspend determination process.

2.7 Modification of Second Embodiment

In the above-described second embodiment, the case has been described where the memory controller 20 establishes a suspend prohibition period, but the embodiment is not limited thereto. For example, even in the suspend prohibition period, the memory controller 20 may execute a suspend process if the number of read requests in the command queue 25 becomes a threshold value or more. In the following, descriptions of configurations and operations similar to those in the second embodiment will be omitted, and configurations and operations different from those in the second embodiment will be mainly described.

2.7.1 Suspend Determination Process

FIG. 16 is a flowchart showing an example of a series of processing including the second suspend determination process in the memory system according to the modification of the second embodiment. In the example of FIG. 16, a case is shown where processes of S40-1 and S40-2 are executed instead of the process of S40 in the series of processing of the second embodiment described with reference to FIG. 14.

If there are read requests of the threshold value N or more in the command queue 25 (S40-1; true), the memory controller 20 stops the timer 26 (S41).

If the number of read requests in the command queue 25 is smaller than the threshold value N (S40-1; false), the memory controller 20 determines whether or not there is a read request in the command queue 25 and whether or not the measurement value of the timer 26 is the threshold value T3 or more (S40-2).

If there is a read request in the command queue 25 and the measurement value of the timer 26 is the threshold value T3 or more (S40-2; true), the memory controller 20 stops the timer 26 (S41).

If there is no read request in the command queue 25 or the measurement value of the timer 26 is less than the threshold value T3 (S40-2; false), the series of processing including the second suspend determination process finishes while the timer 26 stays in the running state (End).

Since the processes of S42 and the subsequent steps are equivalent to those of S42 and the subsequent steps in FIG. 14, descriptions thereof are omitted.

Figure 17:
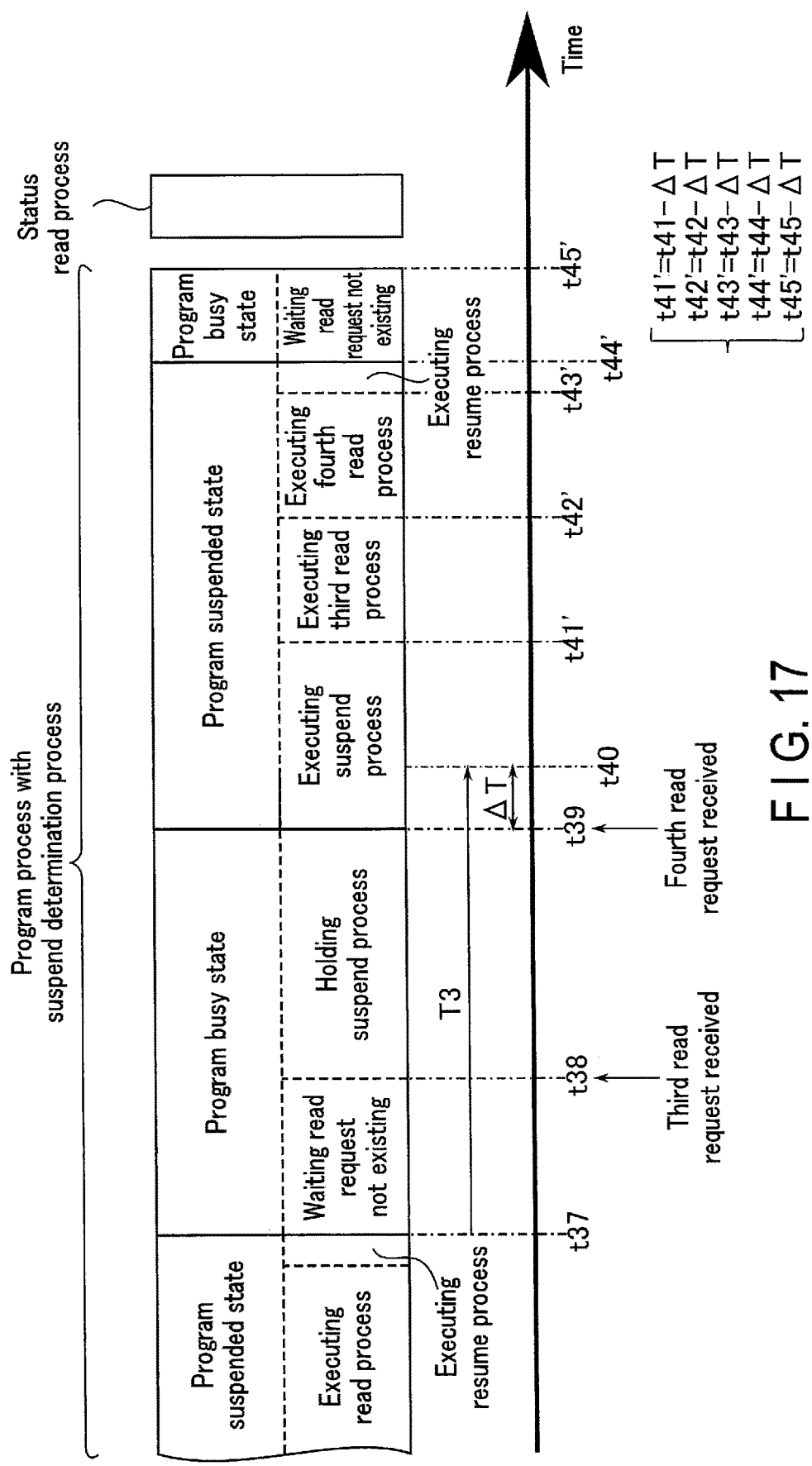
FIG. 17 is a time chart showing an example of state transition in a program process including a second suspend determination process of the memory system according to the modification of the second embodiment.

2.7.2 State Transition in Program Process Including Second Suspend Determination Process FIG. 17 is a time chart showing an example of state transition in a program process including a second suspend determination process of the memory system according to the modification of the second embodiment. In the example of FIG. 17, similarly to the example of FIG. 15, an example of processes at time t37 and the subsequent times is shown as a sequel to the example of FIG. 13. In the example of FIG. 17, a case is shown where the number of read requests in the command queue 25 reaches the threshold value N (=2) in the second measurement so that a suspend process is executed before the measurement value of the timer 26 reaches the threshold value T3.

As shown in FIG. 17, at time t38, the memory controller 20 receives the third read request. As a result, the number of read requests in the command queue 25 becomes 1, which is less than the threshold value N. Thus, the memory system 3 enters the holding suspend process state STS22.

At time t39, the memory controller 20 receives the fourth read request. As a result, the number of read requests in the command queue 25 becomes 2. At this time, the measurement value of the timer 26 is less than the threshold value T3, but the number of read requests is the threshold value N or more. Thus, the memory controller 20 stops the timer 26. After that, the memory controller 20 causes the nonvolatile memory 10 to execute a suspend process. Along with this, the memory system 3 enters the executing suspend process state STS31.

At time t40, the measurement value of the timer 26 reaches the threshold value T3. Processes at time t41' to t45' are equivalent to those at time t41 to t45 in FIG. 15, which are executed earlier by a period $\Delta T$ ($=t40-t39$). After that, the memory controller 20 confirms by a status read process that data has been written in the nonvolatile memory 10 without any problems. As a result, the state of the memory system 3 returns to the waiting read request not existing state STS11.

2.7.3 Advantageous Effect of Modification of Second Embodiment

According to the modification of the second embodiment, the memory controller 20 executes a suspend process at a time when the number of read requests in the command queue 25 becomes the threshold value N or more regardless of whether or not the measurement value of the timer 26 is the threshold value T3 or more. Thereby, it is possible to suppress an increase in read latency while adjusting a trade-off between the write throughput and the read latency.

In the modification of the second embodiment, a case where a determination process related to the number of read requests is added to the second suspend determination process in the second embodiment is described, but the embodiment is not limited thereto. For example, a determination process related to the number of read requests may be added to the first suspend determination process in the second embodiment. That is, the memory controller 20 may cause the nonvolatile memory 10 to execute a suspend process if there are N or more read requests in the command queue 25 regardless of whether or not the suspend prohibition period that starts at the start of the program process has elapsed. As such, even in a case where the timer 26 measures an elapsed time from the program process start, an advantageous effect equivalent to that of the modification of the second embodiment can be exhibited.

3. THIRD EMBODIMENT

Next, a memory system according to a third embodiment will be described. The third embodiment is different from the first and second embodiments in that an execution timing of a suspend process is controlled so that the nonvolatile memory 10 actively executes a read process executed in parallel in a period during which a program process is interrupted. In the following, descriptions of configurations and operations equivalent to those in the first embodiment will be omitted, and configurations and operations different from those in the first embodiment will be mainly described.

3.1 Configuration of Nonvolatile Memory

Figure 18:
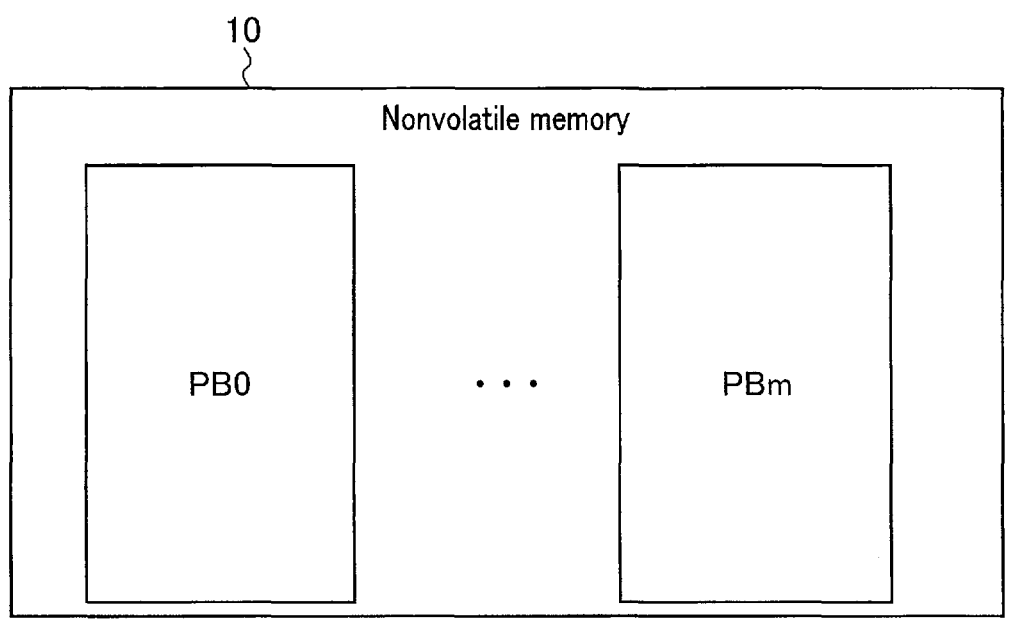
FIG. 18 is a block diagram showing an example of a configuration of a nonvolatile memory according to a third embodiment.

FIG. 18 is a block diagram showing an example of a configuration of a nonvolatile memory according to the third embodiment. As shown in FIG. 18, the nonvolatile memory 10 includes a plurality of planes PB (PB0, . . . , PBm) (m is an integer of 1 or more). Each of the plurality of planes PB includes a plurality of memory cell transistors. The plurality of planes PB are operable in parallel to one another.

3.2 Suspend Determination Process

Figure 19:
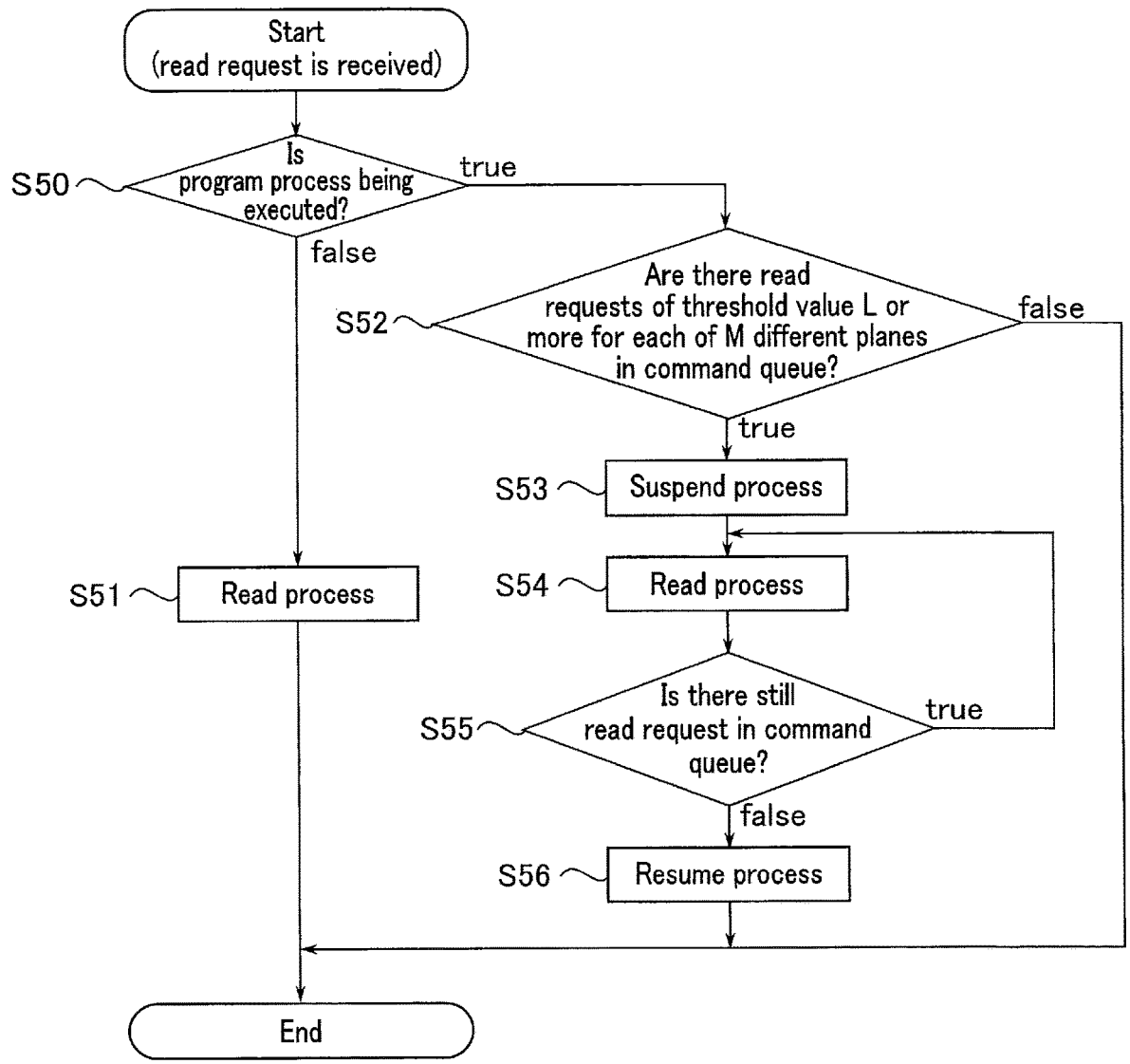
FIG. 19 is a flowchart showing a series of processing including a suspend determination process in a memory system according to the third embodiment.

FIG. 19 is a flowchart showing an example of a series of processing including a suspend determination process in the memory system according to the third embodiment. Similarly to the example of FIG. 4, in the example of FIG. 19, a start condition for the suspend determination process is that the memory controller 20 receives a read request from the host device 2.

Since processes of S50 and S51 are equivalent to those of S10 and S11 in FIG. 4, descriptions thereof are omitted.

If the program process is being executed (S50; true), the memory controller 20 determines whether or not a suspend condition is satisfied (S52). The suspend condition in the example of FIG. 19 is that there are read requests of a threshold value L or more for each of M different planes PB in the command queue 25. The number M is an integer of 2 or more, and (m+1) or less ($2 \leq M \leq m+1$). The number M may be equal to the number of planes (m+1) included in the nonvolatile memory 10, and may be different from the number of planes (m+1). The threshold value L is an integer of 1 or more ($L \geq 1$).

If the number of read requests for at least one of M planes PB in the command queue 25 is smaller than the threshold value L (S52; false), interruption of the program process is postponed. That is, the memory controller 20 does not interrupt the program process. Thereby, the series of processing including the suspend determination process finishes (End).

If there are read requests of the threshold value L or more for each of M different planes PB in the command queue 25 (S52; true), the memory controller 20 causes the nonvolatile memory 10 to execute a suspend process (S53).

After the program process is interrupted by the suspend process, the memory controller 20 causes the nonvolatile memory 10 to execute a read process based on the read request (S54). The nonvolatile memory 10 executes read processes for M different planes in parallel.

Each time the process of S54 finishes, the memory controller 20 determines whether or not there is still a read request in the command queue 25 (S55).

If there is still a read request in the command queue 25 (S55; true), the memory controller 20 causes the nonvolatile memory 10 to execute a read process based on the read request (S54). If there are read requests for at least two or more planes PB in the command queue 25, the memory controller 20 may cause the nonvolatile memory 10 to execute read processes for the two or more planes PB in parallel. If there is only a read request for one plane PB in the command queue 25, the nonvolatile memory 10 may be caused to execute a read process for the one plane PB. As a result, the processes of S54 and S55 are executed repeatedly until read processes corresponding to all the read requests in the command queue 25 are executed.

If there is no read request in the command queue 25 (S55; false), the memory controller 20 causes the nonvolatile memory 10 to execute a resume process (S56).

When the process of S56 finishes, the series of processing including the suspend determination process finishes (End).

3.3 State Transition in Program Process Including Suspend Determination Process

Figure 20:
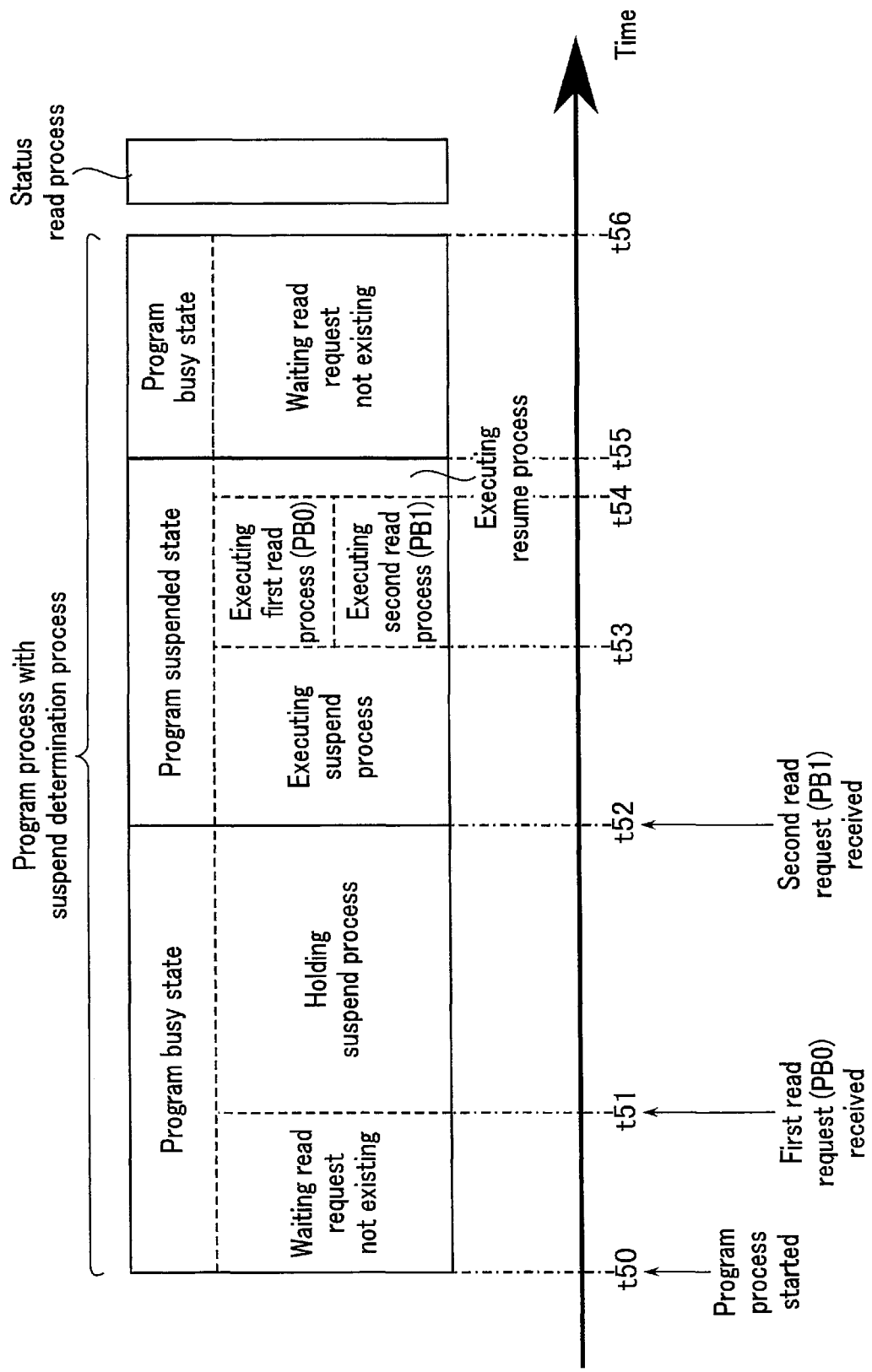
FIG. 20 is a time chart showing an example of state transition in a program process including a suspend determination process of the memory system according to the third embodiment.

FIG. 20 is a time chart showing an example of state transition in a program process including a suspend determination process of the memory system according to the third embodiment. In the example of FIG. 20, a case where the threshold value L is 1 and the number M is 2 is shown. In the example of FIG. 20, it is assumed that the memory system 3 is in the waiting read request not existing state STS11 before time t50.

As shown in FIG. 20, at time t50, the memory controller 20 causes the nonvolatile memory 10 to execute program processes for the planes PB0 and PB1 thereof in parallel. Along with this, the memory system 3 enters the waiting read request not existing state STS21.

At time t51, the memory controller 20 receives a first read request (PB0) to request read data from the plane PB0. As a result, the number of read requests in the command queue 25 becomes the threshold value L (=1) for the plane PB0. However, the number of read requests for the plane PB1 in the command queue 25 is 0, which is less than the threshold value L (=1). Thus, the memory system 3 enters the holding suspend process state STS22.

At time t52, the memory controller 20 receives a second read request (PB1) to request read data from the plane PB1. Thereby, the number of read requests in the command queue 25 is the threshold value L (=1) for each of the planes PB0 and PB1. Thus, the memory controller 20 causes the nonvolatile memory 10 to execute a suspend process. Along with this, the memory system 3 enters the executing suspend process state STS31.

At time t53, the suspend process finishes. Then, the memory controller 20 causes the nonvolatile memory 10 to execute a first read process (PB0) for the plane PB0. In addition, the memory controller 20 causes the nonvolatile memory 10 to execute a second read process (PB1) for the plane PB1 in parallel to the first read process (PB0). Along with this, the memory system 3 enters the executing read process state STS32.

At time t54, the first read process (PB0) and the second read process (PB1) finish. The memory controller 20 causes the nonvolatile memory 10 to execute a resume process after confirming that the number of read requests in the command queue 25 is 0. Along with this, the memory system 3 enters the executing resume process state STS33.

At time t55, the resume process finishes. Then, the memory controller 20 resumes the parallel program processes for the planes PB0 and PB1 of the nonvolatile memory 10. Along with this, the memory system 3 enters the waiting read request not existing state STS21.

At time t56, the program process finishes. After that, the memory controller 20 confirms by a status read process that data has been written in the nonvolatile memory 10 without any problems. As a result, the state of the memory system 3 returns to the waiting read request not existing state STS11.

3.4 Advantageous Effect of Third Embodiment

According to the third embodiment, the memory controller 20 holds a suspend process until the number of read requests for each of M mutually different planes PB in the command queue 25 becomes the threshold value L or more. Thereby, the memory controller 20 can execute read processes of the threshold value L or more for each of the M planes PB collectively during one interruption of a program process. Thus, it is possible to reduce the number of times suspend processes and resume processes are performed as compared to a case of interrupting a program process each time a read request for one plane PB is received. Accordingly, it is possible to reduce a cumulative overhead as well as suppress a decrease in write throughput as compared to a case of interrupting a program process each time a read request for one plane PB is received.

In addition, according to the third embodiment, when the number of read requests for each of M mutually different planes PB in the command queue 25 is the threshold value L or more, the memory controller 20 executes a suspend process. As a result, the memory controller 20 can execute a read process without waiting for completion of a program process when a suspend condition is satisfied. Thus, it is possible to shorten a time required from read request reception to read process completion as compared to a case of executing a read process after a program process is completed. Accordingly, it is possible to suppress an increase in read latency as compared to a case of executing a read process after a program process is completed.

As such, according to the third embodiment, it is possible to realize both an improved write throughput as compared to a case of interrupting a program process each time a read request is received, and an improved read latency as compared to a case of executing a read process after a program process is completed. Accordingly, it is possible to provide a means for adjusting a trade-off between the write throughput and the read latency.

When a program process is interrupted each time a read request for one plane PB is received, both a plane PB for which a read process is executed and another plane PB for which a read process is not executed exist in the M planes PB. The plane PB for which a read process is not executed is in a standby state until read processes for other planes PB finish. This causes a decrease in operation rate of the nonvolatile memory 10, and is not preferable. According to the third embodiment, parallel read processes by M planes PB are executed at least L times during one interruption of a program process. Thus, it is possible to suppress a decrease in operation rate of the nonvolatile memory 10.

3.5 First Modification of Third Embodiment

In the above-described third embodiment, the case has been described where the memory controller 20 holds a suspend process until read requests of the threshold value L or more for each of the M planes PB are accumulated in the command queue 25, but the embodiment is not limited thereto. For example, the memory controller 20 may control a period to hold a suspend process on the basis of an elapsed time from reception of the first read request as in the modification of the first embodiment. That is, in the first modification of the third embodiment, the timer 26 measures an elapsed time after the memory system 3 enters the holding suspend process state STS22 by receiving a read request. In the following, descriptions of configurations and operations similar to those in the modification of the first embodiment and the third embodiment will be omitted, and configurations and operations different from those in the modification of the first embodiment and the third embodiment will be mainly described.

3.5.1 Suspend Determination Process

FIG. 21 is a flowchart showing an example of a series of processing including a suspend determination process in the memory system according to the first modification of the third embodiment. In the example of FIG. 21, similarly to the example of FIG. 9, a start condition for the suspend determination process is that the memory controller 20 receives a read request from the host device 2, or the measurement value of the timer 26 becomes the threshold value T1 or more.

Since processes of S60 and S61 are equivalent to those of S20 and S21 in FIG. 9, descriptions thereof are omitted.

If the program process is being executed (S60; true), the memory controller 20 determines whether or not a suspend condition is satisfied (S62). The suspend condition in the example of FIG. 21 is that there are read requests of the threshold value L or more for each of M different planes PB in the command queue 25, or the measurement value of the timer 26 is the threshold value T1 or more.

If the number of read requests for at least one plane PB in the command queue 25 is smaller than the threshold value L, and the measurement value is less than the threshold value T1 (S62; false), interruption of the program process is postponed. That is, the memory controller 20 does not interrupt the program process. Then, the memory controller 20 determines whether or not there is one read request in the command queue 25 and the timer 26 is stopped (S63).

If there is one read request in the command queue 25 and the timer 26 is stopped (S63; true), the memory controller 20 starts the timer 26 (S64).

When the process of S64 finishes, the series of processing including the suspend determination process finishes while the timer 26 stays in the running state (End).

If there are read requests of the threshold value L or more for each of the M planes PB, or the measurement value of the timer 26 is the threshold value T1 or more (S62; true), the memory controller 20 stops the timer 26 (S65).

After stopping the timer 26, the memory controller 20 causes the nonvolatile memory 10 to execute a suspend process (S66).

After the program process is interrupted by the suspend process, the memory controller 20 causes the nonvolatile memory 10 to execute a read process based on the read request (S67). If there are read requests for at least two or more planes PB in the command queue 25, the memory controller 20 may cause the nonvolatile memory 10 to execute read processes for the two or more planes PB in parallel. If there is only a read request for one plane PB in the command queue 25, the memory controller 20 may cause the nonvolatile memory 10 to execute a read process for one plane PB.

Each time the process of S67 finishes, the memory controller 20 determines whether or not there is still a read request in the command queue 25 (S68).

If there is still a read request in the command queue 25 (S68; true), the memory controller 20 causes the nonvolatile memory 10 to execute a read process based on the read request (S67). If there are read requests for at least two or more planes PB in the command queue 25, the memory controller 20 may cause the nonvolatile memory 10 to execute read processes for the two or more planes PB in parallel. If there is only a read request for one plane PB in the command queue 25, the nonvolatile memory 10 may be caused to execute a read process for the one plane PB. As a result, the processes of S67 and S68 are executed repeatedly until read processes corresponding to all the read requests in the command queue 25 are executed.

If there is no read request in the command queue 25 (S68; false), the memory controller 20 causes the nonvolatile memory 10 to execute a resume process (S69). When the process of S69 finishes, the series of processing including the suspend determination process finishes while the timer 26 stays in the stopped state (End).

Figure 22:
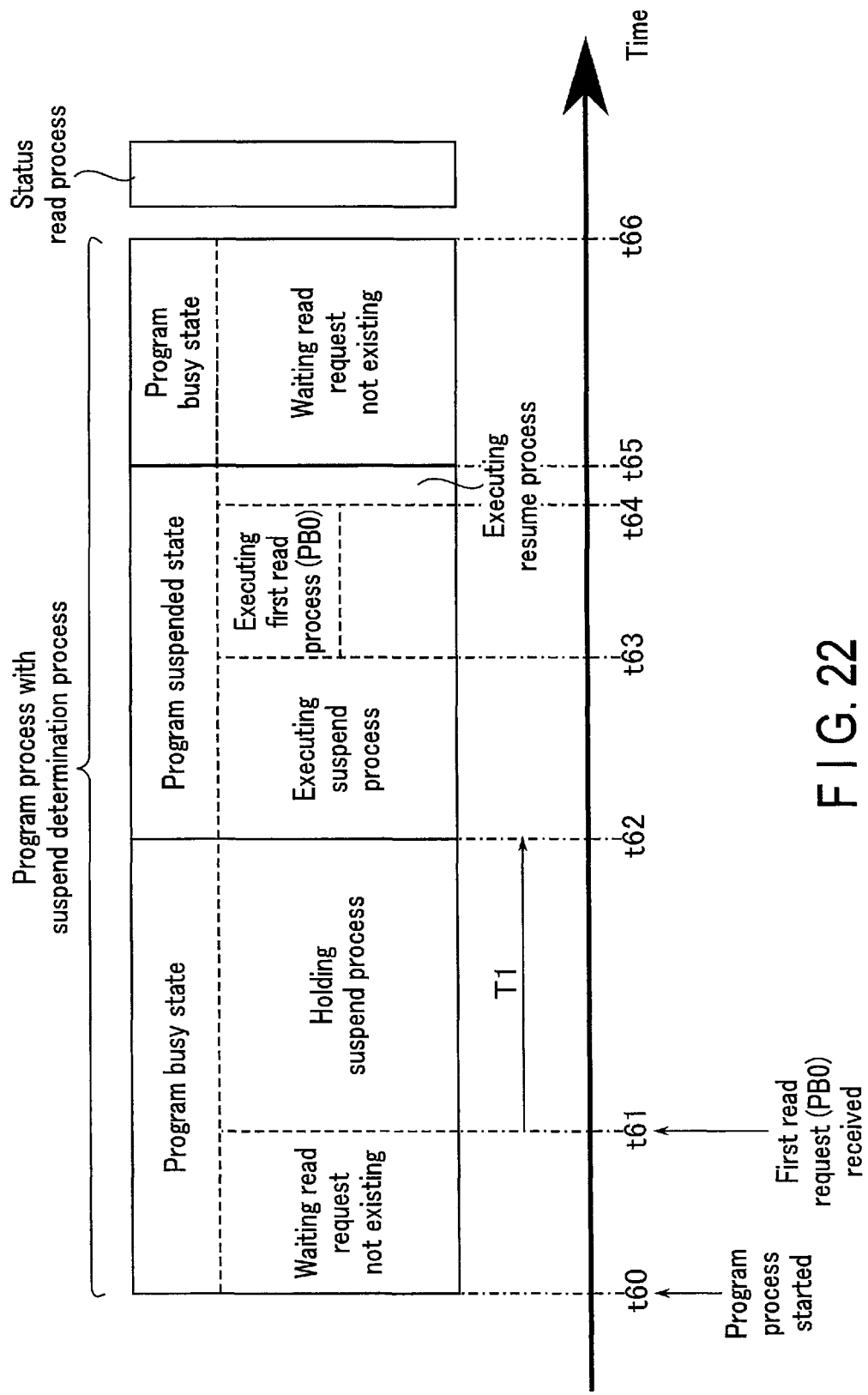
FIG. 22 is a time chart showing an example of state transition in a program process including a suspend determination process of the memory system according to the first modification of the third embodiment.

3.5.2 State Transition in Program Process Including Suspend Determination Process FIG. 22 is a time chart showing an example of state transition in a program process including a suspend determination process of the memory system according to the first modification of the third embodiment. In the example of FIG. 22, a case is shown where the measurement value of the timer 26 reaches the threshold value T1 before the number of read requests for each of M planes PB reaches the threshold value L so that a suspend process is executed. In the example of FIG. 22, a case where the threshold value L is 1 and the number M is 2 is shown. In the example of FIG. 22, it is assumed that the memory system 3 is in the waiting read request not existing state STS11 before time t60.

As shown in FIG. 22, at time t60, the memory controller 20 causes the nonvolatile memory 10 to execute program processes for the planes PB0 and PB1 thereof in parallel. Along with this, the memory system 3 enters the waiting read request not existing state STS21.

At time t61, the memory controller 20 receives a first read request (PB0). Thereby, the number of read requests in the command queue 25 is L (=1) for the plane PB0. However, the number of read requests for the plane PB1 in the command queue 25 is 0, which is less than the threshold value L (=1). Thus, the memory system 3 enters the holding suspend process state STS22. The memory controller 20 starts the timer 26 in response to reception of the first read request (PB0).

At time t62, the measurement value of the timer 26 reaches the threshold value T1. The memory controller 20 stops the timer 26. After that, the memory controller 20 causes the nonvolatile memory 10 to execute a suspend process. Along with this, the memory system 3 enters the executing suspend process state STS31.

At time t63, the suspend process finishes without receiving a read request for the plane PB1. Then, the memory controller 20 causes the nonvolatile memory 10 to execute a first read process (PB0). Along with this, the memory system 3 enters the executing read process state STS32.

At time t64, the first read process (PB0) finishes. The memory controller 20 causes the nonvolatile memory 10 to execute a resume process after confirming that the number of read requests in the command queue 25 is 0. Along with this, the memory system 3 enters the executing resume process state STS33.

At time t65, the resume process finishes. Then, the memory controller 20 resumes the parallel program processes for the planes PB0 and PB1 of the nonvolatile memory 10. Along with this, the memory system 3 enters the waiting read request not existing state STS21.

At time t66, the program process finishes. After that, the memory controller 20 confirms by a status read process that data has been written in the nonvolatile memory 10 without any problems. As a result, the state of the memory system 3 returns to the waiting read request not existing state STS11.

3.5.3 Advantageous Effect of First Modification of Third Embodiment

According to the first modification of the third embodiment, the memory controller 20 starts the timer 26 in response to a read request being stored in the command queue 25 first time in the waiting read request not existing state STS11. When the measurement value of the timer 26 reaches the threshold value T1, the memory controller 20 executes a suspend process regardless of whether or not the number of read requests for each of M planes PB in the command queue 25 is the threshold value L or more. Thereby, the memory controller 20 which receives a read request can execute a suspend process within a period of the threshold value T1. Thus, it is possible to exhibit the advantageous effect described in the third embodiment as well as suppress an increase in read latency in a case of not receiving the second and subsequent read requests.

3.6 Second Modification of Third Embodiment

The memory controller 20 may control a period to hold a suspend process on the basis of the total number of read requests to be performed regardless of whether or not a read request for each of M planes PB is received. In the following, descriptions of configurations and operations equivalent to those in the third embodiment will be omitted, and configurations and operations different from those in the third embodiment will be mainly described.

3.6.1 Suspend Determination Process

Figure 23:
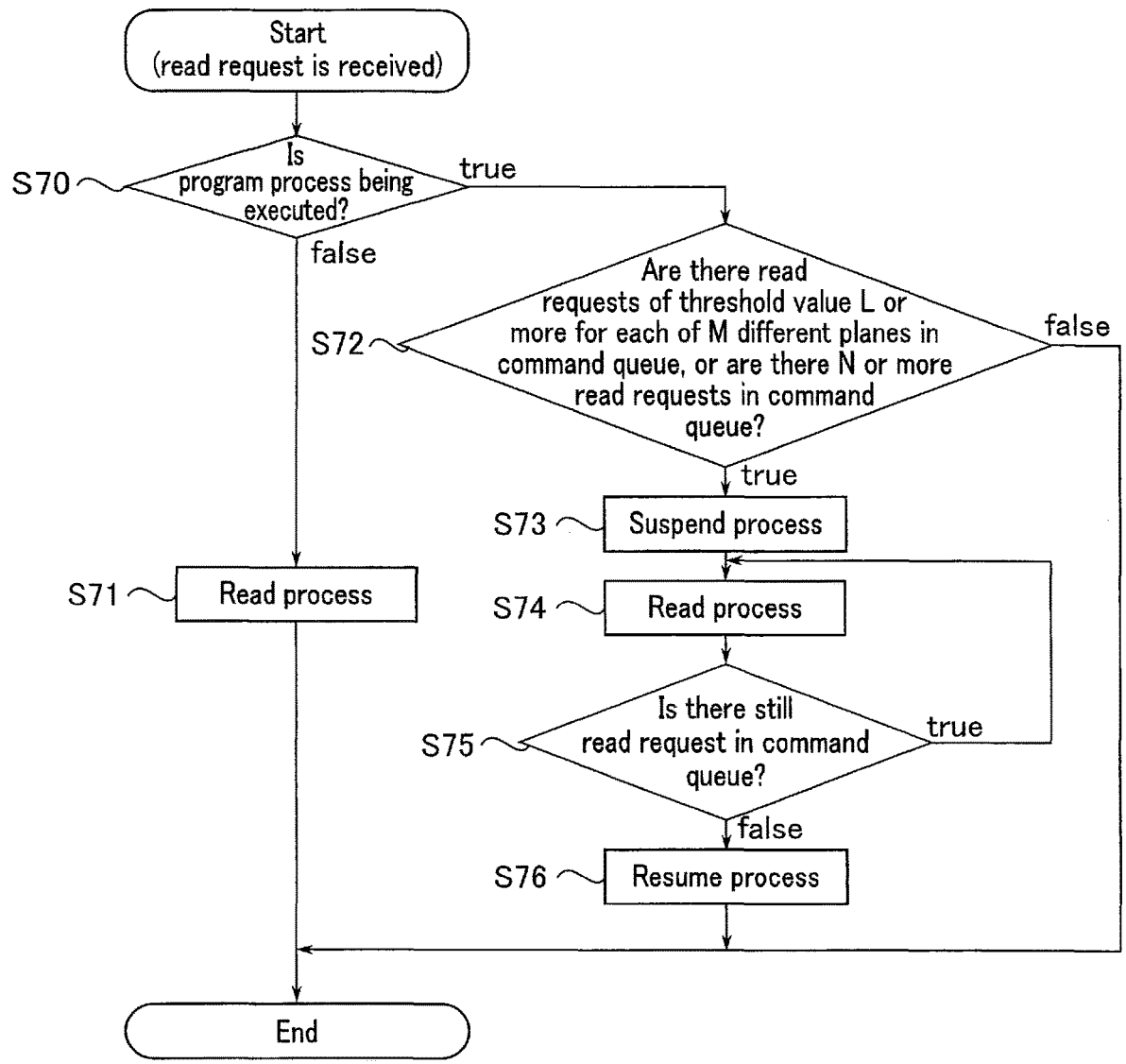
FIG. 23 is a flowchart showing a series of processing including a suspend determination process in a memory system according to a second modification of the third embodiment.

FIG. 23 is a flowchart showing an example of a series of processing including a suspend determination process in a memory system according to a second modification of the third embodiment. Similarly to the example of FIG. 19, in the example of FIG. 23, a start condition for the suspend determination process is that the memory controller 20 receive a read request from the host device 2.

Since processes of S70 and S71 are equivalent to those of S50 and S51 in FIG. 19, descriptions thereof are omitted.

If the program process is being executed (S70; true), the memory controller 20 determines whether or not a suspend condition is satisfied (S72). The suspend condition in the example of FIG. 23 is that there are read requests of the threshold value L or more for each of M different planes PB in the command queue 25, or there are read requests of the threshold value N or more in the command queue 25.

Although not particularly shown in FIG. 18, etc., there is a case where the nonvolatile memory 10 has a plurality of chips. In this case, each of the plurality of chips includes a plurality of planes PB0 to PBm. When the nonvolatile memory 10 has a plurality of chips, the memory controller 20 has the command queue 25 for each chip. Then, in the process of S72, the memory controller 20 determines whether or not there are read requests of the threshold value N or more in the command queue 25 corresponding to a chip to be determined.

If the number of read requests for at least one plane PB in the command queue 25 is smaller than the threshold value L, and the number of read requests in the command queue 25 is smaller than the threshold value N (S72; false), interruption of the program process is postponed. That is, the memory controller 20 does not interrupt the program process. Thereby, the series of processing including the suspend determination process finishes (End).

If there are read requests of the threshold value L or more for each of the M planes PB in the command queue 25, or there are read requests of the threshold value N or more in the command queue 25 (S72; true), the memory controller 20 causes the nonvolatile memory 10 to execute a suspend process (S73).

Since processes of S74 to S76 are equivalent to those of S54 to S56 in FIG. 19, descriptions thereof are omitted.

Figure 24:
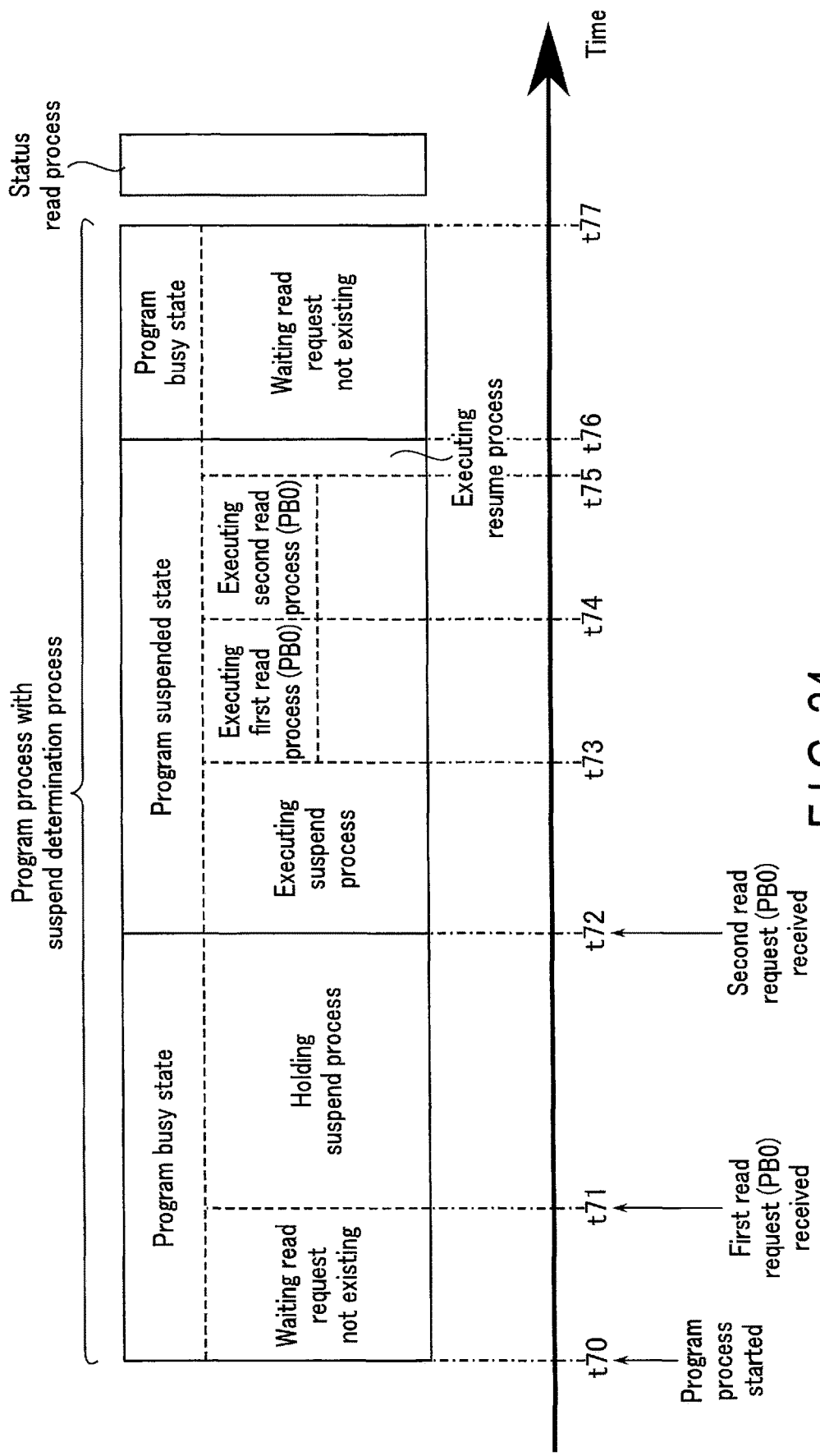
FIG. 24 is a time chart showing an example of state transition in a program process including a suspend determination process of the memory system according to the second modification of the third embodiment.

3.6.2 State Transition in Program Process Including Suspend Determination Process FIG. 24 is a time chart showing an example of state transition in a program process including a suspend determination process of the memory system according to the second modification of the third embodiment. In the example of FIG. 24, a case is shown where the number of read requests in the command queue 25 reaches the threshold value N before the number of read requests for each of M planes PB reaches the threshold value L so that a suspend process is executed. In the example of FIG. 24, a case where the threshold value N is 2 and the threshold value L is 1 is shown. In the example of FIG. 24, it is assumed that the state of the memory system 3 is the waiting read request not existing state STS11 before time t70.

As shown in FIG. 24, at time t70, the memory controller 20 causes the nonvolatile memory 10 to execute program processes for the planes PB0 and PB1 thereof in parallel. Along with this, the memory system 3 enters the waiting read request not existing state STS21.

At time t71, the memory controller 20 receives a first read request (PB0). As a result, the number of read requests in the command queue 25 is L (=1) for the plane PB0. However, the number of read requests for the plane PB1 in the command queue 25 is 0, which is less than the threshold value L (=1). Thus, the memory system 3 enters the holding suspend process state STS22.

At time t72, the memory controller 20 receives a second read request (PB0) to request a read from the plane PB0. As a result, the total number of read requests in the command queue 25 is the threshold value N (=2). Thus, the memory controller 20 causes the nonvolatile memory 10 to execute a suspend process. Along with this, the memory system 3 enters the executing suspend process state STS31.

At time t73, the suspend process finishes. Then, the memory controller 20 causes the nonvolatile memory 10 to execute a first read process (PB0). Along with this, the memory system 3 enters the executing read process state STS32.

At time t74, the first read process (PB0) finishes. Then, the memory controller 20 causes the nonvolatile memory 10 to execute a second read process (PB0) for the plane PB0. The memory system 3 stays in the executing read process state STS32.

At time t75, the second read process (PB0) finishes. The memory controller 20 causes the nonvolatile memory 10 to execute a resume process after confirming that the number of read requests in the command queue 25 is 0. Along with this, the memory system 3 enters the executing resume process state STS33.

At time t76, the resume process finishes. Then, the memory controller 20 resumes parallel program processes for the planes PB0 and PB1 of the nonvolatile memory 10. Along with this, the memory system 3 enters the waiting read request not existing state STS21.

At time t77, the program process finishes. After that, the memory controller 20 confirms by a status read process that data has been written in the nonvolatile memory 10 without any problems. As a result, the state of the memory system 3 returns to the waiting read request not existing state STS11.

3.6.3 Advantageous Effect of Second Modification of Third Embodiment

According to the second modification of the third embodiment, when the number of read requests in the command queue 25 reaches the threshold value N, the memory controller 20 executes a suspend process regardless of whether or not the number of read requests for each of M planes PB is the threshold value L or more. Thereby, even in a case of not equally receiving read requests for the M planes PB, the memory controller 20 can execute a suspend process. Thus, it is possible to exhibit the advantageous effect described in the third embodiment as well as suppress an increase in read latency in a case where there is a large variance in the number of read requests in each plane PB.

4. FOURTH EMBODIMENT

Next, a memory system according to a fourth embodiment will be described. The fourth embodiment is different from the first to third embodiments in that a timing of executing a resume process is adjusted in order to reduce the short and frequent interruptions. That is, in the fourth embodiment, the timer 26 measures an elapsed time from a suspend process start or completion. In the following, descriptions of configurations and operations equivalent to those in the modification of the first embodiment will be omitted, and configurations and operations different from those in the modification of the first embodiment will be mainly described.

4.1 Program Process

FIG. 25 is a flowchart showing an example of a series of processing including a program process in the memory system according to the fourth embodiment.

When a program condition is satisfied (Start), the memory controller 20 causes the nonvolatile memory 10 to execute a program process including a resume determination process (S5). The resume determination process is a process of determining whether or not to execute a resume process on the basis of whether or not a resume condition is satisfied. By adjusting a timing of executing the resume process, the memory controller 20 can adjust a trade-off between the read latency and the write throughput.

When the program process including the resume determination process is completed, the memory controller 20 causes the nonvolatile memory 10 to execute a status read process (S6).

When the memory controller 20 receives a status that the program process is completed from the nonvolatile memory 10 in the process of S6, the series of processing including the program process finishes (End).

4.2 Resume Determination Process

Figure 26:
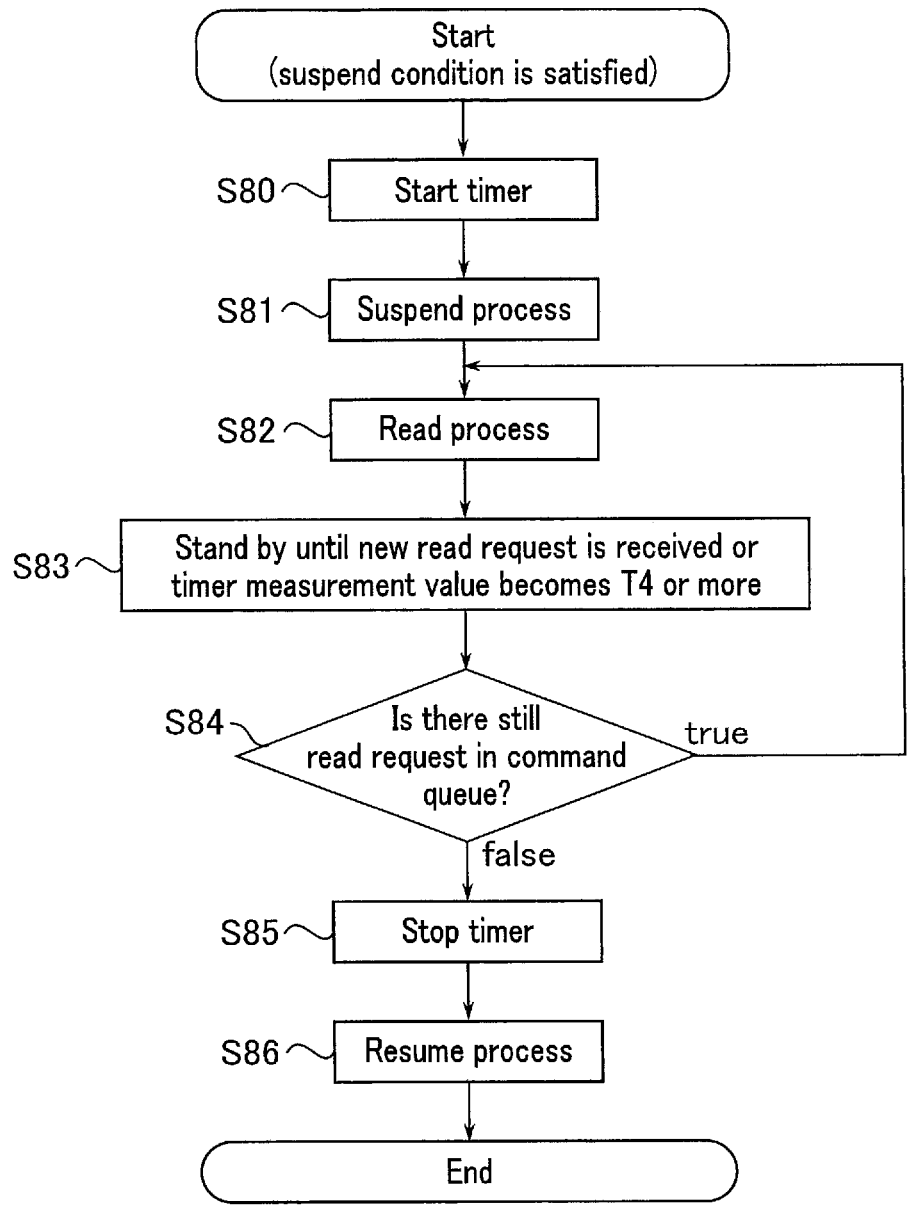
FIG. 26 is a flowchart showing a series of processing including a resume determination process in the memory system according to the fourth embodiment.

FIG. 26 is a flowchart showing an example of a series of processing including a resume determination process in the memory system according to the fourth embodiment. The series of processing including the resume determination process is executed according to a start condition for the resume determination process. In the example of FIG. 26, the start condition for the resume determination process is that a suspend condition is satisfied. As the suspend condition, a discretionary suspend condition including the examples in the descriptions of the first to third embodiments is applicable. In addition, the suspend condition may be unconditional.

If the suspend condition is satisfied (Start), the memory controller 20 starts the timer 26 (S80).

When measurement of the timer 26 starts, the memory controller 20 causes the nonvolatile memory 10 to execute a suspend process (S81). The memory controller 20 may start the timer 26 after the suspend process is completed.

After the program process is interrupted by the suspend process, the memory controller 20 causes the nonvolatile memory 10 to execute a read process based on the read request (S82).

When the read process finishes, the memory controller 20 stands by until a new read request is received from the host device 2 or the measurement value of the timer 26 becomes the threshold value T4 or more (S83). The threshold value T4 is a positive real number.

When the standby process of S83 finishes, the memory controller 20 determines whether or not there is still a read request in the command queue 25 (S84).

If there is a read request in the command queue 25 (S84; true), the memory controller 20 causes the nonvolatile memory 10 to execute a read process based on the read request (S82). As a result, the processes of S82 to S84 are executed repeatedly until read processes corresponding to all the read requests in the command queue 25 are executed.

If there is no read request in the command queue 25 (S84; false), the memory controller 20 determines to resume the program process. Then, the memory controller 20 stops the timer 26 (S85). That is, the resume condition in the example of FIG. 26 is that the measurement value of the timer 26 is the threshold value T4 or more, and there is no read request to be performed.

After stopping the timer 26, the memory controller 20 causes the nonvolatile memory 10 to execute a resume process (S86).

When the process of S86 finishes, the series of processing including the resume determination process finishes (End).

4.3 State Transition of Memory System

Figure 27:
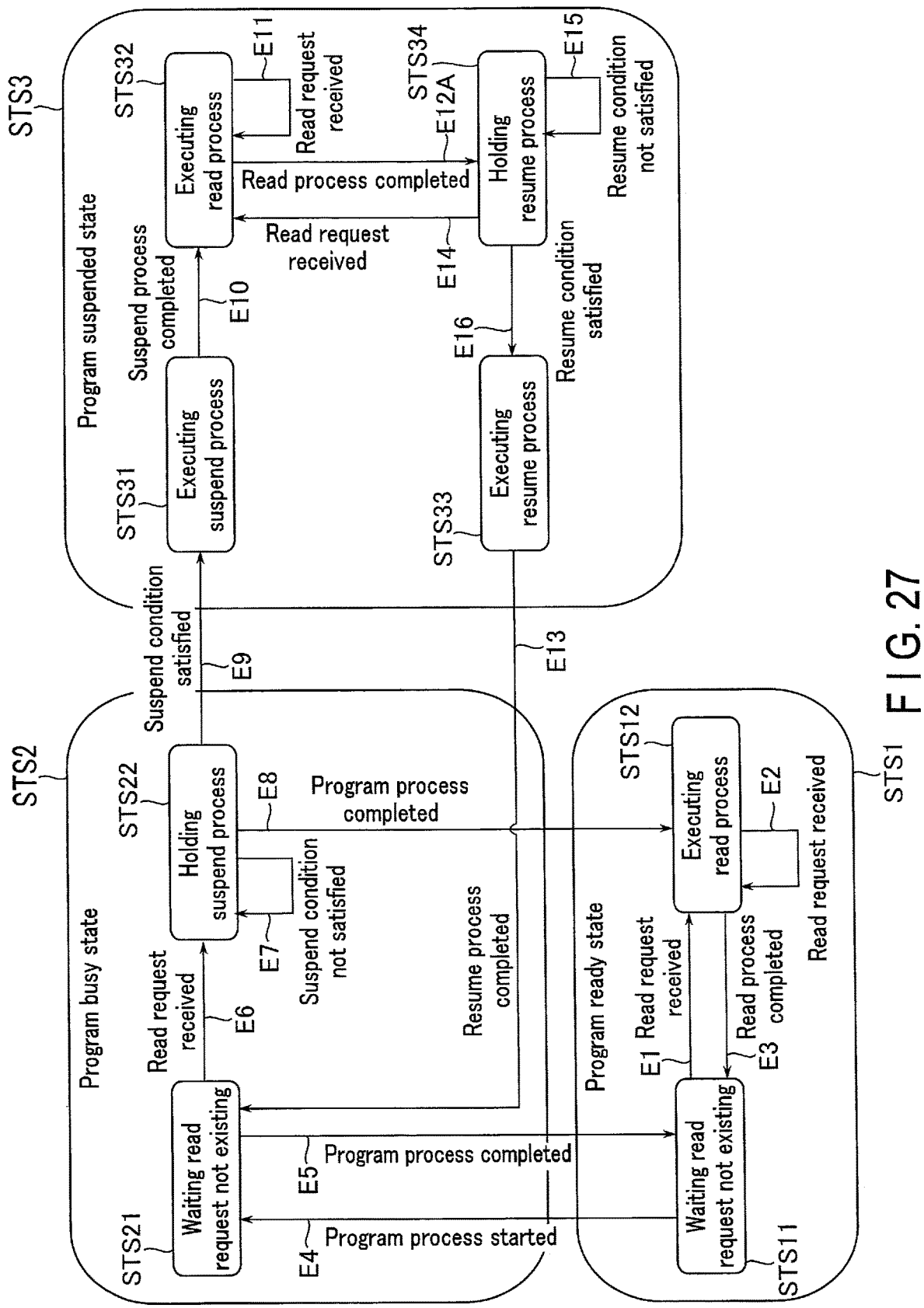
FIG. 27 is a state transition diagram showing relationships among a plurality of states related to a program process of the memory system according to the fourth embodiment.

FIG. 27 is a state transition diagram showing relationships among a plurality of states related to a program process of the memory system according to the fourth embodiment.

First, a plurality of states of the memory system 3 will be described.

As shown in FIG. 27, states of the memory system 3 related to the program process include a program ready state STS1, a program busy state STS2, and a program suspended state STS3. Since the program ready state STS1 and the program busy state STS2 are equivalent to those in the first embodiment described with reference to FIG. 5, descriptions thereof are omitted.

The program suspended state STS3 includes a holding resume process state STS34, in addition to the executing suspend process state STS31, the executing read process state STS32, and the executing resume process state STS33. The holding resume process state STS34 is a state of holding a start of a resume process.

Next, an event to cause each state to transition will be described.

Since events of E1 to E11 and E13 are equivalent to those in the first embodiment described with reference to FIG. 5, descriptions thereof are omitted.

When read processes corresponding to all the read requests in the command queue 25 are completed (E12A), the memory system 3 transitions to the holding resume process state STS34. When a further read request is received from the host device 2 in the holding resume process state STS34 (E14), the memory system 3 transitions to the executing read process state STS32. When a resume condition is not satisfied (E15), the memory system 3 stays in the holding resume process state STS34. When the resume condition is satisfied in the holding resume process state STS34 (E16), the memory system 3 transitions to the executing resume process state STS33.

4.4 State Transition in Program Process Including Resume Determination Process

FIG. 28 is a time chart showing an example of state transition in a program process including a resume determination process of the memory system according to the fourth embodiment. In the example of FIG. 28, a case is shown where, in an interruption period of the program process, after a first read process finishes, a second read request is received before the measurement value of the timer 26 reaches the threshold value T4.

As shown in FIG. 28, at time t80, the memory controller 20 receives a first read request. Along with this, the memory system 3 enters the holding suspend process state STS22 from the waiting read request not existing state STS21.

At time t81, the memory controller 20 starts the timer 26 in response to a suspend condition being satisfied. In addition, the memory controller 20 causes the nonvolatile memory 10 to execute a suspend process. Along with this, the memory system 3 enters the executing suspend process state STS31. The memory controller 20 may start the timer 26 after the suspend process is completed.

At time t82, the suspend process finishes. The memory controller 20 causes the nonvolatile memory 10 to execute a first read process. Along with this, the memory system 3 enters the executing read process state STS32.

At time t83, the first read process finishes. Along with this, the memory system 3 enters the holding resume process state STS34.

At time t84, the memory controller 20 receives a second read request. At this point in time, the measurement value of the timer 26 is less than the threshold value T4. Thus, the memory controller 20 causes the nonvolatile memory 10 to execute a second read process. Along with this, the memory system 3 enters the executing read process state STS32.

At time t85, the second read process finishes. Along with this, the memory system 3 enters the holding resume process state STS34.

At time t86, the measurement value of the timer 26 reaches the threshold value T4. The memory controller 20 stops the timer 26. After that, the memory controller 20 causes the nonvolatile memory 10 to execute a resume process. Along with this, the memory system 3 enters the executing resume process state STS33.

At time t87, the resume process finishes. Then, the memory controller 20 causes the nonvolatile memory 10 to resume the program process. As a result, the state of the memory system 3 returns to the waiting read request not existing state STS21.

4.5 Advantageous Effect of Fourth Embodiment

According to the fourth embodiment, the memory controller 20 holds a resume process until an elapsed time from a suspend process start or completion becomes the threshold value T4 or more regardless of whether or not there is a read request in the command queue 25. This makes it possible to set a resume prohibition period to suppress execution of a resume process immediately after when all the read requests in the command queue 25 have been executed. Thus, in response to a read request received between a time when all the read requests in the command queue 25 have been executed and a time when the measurement value of the timer 26 reaches the threshold value T4 during an interruption period of a program process, the memory controller 20 can execute a read process for the read request during the same interruption period. As such, according to the fourth embodiment, it is possible to suppress an increase in the number of times interruptions occur in one program process as compared to a case of executing a resume process immediately after when all read requests in the command queue 25 have been executed in the command queue 25. Accordingly, it is possible to suppress an increase in read latency mainly of the second or subsequent read process executed during interruption of a program process.

According to the fourth embodiment, by appropriately setting the threshold value T4, it is possible to make the period of the holding resume process state STS34 shorter than a cumulative overhead in a case of executing a resume process immediately after when all the read requests in the command queue 25 have been executed in the command queue 25. This makes it possible to suppress a decrease in write throughput.

A resume determination process may be executed independently from a suspend determination process. Thus, it is possible to combine the fourth embodiment with the first to third embodiments. Therefore, it is possible to exhibit the advantageous effect according to the fourth embodiment as well as the advantageous effects according to the first to third embodiments.

4.6 Modification of Fourth Embodiment

In the above-described fourth embodiment, the case has been described where the memory controller 20 controls a period to hold a resume process on the basis of an elapsed time from a start or completion of a suspend process, but the embodiment is not limited thereto. For example, the memory controller 20 may control a period to hold a resume process on the basis of an elapsed time from an end of a read process in a suspend process. That is, in the modification of the fourth embodiment, the timer 26 measures an elapsed time from an end of a read process executed when the state of the memory system 3 is the program suspended state STS3. In the following, descriptions of configurations and operations equivalent to those in the fourth embodiment will be omitted, and configurations and operations different from those in the fourth embodiment will be mainly described.

4.6.1 Resume Determination Process

Figure 29:
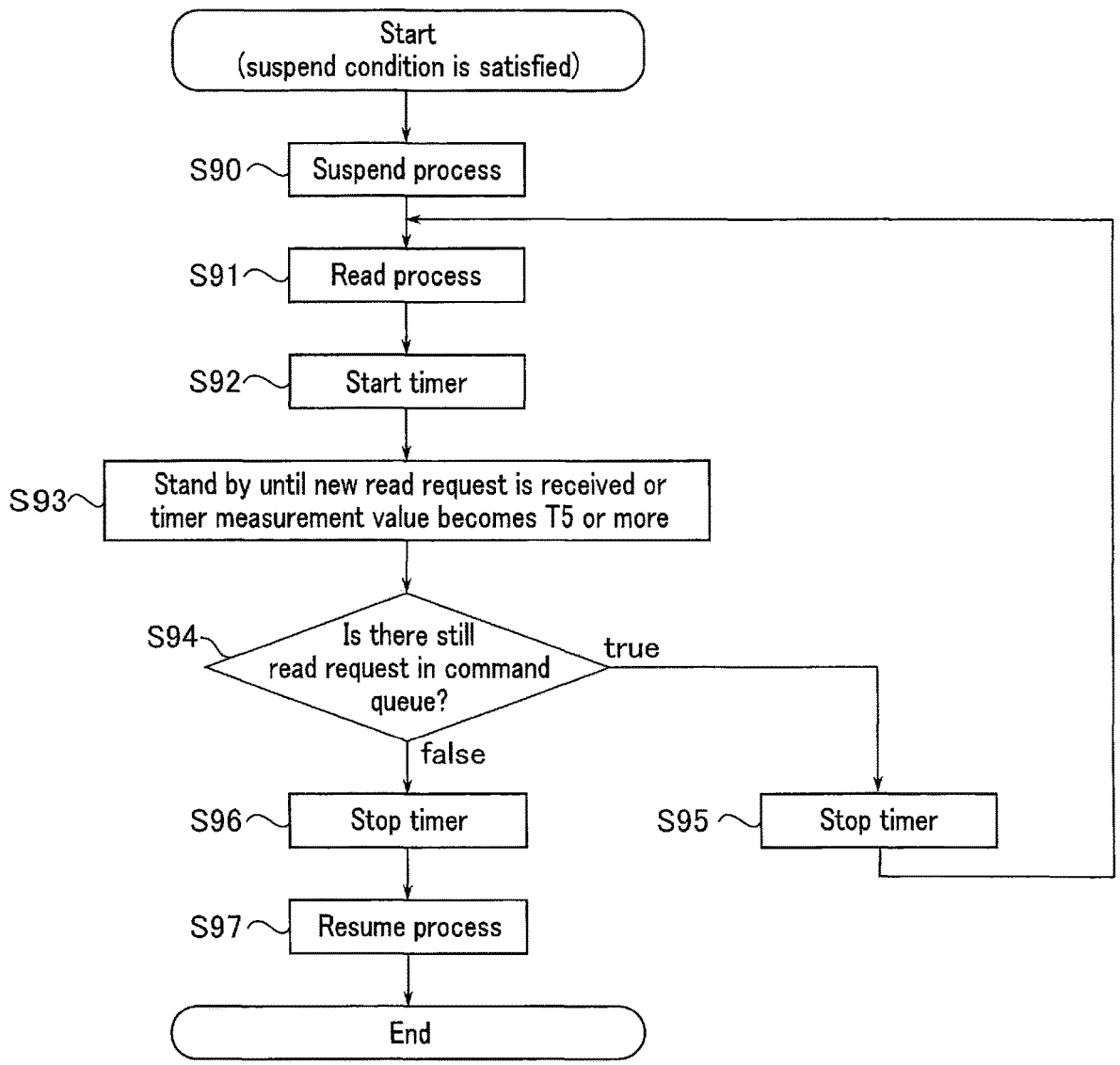
FIG. 29 is a flowchart showing a series of processing including a resume determination process in a memory system according to a modification of the fourth embodiment.

FIG. 29 is a flowchart showing an example of a series of processing including a resume determination process in the memory system according to the modification of the fourth embodiment.

When a suspend condition is satisfied (Start), the memory controller 20 causes the nonvolatile memory 10 to execute a suspend process (S90).

After a program process is interrupted by the suspend process, the memory controller 20 causes the nonvolatile memory 10 to execute a read process based on the read request (S91).

When the read process finishes, the memory controller 20 starts the timer 26 (S92).

When the measurement of the timer 26 starts, the memory controller 20 stands by until a new read request is received from the host device 2 or the measurement value of the timer 26 becomes a threshold value T5 or more (S93). The threshold value T5 is a positive real number.

When the standby process of S93 finishes, the memory controller 20 determines whether or not there is still a read request in the command queue 25 (S94).

If there is still a read request in the command queue 25 (S94; true), the memory controller 20 stops the timer 26 (S95).

After stopping the timer 26, the memory controller 20 causes the nonvolatile memory 10 to execute a read process based on the read request (S91). As a result, the processes of S91 to S95 are executed repeatedly until read processes corresponding to all the read requests in the command queue 25 are executed.

If there is no read request in the command queue 25 (S94; false), the memory controller 20 determines to resume the program process. Then, the memory controller 20 stops the timer 26 (S96). That is, a resume condition in the example of FIG. 29 is that the measurement value of the timer 26 is the threshold value T5 or more, and there is no read request to be performed.

After stopping the timer 26, the memory controller 20 causes the nonvolatile memory 10 to execute a resume process (S97).

When the process of S97 finishes, the series of processing including the resume determination process finishes (End).

Figure 30:
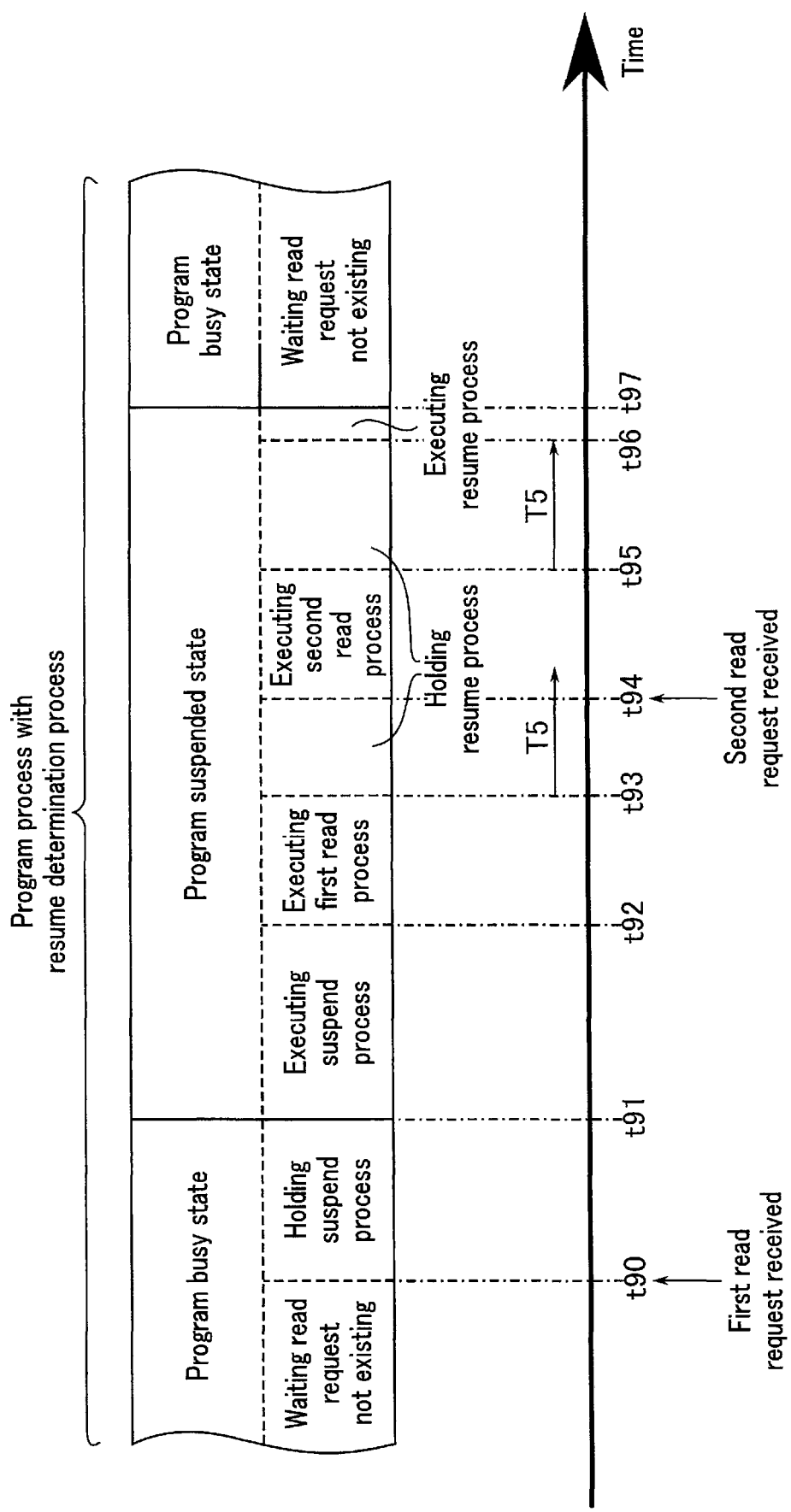
FIG. 30 is a time chart showing an example of state transition in a program process including a resume determination process in the memory system according to the modification of the fourth embodiment.

4.6.2 State Transition in Program Process Including Resume Determination Process FIG. 30 is a time chart showing an example of state transition in a program process including a resume determination process of the memory system according to the modification of the fourth embodiment. In the example of FIG. 30, a case is shown where, in an interruption period of a program process, after a first read process finishes, a second read request is received before the measurement value of the timer 26 reaches the threshold value T5.

As shown in FIG. 30, at time t90, the memory controller 20 receives a first read request. Along with this, the memory system 3 enters the holding suspend process state STS22 from the waiting read request not existing state STS21.

At time t91, the memory controller 20 causes the nonvolatile memory 10 to execute a suspend process in response to a suspend condition being satisfied. Along with this, the memory system 3 enters the executing suspend process state STS31.

At time t92, the suspend process finishes. The memory controller 20 causes the nonvolatile memory 10 to execute a first read process. Along with this, the memory system 3 enters the executing read process state STS32.

At time t93, the first read process finishes. Along with this, the memory system 3 enters the holding resume process state STS34. The memory controller 20 starts the timer 26.

At time t94, the memory controller 20 receives a second read request. At this point in time, the measurement value of the timer 26 is less than the threshold value T5. Thus, after stopping the timer 26, the memory controller 20 causes the nonvolatile memory 10 to execute a second read process. Along with this, the memory system 3 enters the executing read process state STS32.

At time t95, the second read process finishes. Along with this, the memory system 3 enters the holding resume process state STS34. The memory controller 20 starts the timer 26.

At time t96, the measurement value of the timer 26 reaches the threshold value T5. Thus, after stopping the timer 26, the memory controller 20 causes the nonvolatile memory 10 to execute a resume process. Along with this, the memory system 3 enters the executing resume process state STS33.

At time t97, the resume process finishes. Then, the memory controller 20 causes the nonvolatile memory 10 to resume the program process. As a result, the state of the memory system 3 returns to the waiting read request not existing state STS21.

4.6.3 Advantageous Effect of Modification of Fourth Embodiment

According to the modification of the fourth embodiment, the memory controller 20 holds a resume process until an elapsed time from an end of a read process executed in a suspend process becomes the threshold value T5 or more regardless of whether or not there is a read request in the command queue 25. As a result, it is possible to set a resume prohibition period to suppress a resume process from being executed immediately after when all the read requests in the command queue 25 have been executed. Therefore, an advantageous effect equivalent to that of the fourth embodiment can be exhibited.

5. FIFTH EMBODIMENT

Next, a memory system according to a fifth embodiment will be described. The fifth embodiment is different from the first to fourth embodiments in that control is performed so as to execute a resume process forcibly even if there is a read request in the command queue 25. That is, in the fifth embodiment, the timer 26 measures an elapsed time from a start or completion of a suspend process. In the following descriptions, a resume process executed when there is a read request in the command queue 25 and a resume process executed when there is no read request in the command queue 25 are distinguished. The resume process executed when there is a read request in the command queue 25 is also referred to as "a forced resume process". In the following, descriptions of configurations and operations equivalent to those in the first to fourth embodiments will be omitted, and configurations and operations different from those in the first to fourth embodiments will be mainly described.

5.1 Resume Determination Process

Figure 31:
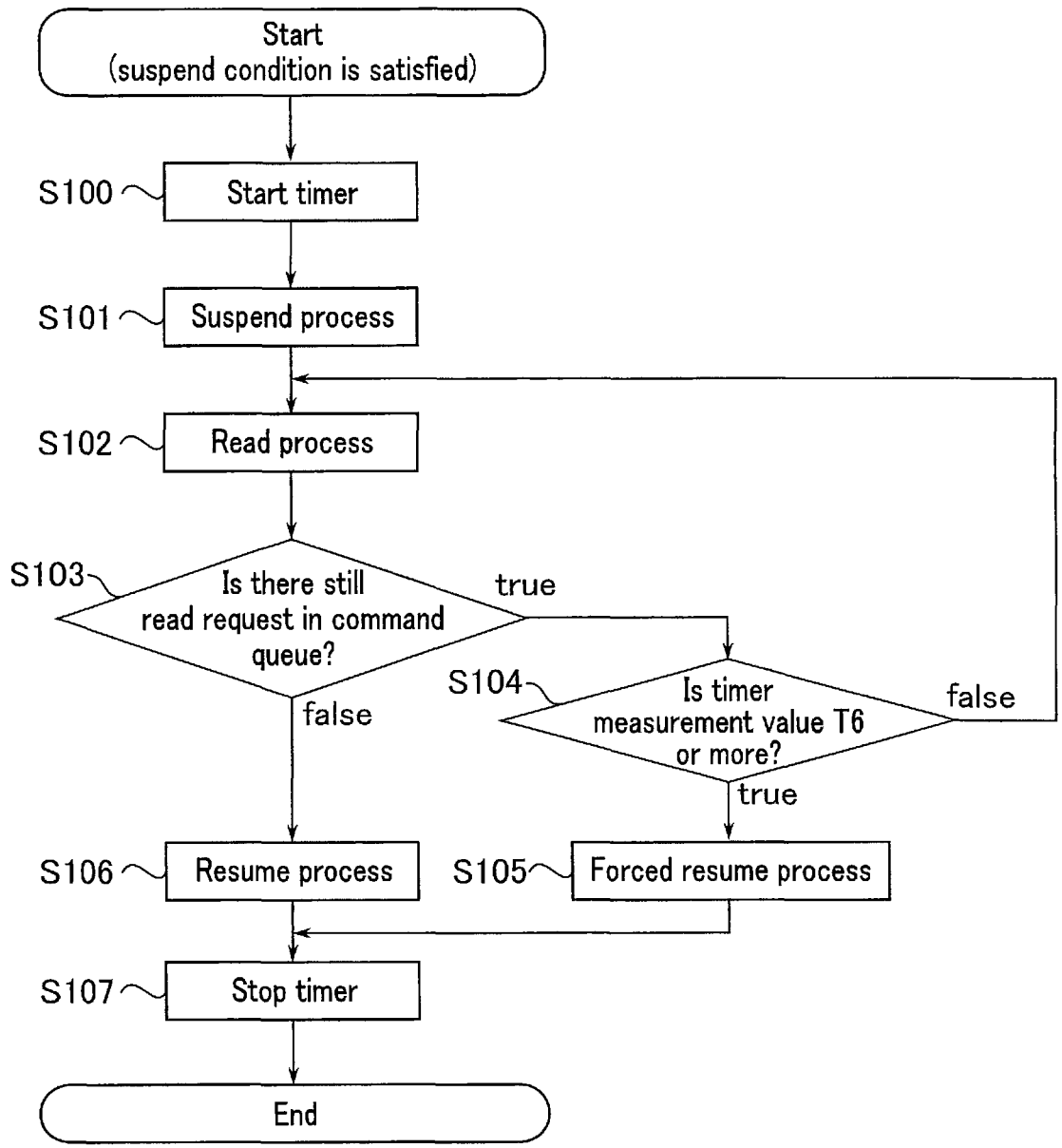
FIG. 31 is a flowchart showing a series of processing including a resume determination process in a memory system according to a fifth embodiment.

FIG. 31 is a flowchart showing an example of a series of processing including a resume determination process in the memory system according to the fifth embodiment. In the example of FIG. 31, similarly to the example of FIG. 26, a start condition for the resume determination process is that a suspend condition is satisfied.

Since processes of S100 to S102 are equivalent to those of S80 to S82 in FIG. 26, descriptions thereof are omitted.

When the read process finishes, the memory controller 20 determines whether or not there is a read request in the command queue 25 (S103).

If there is a read request in the command queue 25 (S103; true), the memory controller 20 determines whether or not the measurement value of the timer 26 is a threshold value T6 or more (S104). The threshold value T6 is a positive real number.

If the measurement value of the timer 26 is less than the threshold value T6 (S104; false), the memory controller 20 causes the nonvolatile memory 10 to execute a read process based on the read request (S102). Thus, the read process is executed until the measurement value of the timer 26 reaches the threshold value T6 or there are no more read requests in the command queue 25.

If the measurement value of the timer 26 is the threshold value T6 or more (S104; true), the memory controller 20 causes the nonvolatile memory 10 to execute a forced resume process (S105). That is, a forced resume condition in the example of FIG. 31 is that there is a read request to be performed and the measurement value of the timer 26 is the threshold value T6 or more.

If there are no more read requests in the command queue 25 (S103; false), the memory controller 20 causes the nonvolatile memory 10 to execute a resume process (S106). That is, a resume condition in the example of FIG. 31 is that there is no read request to be performed.

When the resume process or the forced resume process finishes, the memory controller 20 stops the timer 26 (S107).

When the process of S107 finishes, the series of processing including the resume determination process finishes (End).

5.2 State Transition of Memory System

FIG. 32 is a state transition diagram showing relationships among a plurality of states related to a program process of the memory system according to the fifth embodiment.

First, a plurality of states of the memory system 3 will be described.

As shown in FIG. 32, states related to the program process of the memory system 3 include the program ready state STS1, the program busy state STS2, and the program suspended state STS3. Since the program ready state STS1 and the program busy state STS2 are equivalent to those in the fourth embodiment described with reference to FIG. 27, descriptions thereof are omitted.

The program suspended state STS3 includes an executing forced resume process state STS35 in addition to the executing suspend process state STS31, executing read process state STS32, executing resume process state STS33, and holding resume process state STS34. The executing forced resume process state STS35 is a state in which a forced resume process is being executed.

Next, an event to cause each state to transition will be described.

Since the events of E1 to E11, E12A, and E13 to E15 are equivalent to those in the fourth embodiment described with reference to FIG. 27, descriptions thereof are omitted.

When a forced resume condition is satisfied in the executing read process state STS32 (E17), the memory system 3 transitions to the executing forced resume process state STS35.

When the forced resume process is completed in the executing forced resume process state STS35 (E18), the memory system 3 transitions to the holding suspend process state STS22.

That is, when the resume process or the forced resume process is completed in the program suspended state STS3 (E13 or E18), the memory system 3 transitions to the program busy state STS2.

5.3 State Transition in Program Process Including Resume Determination Process

Figure 33:
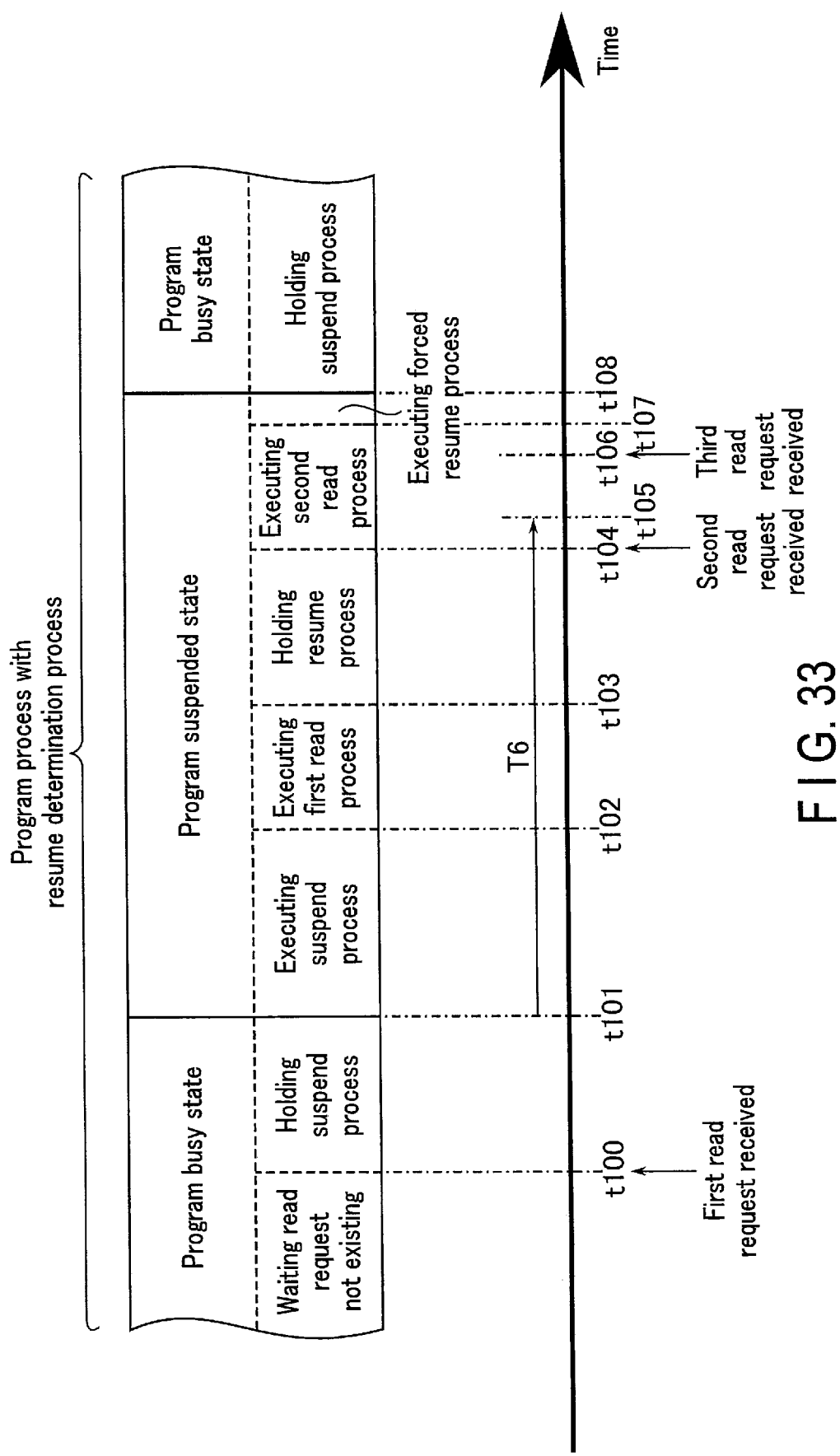
FIG. 33 is a time chart showing an example of state transition in a program process including a resume determination process of the memory system according to the fifth embodiment.

FIG. 33 is a time chart showing an example of state transition in a program process including a resume determination process in the memory system according to the fifth embodiment. In the example of FIG. 33, a case is shown where, in an interruption period of the program process, the measurement value of the timer 26 reaches the threshold value T6 in a second read process. In this case, even if a third read request is received in the second read process, a forced resume process is executed without a third read process being executed during the same interruption period.

Since processes in a period from time t100 to t104 shown in FIG. 33 are equivalent to those in the period from time t80 to t84 shown in FIG. 28, descriptions thereof are omitted.

At time t105, the measurement value of the timer 26 reaches the threshold value T6. The memory system 3 stays in the executing read process state STS32 of a second read process.

At time t106, the memory controller 20 receives a third read request. The memory system 3 stays in the executing read process state STS32 of the second read process.

At time t107, the second read process finishes. At this point in time, there is the third read request in the command queue 25. However, the measurement value of the timer 26 is the threshold value T6 or more. Thus, the memory controller 20 causes the nonvolatile memory 10 to execute a forced resume process. Along with this, the memory system 3 enters the executing forced resume process state STS35.

At time t108, the forced resume process finishes. Along with this, after stopping the timer 26, the memory controller 20 causes the nonvolatile memory 10 to resume the program process. As a result, the state of the memory system 3 returns to the holding suspend process state STS22.

After that, although not shown in FIG. 33, when the suspend condition is satisfied again, the memory controller 20 can execute a third read process during a next interruption period of the program process.

5.4 Advantageous Effect of Fifth Embodiment

According to the fifth embodiment, when an elapsed time from a start or completion of a suspend process reaches the threshold value T6, the memory controller 20 executes a forced resume process even if there remains a read request in the command queue 25. Thereby, when a large number of read requests are received at one time, it is possible to prevent the interruption period of the program process from being excessively prolonged. Thus, it is possible to adjust a trade-off between the write throughput and the read latency while suppressing an excessive decrease in write throughput.

In addition, according to the fifth embodiment, it is possible to restrain the interruption period of the program process from exceeding the threshold value T6 excessively. Thus, deterioration of the reliability of the nonvolatile memory 10 can be suppressed.

5.5 Modification of Fifth Embodiment

In the above-described fifth embodiment, the case has been described where the memory controller 20 controls the start timing of the forced resume process on the basis of the elapsed time from the start or completion of the single suspend process, but the embodiment is not limited thereto. For example, the memory controller 20 may control the start timing of the forced resume process on the basis of a length of a cumulative interruption period in the same program process. That is, in the modification of the fifth embodiment, the timer 26 measures the cumulative interruption period in the program process. In the following, descriptions of configurations and operations equivalent to those in the fifth embodiment will be omitted, and configurations and operations different from those in the fifth embodiment will be mainly described.

5.5.1 Program Process

FIG. 34 is a flowchart showing an example of a series of processing including a program process in the memory system according to the modification of the fifth embodiment.

Since processes of S5 and S6 are equivalent to those of S5 and S6 in FIG. 25, descriptions thereof are omitted.

When a status that the program process is completed is received from the nonvolatile memory 10 in the process of S6, the memory controller 20 determines whether or not the timer 26 is in a running state (S7).

If the timer 26 is running (S7; true), the memory controller 20 stops the timer 26 (S8). When the process of S8 finishes, the series of processing including the program process finishes (End).

In addition, if the timer 26 is not running (S7; false), the series of processing including the program process finishes without executing the process of S8 (End).

5.5.2 Resume Determination Process

Figure 35:
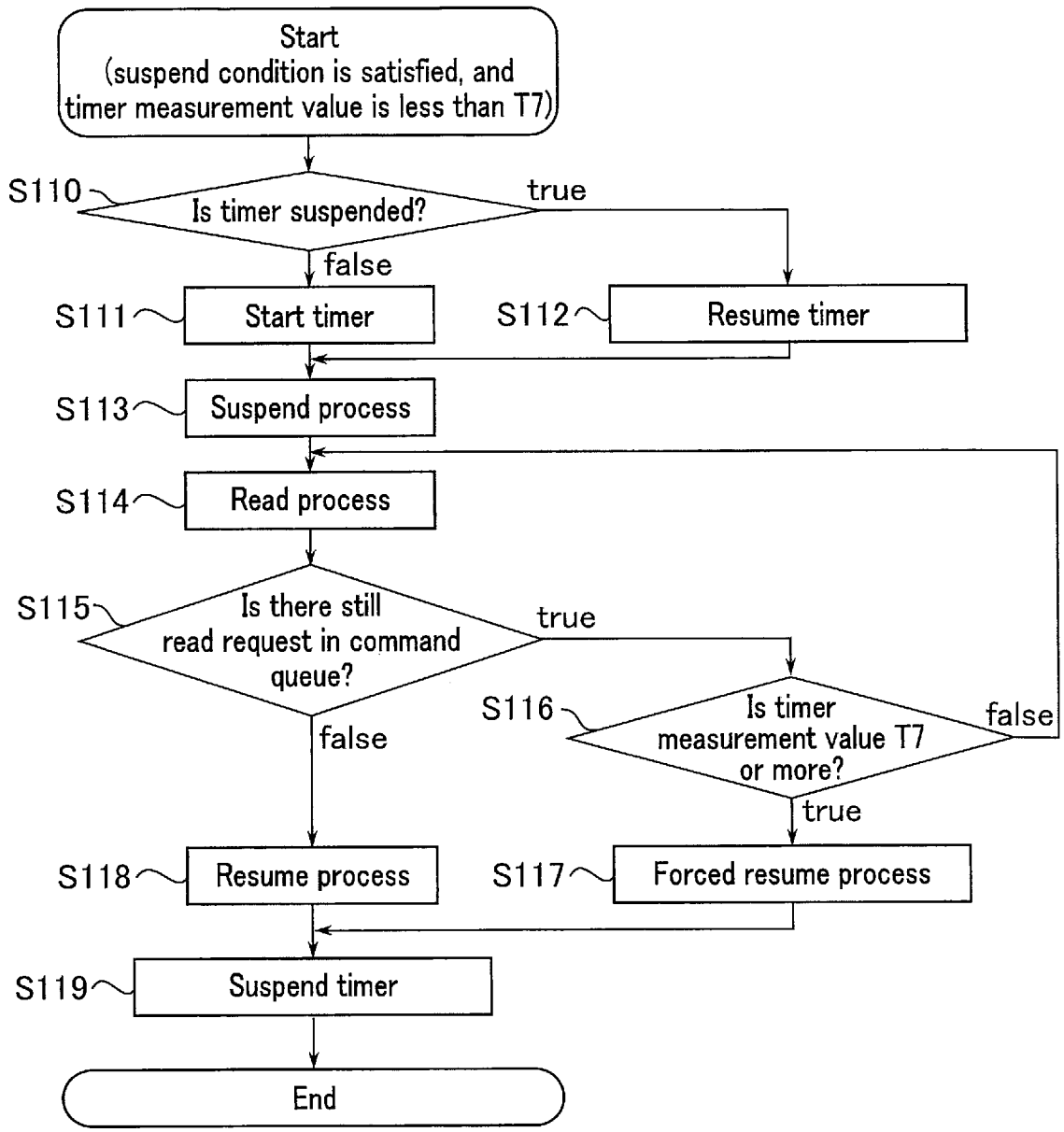
FIG. 35 is a flowchart showing a series of processing including a resume determination process in the memory system according to the modification of the fifth embodiment.

FIG. 35 is a flowchart showing an example of a series of processing including a resume determination process in the memory system according to the modification of the fifth embodiment. In the example of FIG. 35, a start condition for the resume determination process is that a suspend condition is satisfied and the measurement value of the timer 26 is less than a threshold value T7. As the suspend condition, a discretionary suspend condition including the examples in the descriptions of the first to third embodiments is applicable. In addition, the suspend condition may be unconditional.

If the suspend condition is satisfied and the measurement value of the timer 26 is less than the threshold value T7 (Start), the memory controller 20 determines whether or not the timer 26 is in a suspended state (S110).

If the timer 26 is not suspended (i.e., the timer 26 is stopped) (S110; false), the memory controller 20 starts the timer 26 (S111).

If the timer 26 is suspended (S110; true), the memory controller 20 resumes the measurement of the timer 26 (S112).

After the timer 26 is in a running state, the memory controller 20 causes the nonvolatile memory 10 to execute a suspend process (S113).

After the program process is interrupted by the suspend process, the memory controller 20 causes the nonvolatile memory 10 to execute a read process based on the read request (S114).

When a read process finishes, the memory controller 20 determines whether or not there is a read request in the command queue 25 (S115).

If there is a read request in the command queue 25 (S115; true), the memory controller 20 determines whether or not the measurement value of the timer 26 is the threshold value T7 or more (S116). The threshold value T7 is a positive real number.

If the measurement value of the timer 26 is less than the threshold value T7 (S116; false), the memory controller 20 causes the nonvolatile memory 10 to execute a read process based on the read request (S114). Thus, the read process is executed until the measurement value of the timer 26 reaches the threshold value T7 or there are no more read requests in the command queue 25.

If the measurement value of the timer 26 is the threshold value T7 or more (S116; true), the memory controller 20 causes the nonvolatile memory 10 to execute a forced resume process (S117). That is, a forced resume condition in the example of FIG. 35 is that there is a read request to be performed and the measurement value of the timer 26 is the threshold value T7 or more.

If there is no read request in the command queue 25 (S115; false), the memory controller 20 causes the nonvolatile memory 10 to execute a resume process (S118). That is, a resume condition in the example of FIG. 35 is that there is no read request to be performed.

When the resume process or the forced resume process finishes, the memory controller 20 suspends the timer 26 (S119).

When the process of S119 finishes, the series of processing including the resume determination process finishes (End).

In the example of FIG. 35, the case has been described where the periods during which the suspend process and the resume process are executed are included in the measurement period of the timer 26, but the embodiment is not limited thereto. For example, the measurement period of the timer 26 may not include both or any one of the suspend process execution period and the resume process execution period. In this case, the process of S113 in FIG. 35 may be executed before the process of S110. In addition, the process of S119 may be executed between the processes of S114 and S115.

5.5.3 State Transition in Program Process Including Resume Determination Process FIG. 36 is a time chart showing an example of state transition in a program process including a resume determination process in the memory system according to the modification of the fifth embodiment. In the example of FIG. 36, a case is shown where a measurement period of the timer 26 includes both a suspend process and a resume process. In addition, in the example of FIG. 36, a case is shown where the measurement value of the timer 26 reaches the threshold value T7 in a second read process. In this case, even if a third read request is received before the second read process finishes, a forced resume process is executed without a third read process being executed during the same interruption period. In the example of FIG. 36, it is assumed that the timer 26 is stopped (i.e., the measurement value is 0) at the point of time t110.

As shown in FIG. 36, at time t110, the memory controller 20 receives a first read request. Along with this, the memory system 3 enters the holding suspend process state STS22 from the waiting read request not existing state STS21.

At time t111, a suspend condition is satisfied. As the timer 26 is stopped, the memory controller 20 starts the timer 26. In addition, the memory controller 20 causes the nonvolatile memory 10 to execute a suspend process. Along with this, the memory system 3 enters the executing suspend process state STS31.

At time t112, the suspend process finishes. The memory controller 20 causes the nonvolatile memory 10 to execute a first read process. Along with this, the memory system 3 enters the executing read process state STS32 of the first read process.

At time t113, the first read process finishes. The memory controller 20 causes the nonvolatile memory 10 to execute a resume process. Along with this, the memory system 3 enters the executing resume process state STS33.

At time t114, the resume process finishes. The memory controller 20 suspends the measurement of the timer 26. Thereby, the measurement value of the timer 26 becomes $T7\_1$ (=t114−t111). It is assumed that the measurement value $T7\_1$ is smaller than the threshold value T7. The memory system 3 enters the waiting read request not existing state STS21.

At time t115, the memory controller 20 receives a second read request. Along with this, the memory system 3 enters the holding suspend process state STS22.

At time t116, the suspend condition is satisfied again. As the timer 26 is suspended, the memory controller 20 resumes the measurement of the timer 26. In addition, the memory controller 20 causes the nonvolatile memory 10 to execute a suspend process. Along with this, the memory system 3 enters the executing suspend process state STS31.

At time t117, the memory controller 20 receives a third read request. The memory system 3 stays in the executing suspend process state STS31.

At time t118, the suspend process finishes. The memory controller 20 causes the nonvolatile memory 10 to execute a second read process. Along with this, the memory system 3 enters the executing read process state STS32 of the second read process.

At time t119, the measurement value of the timer 26 reaches the threshold value T7. The memory system 3 stays in the executing read process state STS32 of the second read process.

At time t120, the second read process finishes. At this point, there is the third read request in the command queue 25. However, the measurement value of the timer 26 is the threshold value T7 or more. Thus, the memory controller 20 causes the nonvolatile memory 10 to execute a forced resume process. Along with this, the memory system 3 enters the executing forced resume process state STS35.

At time t121, the forced resume process finishes. Along with this, after suspending the measurement of the timer 26, the memory controller 20 causes the nonvolatile memory 10 to resume the program process. As a result, the state of the memory system 3 returns to the holding suspend process state STS22.

After that, although not shown in FIG. 36, even if the suspend condition is satisfied again, since the measurement value of the timer 26 exceeds the threshold value T7, the memory controller 20 does not interrupt the program process for executing a third read process.

5.5.4 Advantageous Effect of Modification of Fifth Embodiment

According to the modification of the fifth embodiment, if a cumulative time of interruption periods in one program process reaches the threshold value T7, the memory controller 20 forcibly executes a resume process even if there remains a read request in the command queue 25. Thereby, when a large number of read requests are received at one time, it is possible to prevent the interruption period of the program process from being excessively prolonged. Thus, it is possible to adjust a trade-off between the write throughput and the read latency while suppressing an excessive decrease in write throughput.

In addition, according to the modification of the fifth embodiment, it is possible to restrain the cumulative time of the interruption periods in one program process from exceeding the threshold value T7 excessively. Thus, deterioration of the reliability of the nonvolatile memory 10 can be suppressed.

6. SIXTH EMBODIMENT

Next, a memory system according to a sixth embodiment will be described. The sixth embodiment is different from the first to fifth embodiments in the point of dynamically adjusting a suspend condition or a resume condition (or a forced resume condition). In the following, descriptions of configurations and operations equivalent to those in the first to fifth embodiments will be omitted, and configurations and operations different from those in the first to fifth embodiments will be mainly described.

6.1 Parameter Change Process

Figure 37:
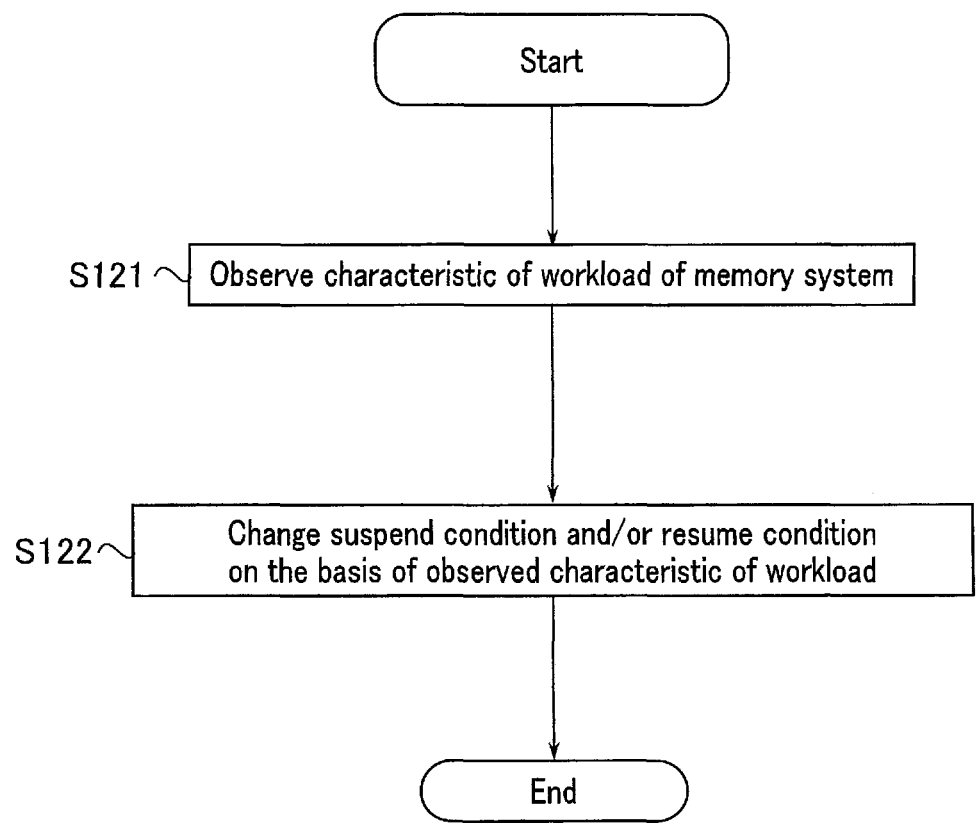
FIG. 37 is a flowchart showing an example of a parameter change process in a memory system according to a sixth embodiment.

FIG. 37 is a flowchart showing an example of a parameter change process in the memory system according to the sixth embodiment.

As shown in FIG. 37, when an observation condition is satisfied (Start), the memory controller 20 observes a workload of the memory system 3 and obtain characteristics of the workload (S121).

The observation condition may include a periodically satisfied condition such as "a predetermined time has come". Further, the observation condition may include a non-periodically satisfied condition such as "a predetermined process finishes".

Characteristics of the workload include, for example, the number of read requests in the command queue 25 (the queue depth (QD) of read requests i.e., the number of outstanding I/O commands (OIO)), an idle period of the memory system 3, and an amount of write data in the buffer memory 22. The idle period is a period during which the memory system 3 does not execute processes such as a read process and a program process in response to a request from the host device 2.

On the basis of the workload observed in the process of S121, the memory controller 20 changes a suspend condition and/or a resume condition (S122). Changing the suspend condition includes, for example, changing the threshold values N, M, and L as well as the threshold values T1 to T3 described in the first to third embodiments. Changing the resume condition includes, for example, changing the threshold values T4 to T7 described in the fourth and fifth embodiments.

More specifically, for example, when the QD of read requests is less than a threshold value, when an idle state time of the memory system 3 is a threshold value or more, or when an amount of write data in the buffer memory 22 is less than a threshold value, the memory controller 20 reduces at least one of the threshold values N, M, and L and/or reduces at least one of the threshold values T1 to T3. In this case, the threshold value N may be 0 or 1. The threshold L may be 0. The threshold values T1 to T3 may be 0. When the QD of read requests is less than a threshold value, an idle state time of the memory system 3 is a threshold value or more, or an amount of write data in the buffer memory 22 is less than a threshold value, the memory controller 20 increases at least one of the threshold values T4 to T7.

When the process of S122 finishes, the parameter change process finishes (End).

6.2 Advantageous Effect of Sixth Embodiment

According to the sixth embodiment, the memory controller 20 observes a workload. For example, when an amount of write data in the buffer memory 22 that is observed as a workload is small, it is expected that a write throughput request from the host device 2 will be relatively low. In addition, for example, when the QD of read requests observed as a workload is small, it is expected that a short read latency will be expected by the host device 2. As such, by observing the workload, the memory controller 20 can know which one of the write throughput and the read latency should be focused on to adjust the trade-off between the write throughput and the read latency.

As a result of the observation, when it can be determined that a request for the read latency, rather than the write throughput, should be prioritized, the memory controller 20 decreases at least one of the threshold values N, M, and L, decreases at least one of the threshold values T1 to T3, and/or increases at least one of the threshold values T4 to T7. Thereby, the memory controller 20 can be dynamically changed to an operation that prioritizes a request for a read latency during operation of the memory system 3. Therefore, it is possible to operate the memory system 3 with a higher degree of freedom.

6.3 Modification of Sixth Embodiment

According to the above-described sixth embodiment, the case has been described where the memory controller 20 autonomously changes a suspend condition and/or a resume condition, but the embodiment is not limited thereto. For example, the memory controller 20 may change a suspend condition and/or a resume condition on the basis of a request from the host device 2. In the following, descriptions of configurations and operations equivalent to those in the sixth embodiment will be omitted, and configurations and operations different from those in the sixth embodiment will be mainly described.

6.3.1 Parameter Change Process

Figure 38:
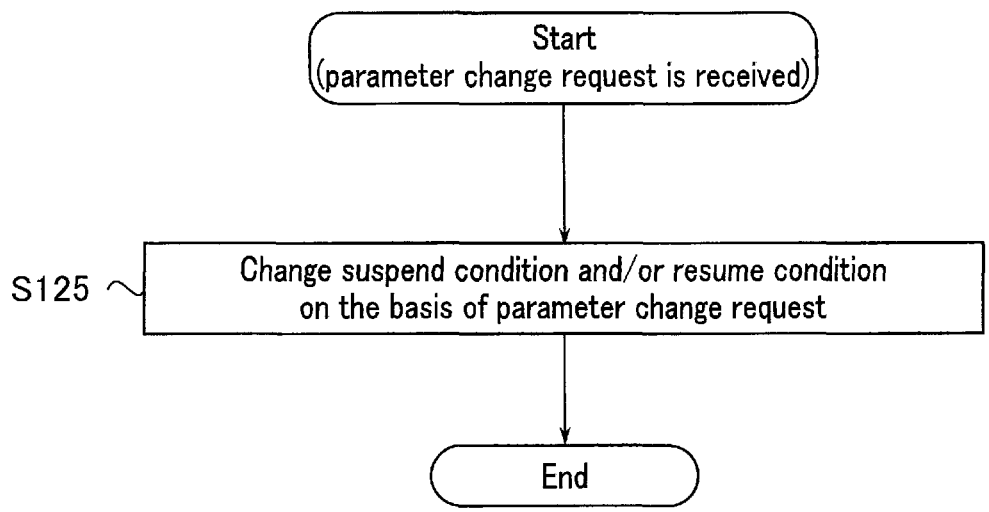
FIG. 38 is a flowchart showing an example of a parameter change process in a memory system according to a modification of the sixth embodiment.

FIG. 38 is a flowchart showing an example of a parameter change process in a memory system according to a modification of the sixth embodiment.

As shown in FIG. 38, when a parameter change request is received from the host device 2 (Start), the memory controller 20 changes a suspend condition and/or a resume condition on the basis of the received parameter change request (S125).

When the process of S125 finishes, the parameter change process finishes (End).

6.3.2 Advantageous Effect of Modification of Sixth Embodiment

According to the modification of the sixth embodiment, the memory controller 20 changes a suspend condition and/or a resume condition on the basis of a request from the host device 2. Thereby, it is possible to realize an operation according to a request of the host device 2.

7. OTHERS

The above-described first to sixth embodiments and modifications thereof can be modified in various manners.

For example, the case where a program process is interrupted has been described in the above-described first to sixth embodiments and modifications thereof, but the embodiments and modifications are not limited thereto. For example, a case where an erase process, instead of the program process, is interrupted is also applicable to the embodiments and modifications in the same manner.

In addition, for example, the case where a forced resume condition is specified on the basis of the measurement value of the timer 26 has been described in the above-described fifth embodiment and modification thereof, but the embodiment and modification are not limited thereto. For example, the memory controller 20 may specify the forced resume condition on the basis of the number X of read requests executed in a program process or an amount Y of read data read from the nonvolatile memory 10 during a program process. Specifically, when there is a read request to be performed, and the above-described number X and amount Y are threshold values or more, the memory controller 20 may cause the nonvolatile memory 10 to execute a forced resume process.

While certain embodiments have been described, these embodiments have been presented by way of example only, and are not intended to limit the scope of the inventions. Indeed, the embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit.

The invention claimed is:

1. A method of controlling a nonvolatile memory, comprising:
   causing the nonvolatile memory to execute a first process of reading data based on one or more first requests from a host;
   determining that one of the first requests is received from the host while causing the nonvolatile memory to execute a second process; and
   in response to determining that the one of the first requests is received from the host while causing the nonvolatile memory to execute the second process, holding interruption of the second process until a first number becomes a first threshold value or larger, the first number being the number of the first requests to be performed, the first threshold value being an integer of two or more.

2. The method according to claim 1, further comprising:
   determining that a first period becomes a second threshold value or longer while holding the interruption of the second process, the first period being a consecutive period during which the first number is one or larger; and
   in response to determining that the first period becomes the second threshold value or longer while holding the interruption of the second process, interrupting the second process.

3. The method according to claim 1, further comprising:
   determining that a second period becomes a third threshold value or longer while holding the interruption of the second process and the first number is one or larger, the second period being a consecutive period during which the second process is executed and does not include a period during which the second process is interrupted; and
   in response to determining that the second period becomes the third threshold value or longer while holding the interruption of the second process and the first number is one or larger, interrupting the second process.

4. The method according to claim 3, wherein
   a starting point of the second period is when the second process is started.

5. The method according to claim 3, wherein
   a starting point of the second period is when the second process is resumed from the interruption.

6. The method according to claim 3, wherein
   the nonvolatile memory includes a memory cell array and a page buffer,
   the second process is a program process to program data from the page buffer to the memory cell array, and
   a starting point of the second period is when the program process is started.

7. The method according to claim 3, wherein
   the nonvolatile memory includes a memory cell array and a page buffer,
   the second process is a program process to program data from the page buffer to the memory cell array, and
   a starting point of the second period is when a data-in process to transfer the data to the page buffer is started.

8. The method according to claim 1, further comprising:
   interrupting the second process; and
   holding resuming of the interrupted second process until a third period becomes a fourth threshold value or longer while the second process is interrupted, the third period being a consecutive period during which the second process is interrupted.

9. The method according to claim 1, further comprising:
   interrupting the second process; and
   while the second process is interrupted:
   causing the nonvolatile memory to execute the first process; and
   holding resuming of the interrupted second process until a fourth period becomes a fifth threshold value or longer, the fourth period being a consecutive period during which the second process is interrupted and the first process is not executed.

10. The method according to claim 1, further comprising:
    interrupting the second process; and
    determining that a fifth period becomes a sixth threshold value or longer while the second process is interrupted, the fifth period being a period during which the second process is interrupted; and
    in response to determining that the fifth period becomes the sixth threshold value or longer while the second process is interrupted, resuming the interrupted second process.

11. The method according to claim 10, wherein
    the fifth period is a consecutive period.

12. The method according to claim 10, wherein
    the fifth period is a cumulative period of one or more periods during which the second process is interrupted.

13. The method according to claim 1, wherein
    the method is executed in a memory system, and the method further comprises:
    changing the first threshold value on the basis of characteristics of a workload of the memory system or a second request from the host, the characteristics of the workload including at least one of the first number, an idle time of the memory system, and an amount of data received from the host to be written in the nonvolatile memory.

14. The method according to claim 2, wherein
the method is executed in a memory system, and the method further comprises:
changing the second threshold value on the basis of characteristics of a workload of the memory system or a second request from the host, the characteristics of the workload including at least one of the first number, an idle time of the memory system, and an amount of data received from the host to be written in the nonvolatile memory.

15. The method according to claim 3, wherein
the method is executed in a memory system, and the method further comprises:
changing the third threshold value on the basis of characteristics of a workload of the memory system or a second request from the host, the characteristics of the workload including at least one of the first number, an idle time of the memory system, and an amount of data received from the host to be written in the nonvolatile memory.

16. The method according to claim 1, wherein
the second process includes a program process or an erase process.

17. A method of controlling a nonvolatile memory, the nonvolatile memory including a first plane and a second plane, said method comprising:
causing the nonvolatile memory to execute a first process of reading data from the first plane and the second plane in parallel on the basis of one or more first requests corresponding to the first plane and one or more second requests corresponding to the second plane;
determining that one of the first requests or one of the second requests is received from the host while causing the nonvolatile memory to execute a second process; and
in response to determining that the one of the first requests or the one of the second requests is received while causing the nonvolatile memory to execute the second process, holding interruption of the second process until both of a first number and a second number become a first threshold value or larger, the first number being the number of the first requests to be performed, the second number being the number of the second requests to be performed, the first threshold value being an integer of one or more.

18. The method according to claim 17, further comprising:
determining that a first period becomes a second threshold value or longer while holding the interruption of the second process, the first period being a consecutive period during which the first number or the second number is one or larger; and
in response to determining that the first period becomes the second threshold value or longer while holding the interruption of the second process, interrupting the second process.

19. The method according to claim 17, further comprising:
determining that a sum of the first number and the second number becomes a second threshold value or larger while holding the interruption of the second process, the second threshold value being an integer of two or more; and
in response to determining that the sum of the first number and the second number becomes the second threshold value or larger while holding the interruption of the second process, interrupting the second process.

20. A method of controlling a nonvolatile memory, comprising:
causing the nonvolatile memory to execute a first process of reading data based on a first request from a host;
determining that the first request is received from the host while causing the nonvolatile memory to execute a second process;
in response to determining that the first request is received from the host while causing the nonvolatile memory to execute the second process, interrupting the second process and causing the nonvolatile memory to execute the first process;
holding resuming of the interrupted second process until a consecutive period during which the second process is interrupted becomes a threshold value or longer; and
resuming the interrupted second process in response to the period becoming the threshold value or longer.

* * * * *